US00RE46469E

(19) United States
(12) Reissued Patent
Dunn, Jr.

(10) Patent Number: US RE46,469 E
(45) Date of Reissued Patent: Jul. 4, 2017

(54) MODULAR COMPUTER NETWORK SYSTEM WITH MODULES HAVING GEOMETRIC SHAPES ARRANGED INTO TESSELLATED ARRAYS

(71) Applicant: Richard Anthony Dunn, Jr., Randolph, MA (US)

(72) Inventor: Richard Anthony Dunn, Jr., Randolph, MA (US)

(21) Appl. No.: 14/862,989

(22) Filed: Sep. 23, 2015

Related U.S. Patent Documents

Reissue of:
(64) Patent No.: 8,542,492
Issued: Sep. 24, 2013
Appl. No.: 12/806,211
Filed: Dec. 10, 2009

(51) Int. Cl.
*H05K 7/00* (2006.01)
*H05K 5/00* (2006.01)

(52) U.S. Cl.
CPC ..... *H05K 5/0013* (2013.01)

(58) Field of Classification Search
CPC ..... H05K 5/0013; G06F 1/182; G06F 1/206
USPC ..... 361/729, 735, 679.4, 688; 118/500; 324/309
See application file for complete search history.

(56) References Cited

U.S. PATENT DOCUMENTS

| | | | | |
|---|---|---|---|---|
| 3,495,134 | A | 2/1970 | Collins et al. | |
| 4,499,607 | A | 2/1985 | Higgins | |
| 4,501,460 | A | 2/1985 | Sisler | |
| 4,937,659 | A | 6/1990 | Chall, Jr. | |
| 6,469,901 | B1 | 10/2002 | Costner | |
| 7,358,732 | B2 * | 4/2008 | Van Der Kouwe et al. | 324/309 |
| 2008/0286822 | A1 * | 11/2008 | Gallager | 435/29 |
| 2009/0064929 | A1 * | 3/2009 | Ishikawa et al. | 118/500 |
| 2009/0240481 | A1 * | 9/2009 | Durrant-Whyte et al. | 703/7 |
| 2010/0155464 | A1 * | 6/2010 | Swayn et al. | 235/375 |
| 2011/0018874 | A1 * | 1/2011 | Hasselgren et al. | 345/420 |
| 2011/0189440 | A1 * | 8/2011 | Appleby et al. | 428/156 |

* cited by examiner

*Primary Examiner* — Linh M Nguyen
(74) *Attorney, Agent, or Firm* — Posternak Blankstein & Lund LLP

(57) ABSTRACT

Scalable up and down nesting integrated electronic enclosures with form factors including asteroids and/or dumbbells and/or approximated tessellation(s)/tiling(s) or combinations thereof with thermal management, wiring, sliding fit, manual and/or automated full range vertical to horizontal positioning, access and structural systems for individual modules and intra- and inter-planar stacks, columns, rows, arrays and associated infrastructures.

19 Claims, 48 Drawing Sheets

Figure 1:
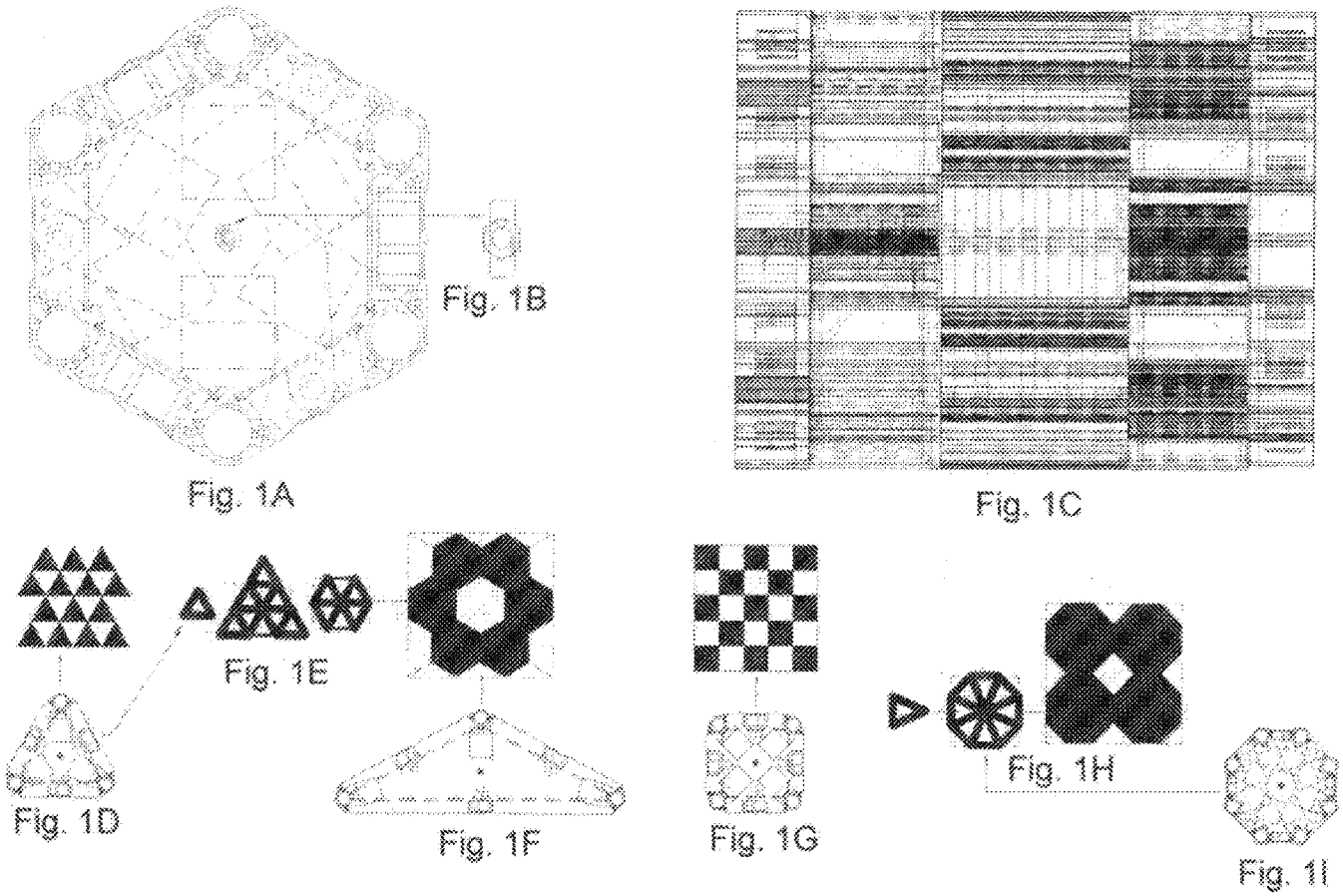

Fig. 4
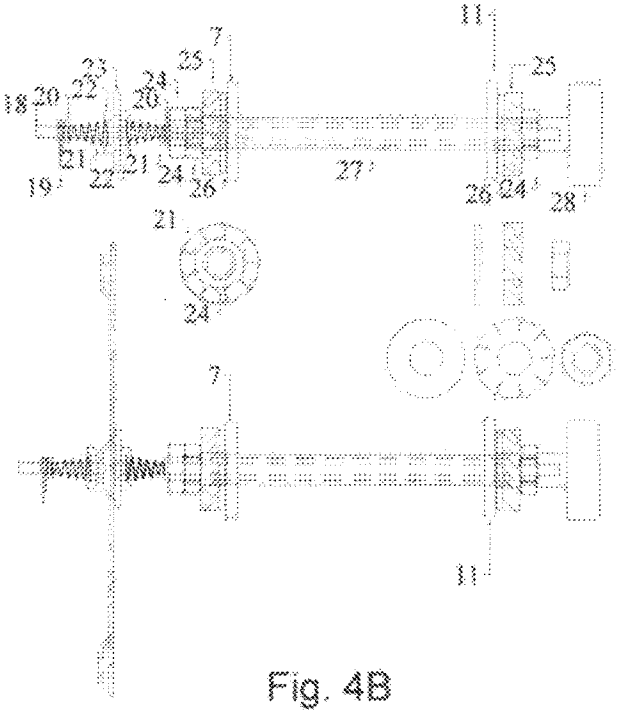
Fig. 4B
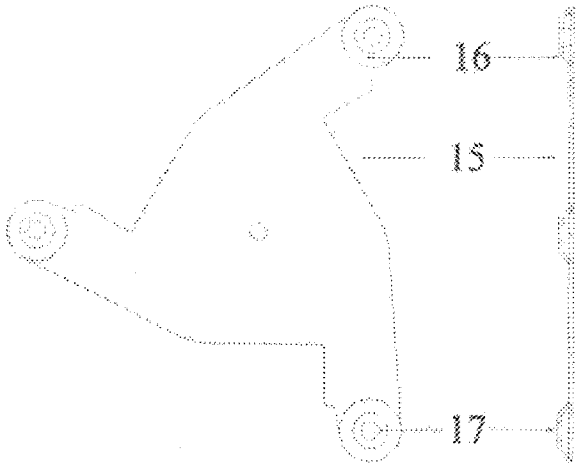
Fig. 4A

Fig. 5
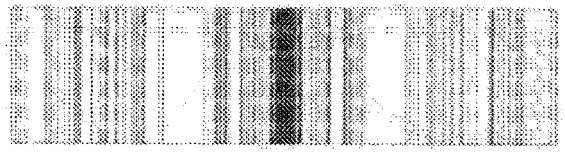
Fig. 5C
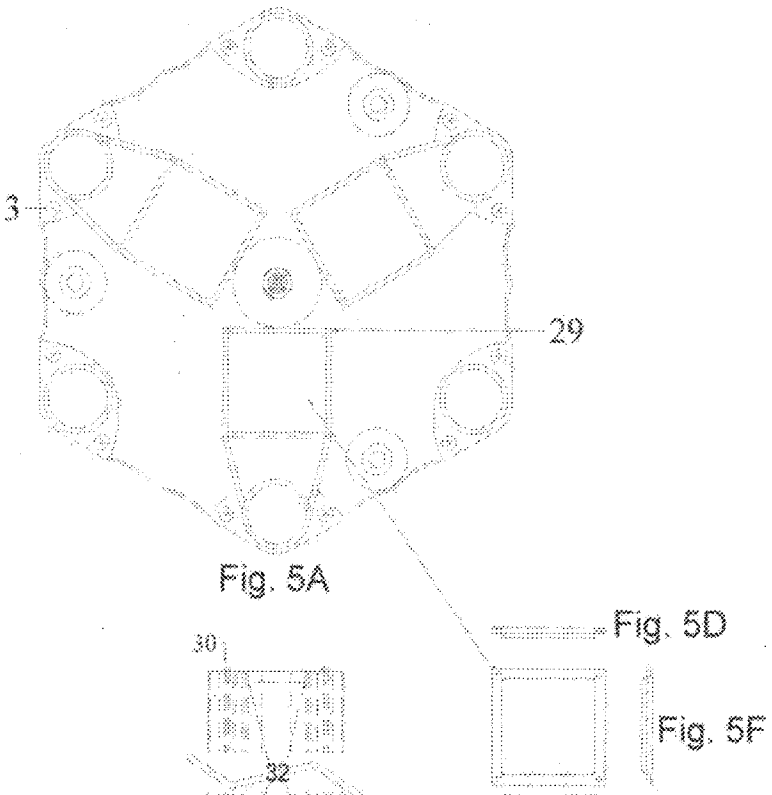
Fig. 5A
Fig. 5B
Fig. 5D
Fig. 5E
Fig. 5F

Fig. 6
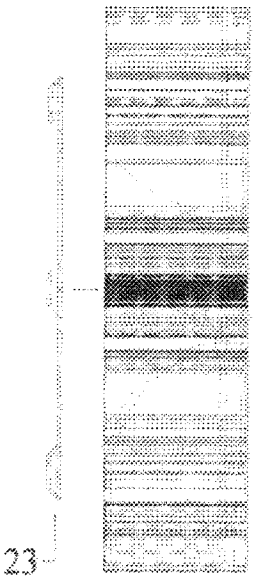
Fig. 6C
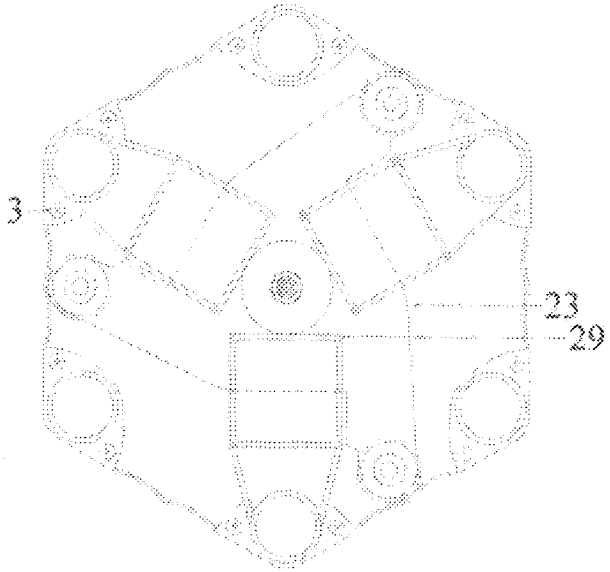
Fig. 6A
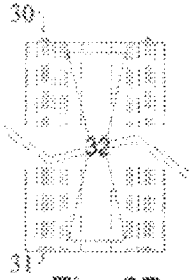
Fig. 6B

Fig. 14
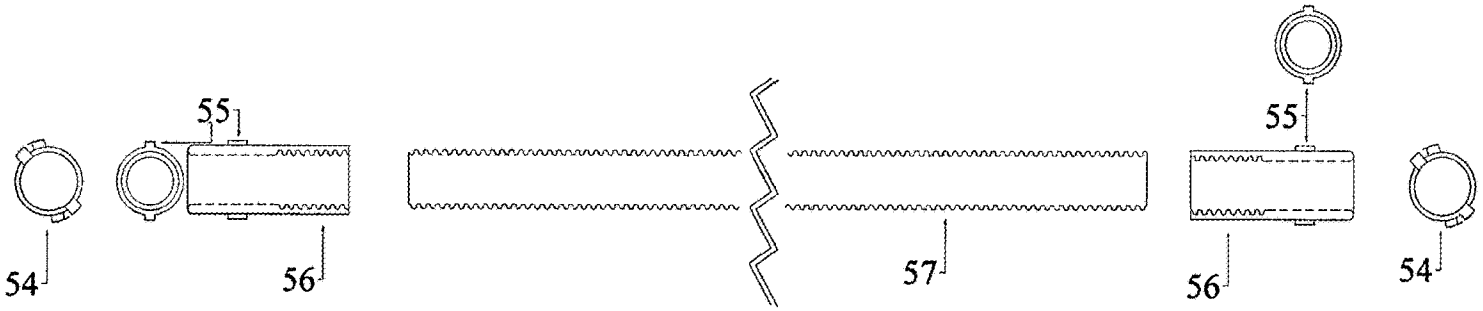
Fig. 14A
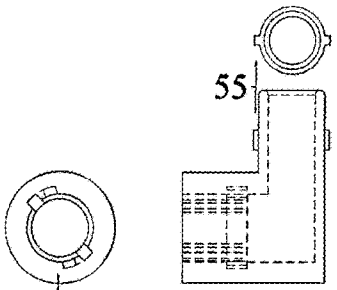
Fig. 14C
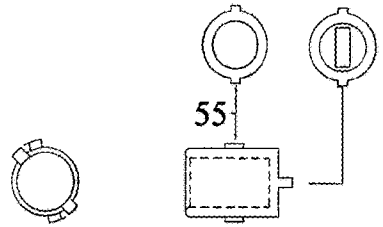
Fig. 14B

Fig. 15
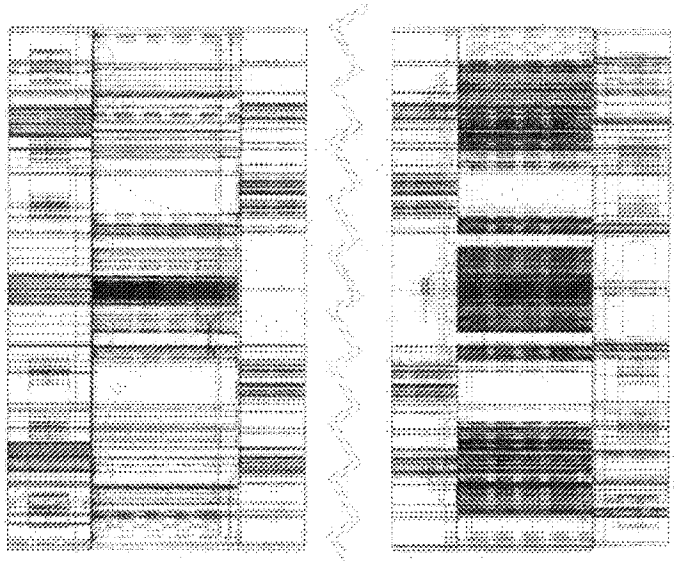
Fig. 15C
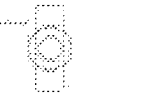
Fig. 15B
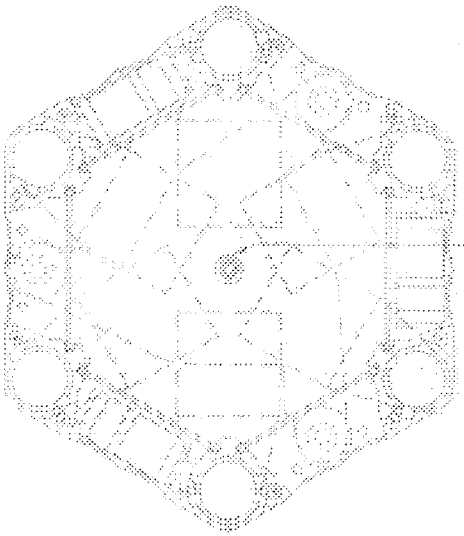
Fig. 15A

Fig. 29
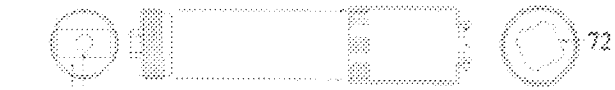
Fig. 29A
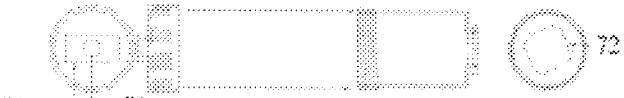
Fig. 29B

Fig. 36
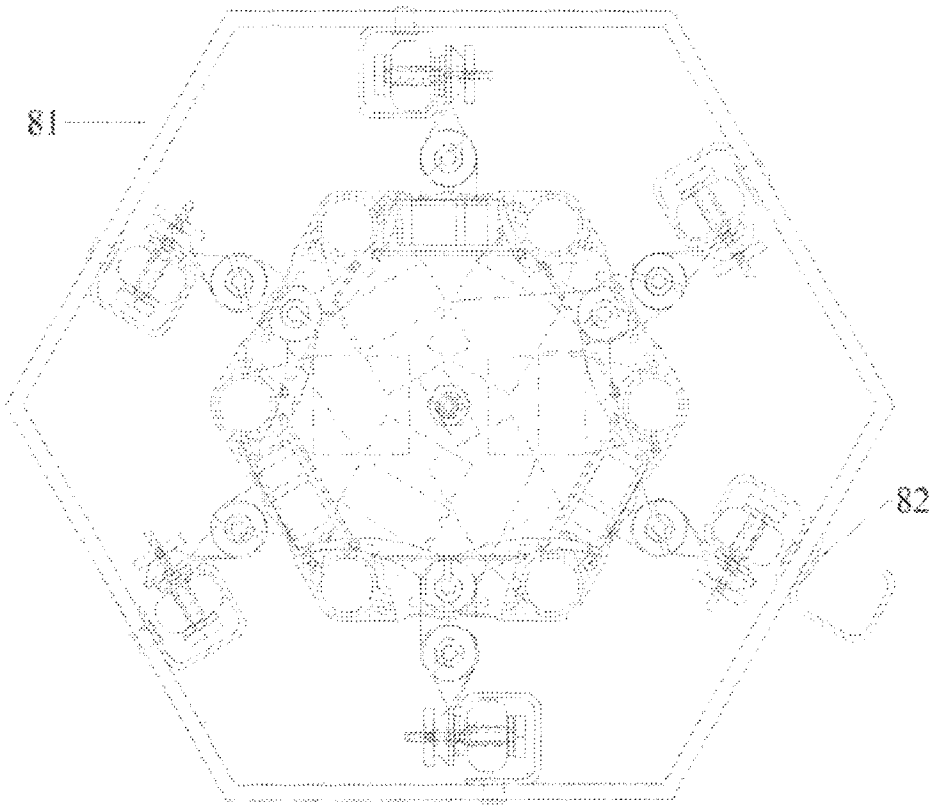
Fig. 36B
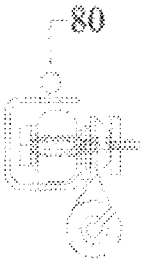
Fig. 36A

Fig. 38
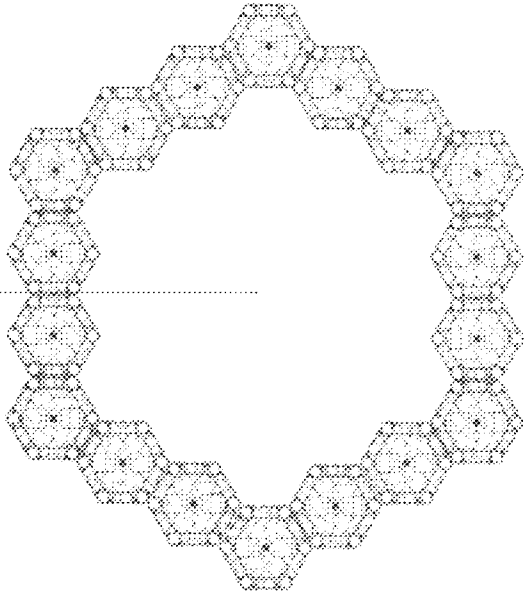
Fig. 38F
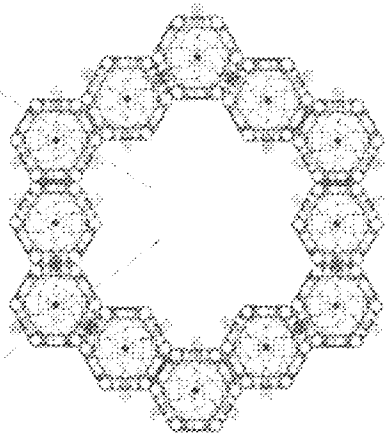
Fig. 38E
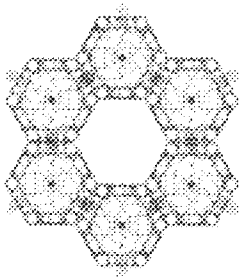
Fig. 38B
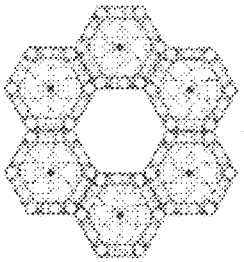
Fig. 38D
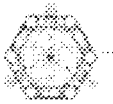
Fig. 38A
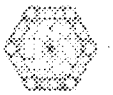
Fig. 38C Fig. 39
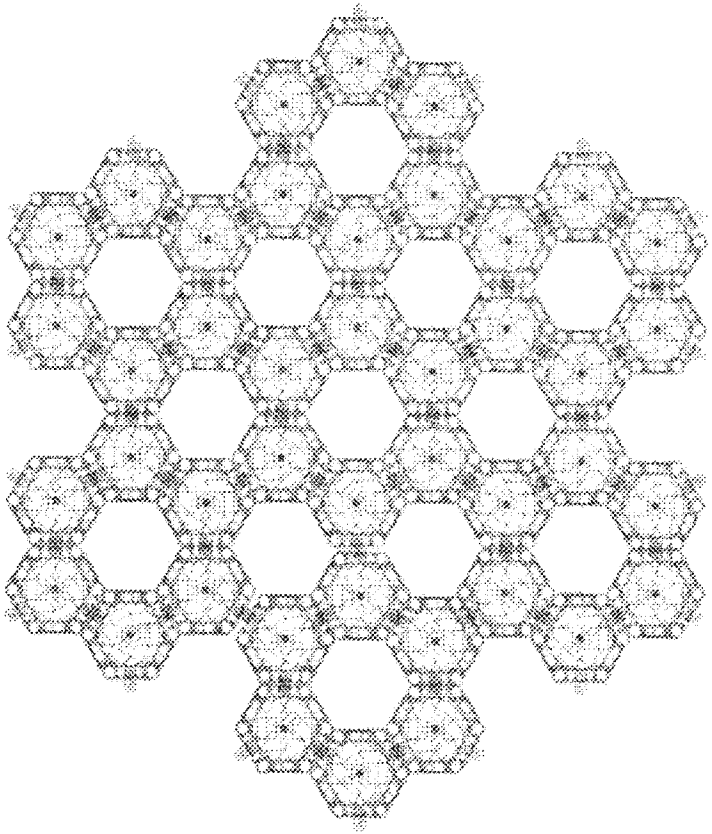
Fig. 39D
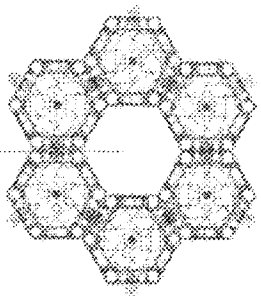
Fig. 39C
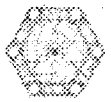
Fig. 39B
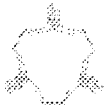
Fig. 39A Fig. 40
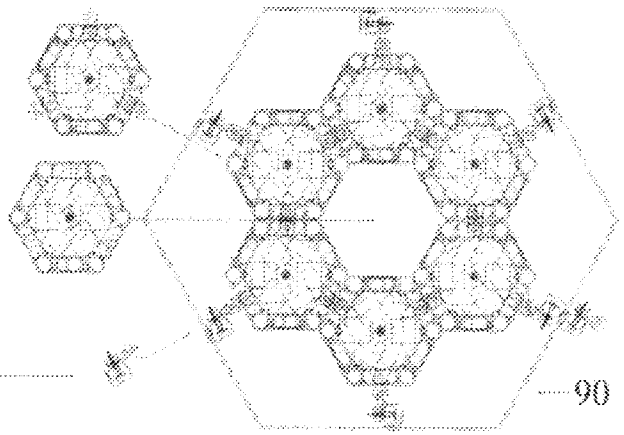
Fig. 40C
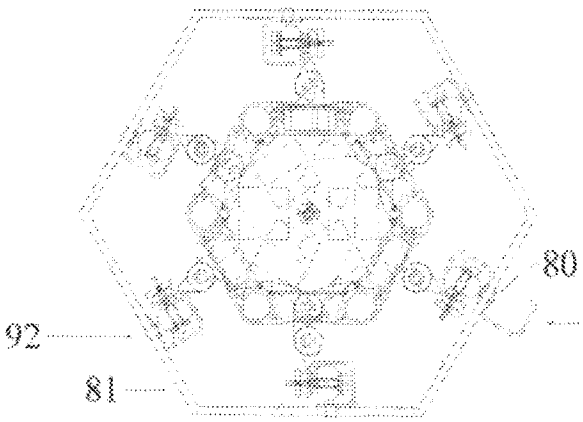
Fig. 40B
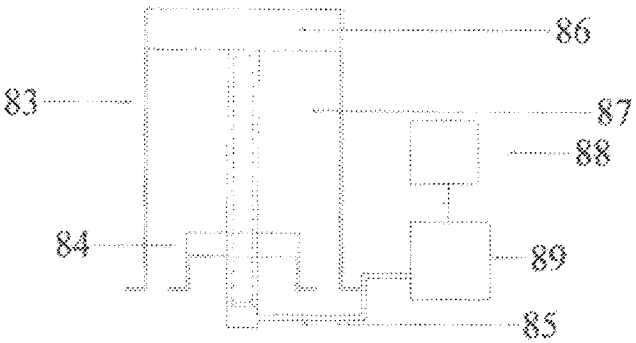
Fig. 40A 95
96
97
98

93
94

Fig. 43
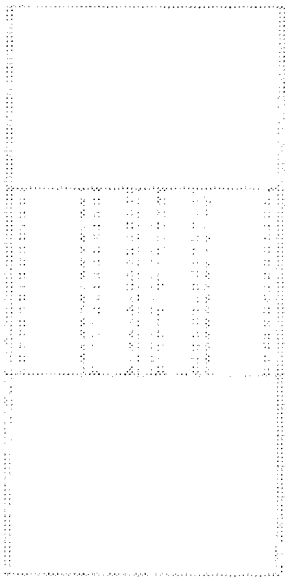
Fig. 43A
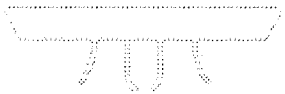
Fig. 43B
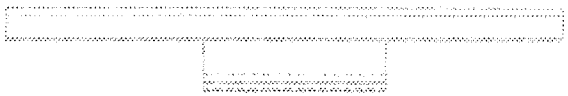
Fig. 43C

Fig. 44
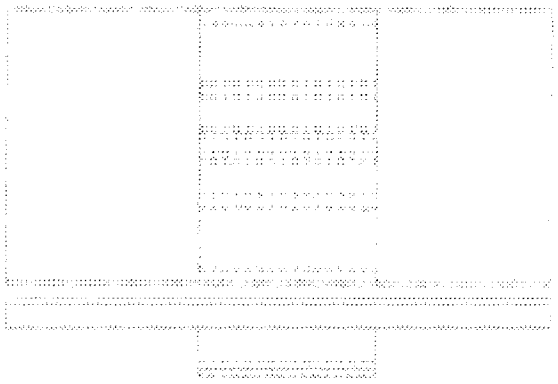
Fig. 44B
Fig. 44C
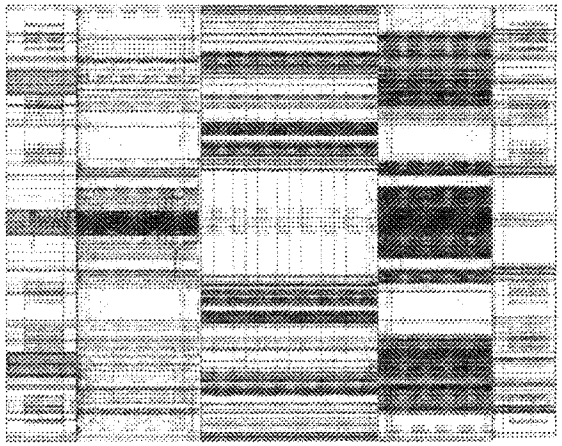
Fig. 44E
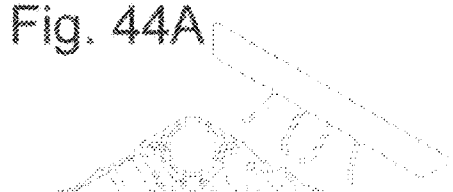
Fig. 44A
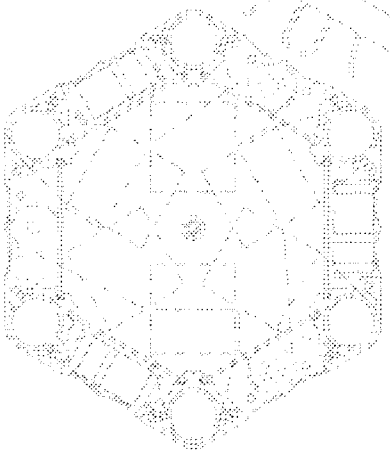
Fig. 44D 100
101
99
102
103

Fig. 48

TABLE 1: SYMBOLIC BLOCK DIAGRAM: COOLING SYSTEMS [AIR/GAS / FLUID]

| | | | | | | | | |
|---|---|---|---|---|---|---|---|---|
| Fig. 48A Air | PUMP: AIR | COOLANT SUPPLY PLENUM | INDIVIDUAL COOLANT ENCLOSURE INTAKE STACKS | ENCLOSURE MAIN [ WITH OPTIONAL FAN(S) | INDIVIDUAL COOLANT ENCLOSURE EXHAUST STACKS | COOLANT EXHAUST PLENUM | VACUUM ASSIST [OPTIONAL] | COOANT RETURN OPTIONAL |
| Fig. 48B Gas | PUMP EXPANDER ASSY. [NITROGEN GAS | COOLANT SUPPLY PLENUM | INDIVIDUAL COOLANT ENCLOSURE INTAKE STACKS | ENCLOSURE MAIN | INDIVIDUAL COOLANT ENCLOSURE EXHAUST STACKS | COOLANT EXHAUST PLENUM | RADIATOR CONDENSER VALVE ASSY | COOLANT RECIRCUL -ATOR |
| Fig. 48C Fluid/Air Heat/Xchg. | PNEUMATIC PUMP WATER/AIR FILTERS | COILED AIR HOSE WITH QUICK DIS-CONNECTS | INDIVIDUAL COOLANT ENCLOSURE INTAKE STACKS | ENCLOSURE MAIN ADIABATIC COOLING DEVICE(S) | INDIVIDUAL COOLANT ENCLOSURE EXHAUST STACKS | COOLANT EXHAUST PLENUM | HEAT EXCHANGER | COOLANT RETURN |
| Fig. 48D Fluid/Gas Heat/Xchg. | NITROGEN PNEUMATIC PUMP WATER/AIR FILTERS | COILED AIR HOSE WITH QUICK DIS-CONNECTS | INDIVIDUAL COOLANT ENCLOSURE INTAKE STACKS | ENCLOSURE MAIN ADIABATIC COOLING DEVICE(S) | INDIVIDUAL COOLANT ENCLOSURE EXHAUST STACKS | COOLANT EXHAUST PLENUM | HEAT EXCHANGER | COOLANT RETURN |

MODULAR COMPUTER NETWORK SYSTEM WITH MODULES HAVING GEOMETRIC SHAPES ARRANGED INTO TESSELLATED ARRAYS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

The objectives and advantages of the invention based on the problems the invention solves are:

1. The invention advances an up and down scalable and nestable enhanced technology with an independent sub-module extraction standardized enclosure form factor.

2. The invention maximizes real estate utilization and attendant internal rate of return (IRR), as measured by co-planar surface area coverage.

3. The invention is expansible from a single plane array or module to stacks of modules and/or multiple planes with manual, hydraulic, pneumatic, mechanical or electromechanical multi-planar motion available for general service access and multi-planar module replacement among nested, and stacked, coplanar and multi-planar modules.

4. The invention supports simplified inter-module sliding-fit access for in-band/in-stack interconnect through interconnection catch module top end cap baskets and module bottom end cap covers, with recessed side wall patch panels and wire guides. Retractors, knock-outs, cut-outs, bezels, backing plates and backing PC boards with matching, quick disconnects on all interconnections as practical, are used in the preferred embodiment, which is not to exclude more hardwired connections. This allows co- and multi-planar module (re-) wiring for in service changes, hot swap and manufacturing change over for multi-disciplinary technology interconnection and integration including parallel processing, command and control, materials and process control, including optics, thermal management, fluidics, explosion proofing, etc. as described herein.

5. The invention integrates internal and external heat transfer options designed to minimize the heat dissipation impact on unit density.

6. The invention integrates manual and automated motion of single and multiple modules, nested or not in arrays and/or stacks in multiple and/or changing spatial orientations utilizing cog motor and rack or rail, roller and track or cable, cable gripper™ (or functional equivalent) and/or cable actuator systems or any combination of the former.

7. The invention advances the structural use of modules, which includes usage as furnishings, with upholstery, walls, floors, ceilings and cat walks.

8. The invention utilizes an easy access extractable card cage/chassis with standoff landings for mounting plates and PC boards, which may be opened up and folded flat for easy work access.

The invention differs from already patented or made inventions as follows:

1. We use words to communicate and define that of which we speak for the purpose of mutual understanding. For this reason, it is necessary to define tessellation forth with. Tessellation is defined as a collection of planar figures that fill a plane with no overlaps and/or gaps. Generalizations to higher planes are also possible . . . (Reference: http://en.wikipedia.org/wiki/Tessellation). Tilings are defined in kind without gaps or overlaps with irregular shapes. This is a pretty standard stuff. Other patents have made claims based on tessellation, which without gaps, would indicate a solid surface without separation and therefore any extrusion from such a planar surface to the third dimension would have to be a singular solid. Therefore this invention is not a tessellation and is hence outside the scope of those patents claiming a tessellation as a basis. [Ref. US patents U.S. Pat. No. 6,469,901B1, Ser. No. 09/672,681].

2. Separately, in kind again, the state of the art, as proposed in preceding patents does not meet or approximate the criterion of a tessellation or tiling with vast unclaimed gaps often exceeding the surface area of the modules, between not even remotely contiguous co- and multi-planar veritable islands connected by "rats-nests" of half-hazard wiring or RF omni-connectional bridges. More chaos than pattern. Thus although the patent proposed here may approximate a tessellation more closely than it's forebears, by definition it is not a tessellation, period, as it uses external planar and other gaps for interconnects, including wiring, cabling, tubing etc. as delineated in other areas of this document and the associated patents incorporated by reference. However, the invention is a vast improvement over prior technology as it takes control of the inter-module "rats nest" of wiring and other interconnection and brings the state of the art closer to the ideal of tessellation extruded from 2D to 3D with gaps. Further, patents using a triangular square, rectangular, hexagonal, or octagonal footprint or form factor without inter-module contact and integrated wiring are of limited utility and hence more a matter of incidental design unless specific utility and hence advantage is assigned to a shape by some feature, This is particularly true if the usage proceeds from these shapes to a circle with all geometric shapes inclusive. [Ref. U.S. Pat. No. 6,4699, 01B1]. Inter-module interconnect wiring is incorporated herein by reference to the first patent application Ser. No. 12/806,206.

3. The invention when deployed maximizes surface coverage by approximating tessellation with gaps on the outside vertical walls. These gaps allow module separation while allowing inter-module axial sliding fit tolerances for external co -and multi-planar inter-module contact and axial inter-module, stack and array motion. Only one other patent has a possible sliding fit, which is not apparently called out in any applicable patent application, and as it appears to use a pipe, it may be assumed to be stationary, bolted in place, without a sliding fit. Other patents have no such sliding fit, either, module to module, stack to stack or in arrays. [Ref. U.S. Pat. No. 4,499,607].

4. The invention allows nesting with vertical axial individual sliding fit component removal without edge, or end mount connectors, but rather using retractors, flexible cable, wire, tubing, etc. Other patents do not nest and allow individual nested submodule replacement without total, extraction of abutting units first. [Ref. U.S. Pat. No. 6,469, 901].

5. The invention utilizes external module side walls with recessed bezeled, unbezeled or combinational patch panels with built in or surface mounted retractors, backing plates, mounting panels and pc boards for wire, cable, etc. in conjunct with sufficient interconnect lengths. This allows abutting module axial motion while maintaining abutting intermodule co- and multi-planar interconnections for side-wall patch panel (re-) configuration, replacement and/or quick change for (re-) manufacture, field service and retrofit while accommodating all styles of interconnect, with a preferred embodiment including quick-disconnect capability. This can be done in single or multiple stacks and/or arrays with or without nesting. Modules in such an arrangement may also be taken out of a stack, an array or stack of arrays, with minimum impact on neighboring modules. No other known system has these conjoined capabilities. [Ref. U.S. Pat. No. 6,469,901]

6. The invention incorporates a top interconnect catch basket and an integral bottom self centering tapered slip fit cover, wherein all styles of interconnect may be mixed and matched, not just computer, or data-exchange. Interconnection capability is limited only by catalog, special hardware or the OEM, vendor or other users imagination. This diversity is based on placement of infinitely configurable mounting flats, replaceable and modifiable bezels, landings, knockouts, cutouts and plugs. This allows for individual stacked modules to be accessed for service including (re-) configuration of end cap wiring basket and cover interconnects. Other patents allow for only proprietary, including alignment based, top and bottom interconnects for communication to and from resource modules such as computers and drives a stand-alone stacks and not for inter-stack or array communication with no catch basket, tapered matching protective cover or cable and/or hanger based alignment systems. [Ref. U.S. Pat. Nos. 6,469,901, 4,501,460].

7. The invention utilizes hot swap. Modules enjoy power interconnects between modules, where a three wire, hot, neutral and ground bus bar system is used within each module with quick-disconnect power interconnects at the top and bottom of each unit, preferably hermaphroditic. The top and bottom units of a singular stack are wired back to the same electrical outland master breaker panel leg. This allows hot swap by disconnecting one side of an intermediate stacked module, connecting a replacement module on the powered disconnected adjacent side, moving the connections from the old to the new module, disconnecting the power plugs from the old module and attaching it to the new module to again complete the double ended bus bar circuit. When dealing with arrays the number of plug interconnects equals the rotational stacking positions possible, as shown in exemplary fashion with three possible plug alignments, matching top and bottom, in the six sided asteroidal enclosure drawings minimum of three such plugs are utilized. In standard configuration one plug set acts as the bus bar, the other two are pass throughs, rotation, by example 120° for a hexagon, which dictates which will be active for a particular stack. This is done so that adjacent modules in planar arrays may have hot swap and not be on the same leg, allowing system information and/or process rerouting, should power go down in a particular leg.

8. The preferred embodiment employs interconnects which enjoy some form of quick-disconnect at either end and are limited in travel to between one and two modules in length to help expedite re-configuration, service modification and replacement, pending component selection. Other systems are more hard-wired and are therefore harder to take apart, update, refurbish, replace or repair. [Ref. U.S. Pat. Nos. 4,501,460, 6,469,901].

9. The invention provides that modules are positioned and moved either manually and/or by automation. Manual motion utilizes cable grippers™ [or functional equivalent], actuator plate, actuator rod, optional actuator tube and connected actuating handle with optional locking release. This is used for individual modules, stacks and/or in nested co- and multi-planar arrays with integrated variants incorporating track and roller systems and/or [stepping] motor driven cog and track systems to constrain or otherwise control motion. Stack and arrays may be horizontal, vertical or any angle in between, held together by frames, hangers, hooks, etc. All combinations as stated are envisioned with or without nesting. No other patent appears to have this capability. [Ref. U.S. Pat. No. 4,501,460].

10. The invention allows single and multi-interconnection sidewall facet based interconnection in either co- or multi-planar geometries or through vertical end cap basket and cover sets or interface with or without utilizing intake and exhaust master plenums or any combination thereof as preferred methods of command and control. Command and control is wired internally from any point of the module wired to the sidewall of choice, and then externally with or without internally and/or externally mounted retractor(s) through the external patch panel on the chosen wall to the module of choice either above and below or adjacent to the co- or multi-planar module in question. The external wire guides above and below the patch panels are used to position and constrain wires to their proper motion. Other patents espouse vertical stack based command and control interconnection only based on individual vertical inter-module wiring with a singular modular interconnect.

11. The invention employs a three, four, six, eight sided astroidal and/or approximated tessellation and/or tiling enclosure with/or without truncated convex or concave apexes and scalloped transitions between individual horizontal curves connecting apices for wire guides, although straight lines may also be used or any combination thereof. Rounded surfaces are preferred to avoid snagging or other binding, although straight lines may also be embraced. However, external enclosure geometries of similar patents are apparently without exception, based on straight lines, some and/or convexly formed curves with no concavely formed features. [Ref. U.S. Pat. Nos. 3,495,134, 4,937,659, 6,469,901].

12. Although many patents refer to thermal management as part of their embodiment in many instances it is not addressed at all. The gold standard appears to be the placement of louvers in the walls of a shoebox or cubic cavity. The invention utilizes radially symmetrical outlying cooling tube housing assemblies tangentially asymptotic to their respective intersecting sidewalls of the individual apex centers which are truncated and rounded so as to be conformal to said housings, with associated extensible coolant duct hosing, quick disconnects, plenums and plugs for intake and exhaust as well as a central optional cooling duct [Dwg. 22]. Cooling tubes are optionally fitted with a non-rotating [Dwg. 25C] or rotating sleeve [Dwg. 25F], with a coolant input ports [Dwg. 25G] and angled output slats [Dwg. 25D], louvers [Dwg. 25E], and/or mesh which allows volumetric and directional tuning of coolant output to common multi-module contiguous apex exhaust stacks. A centralized high velocity cooling stack may operate separately or in conjunction with the former [Dwg 39]. Utilizing this arrangement provides rapid swap out or service of components while minimizing or eliminating the necessity of thermal management disruption in a potentially sealed and therefore explosion proof system with the possibility of above atmospheric operating pressures. Separately, by removing the top and bottom plenums, with their integrated interconnect feed throughs, this exposes end cap wiring basket fan mounts and fan shields for direct main cavity coolant intake and/or exhaust with or without optionally closing off the coolant tube housing assemblies for mechanical aspiration at flow rates comparable to some carburetors, while maintaining main cavity cage retention and peripheral ducting. Cases used or contemplated for use in arrays include a heat barrier on or in all walls so as to direct heat in the designed flow pattern. Flow patterns may be reversed or any other flow pattern combination may be utilized as required. No alternate patented and/or made competitive products appear to exhibit this features. [Ref. U.S. Pat. Nos. 4,501,460, 4,937,659, 4,499,607].

13. The invention utilizes standard industrial cartridges, including floppy disks, hard disks, CD/DVD/Blue Ray/tape drives and removable cartridges generally available through industry-standard catalogs and other sources. Cartridges may not extend beyond opposing bezel walls, with the exception of handle pulls, which must fold out of the way and must be flush and not external, so as to avoid interfering with the sliding fit of other modules. This embodiment shall be considered open source in regard to cartridges to include memory storage devices such as floppy drives, hard drives, CD-ROMs, DVD drives, tape drives, USB devices, fire wire, PCMCIA devices, and attendant previously patented standardized socketed enclosures utilized in industry. Alternate patented and/or made competitive products utilize non-standard cartridges on which they base much of their patents, in regard to industry standard components. Unlike other patents the module is in this regard open source. [Ref. U.S. Pat. Nos. 4,937,659, 6,469,901].

14. Standard industry practice utilizes cutouts, flush bezels in case panels and rails for mounting devices in bays. The invention utilizes covered and protected and/or recessed bezels with or without mounting plates and PC boards attached to the chassis, to embrace custom and/or standard industry catalog or special order devices with available published or unpublished mounting patterns to maintain a sliding fit in relation to the form factors referenced herein. [Ref. U.S. Pat. No. 4,937,659].

15. The invention's chassis when unpopulated or provided mountings do not cross multiple cage side-walls, may be made to layout flat for work, when the top and bottom pins are disconnected in one corner. The chassis is a three, four, five, six, or eight sided wire form assembled from square or rectangular hinged wire frames with configurable break-off tangs limiting inward folding to 120°, 90°, 72°, 60° or 45°, respectively and may act as the system bus-bar ground. Configuration and adaptation of card cages and rails for mounting industry-standard, [including current or future industry requests for comment RFCs to final specifications] or proprietary motherboards and PC boards [including current or future industry requests for comment, "RFCs" to final specifications] shall be considered open source and obvious regarding the mechanical interfaces of same. In this regard, the type 1 enclosure was designed to handle ATX style PC boards, while the type 2 enclosure was designed to handle one or more smaller PC boards, either peripherally, that is radially disposed including by each wall, stacked, and/or any combination thereof. Nor other patent has this arrangement, allowing the potential for easy chassis extraction for work with or without an enclosure, pending final component selection. Other patents, which utilize connector/receptacles as the chassis, under this system, although a connector receptacle may be grounded to the chassis, it is not considered part of the chassis itself [Ref. U.S. Pat. No. 4,937,659].

DRAWINGS

Figures 2, 2A, 2B:
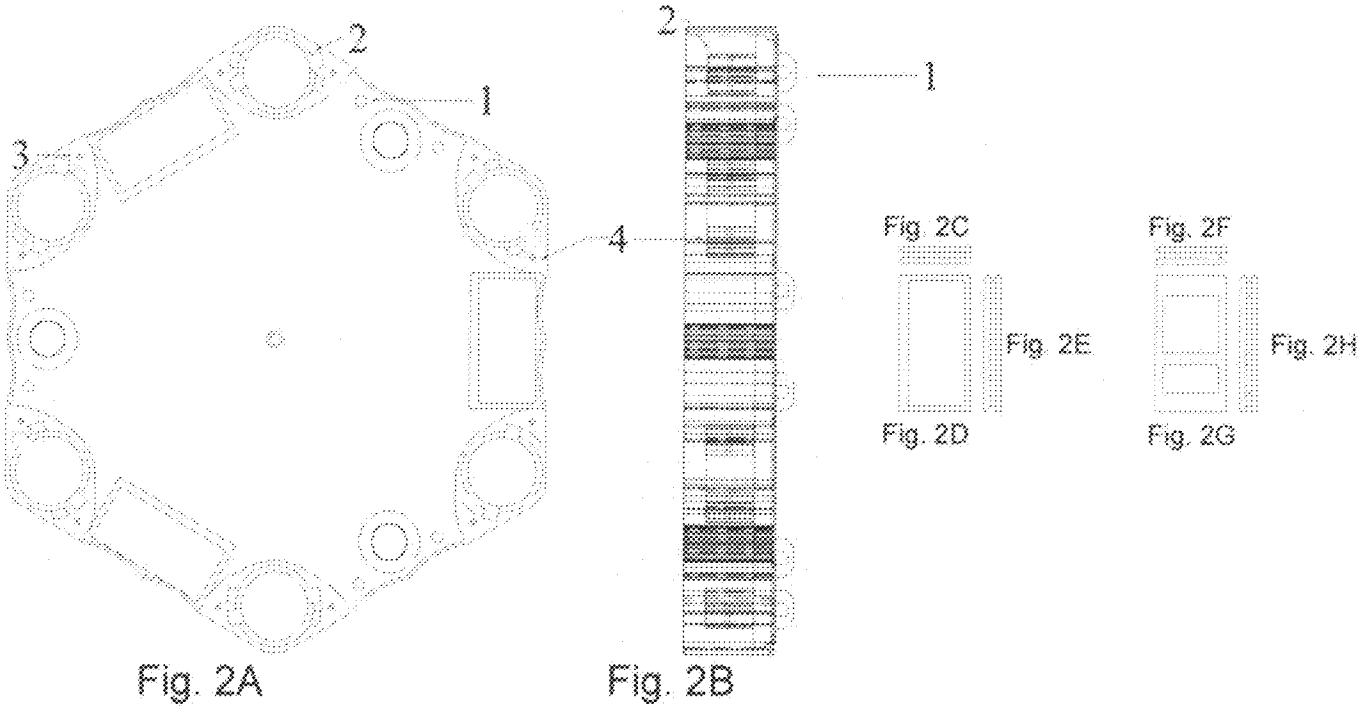

1. Bottom Release Enclosure: Full Assembly
FIG. 1A. Top View, Six Sided Asteroid
FIG. 1B. Symmetrical Handle: Top View
FIG. 1C. Side View: Sight top to left of sheet.
FIG. 1D. Optional Triangular Variant less handle with symbolic top view of planar mono- and multi-planar black/populated and white/non-populated [thermal chimney] symmetrical array.
FIG. 1E. Symbolic Build-Out from Single Equilateral Triangle Structure to Hexagon, Square and Fractal Larger Equilateral Triangle with Implicit Nesting and Array.
FIG. 1F. Example Triangle [and other shapes, including a set of hexagons] Used To Complete a Square [with black/populated and white/non-populated {thermal chimney} symmetrical array].
FIG. 1G. Square Approximated Tesselation/Tiling Tile [with symbolic top view of planar mono- and multi-planar black/populated and white/non-populated {thermal chimney} symmetrical array].
FIG. 1H. Symbolic Build-Out Using Square or Octagon Approximations as Representative Tile/Tesselations [with symbolic top view of planar mono- and multi-planar black/populated and white/non-populated {thermal chimney} symmetrical array].
FIG. 1I. Octagonal Module: Top View 2. Bottom Release Enclosure: Connector Bay Top Cover End Cap
FIG. 2A. Top View
1. Stress relief feed through, grommet, hermetic seal, etc. for wire/cable/pipe;
2. Cooling Tube Hose Assembly ¼ Turn Twist Lock or other standard or special order seal pending usage;
3. Stanchion Guide Hole; and
4. Stanchion Stress Relief FIG. 2B. Side View
FIG. 2C. Standard Blank Bezel: Top View;
FIG. 2D. Standard Blank Bezel: Front View;
FIG. 2E. Standard Blank Bezel: Side View;
FIG. 2F. Bezel with knockouts, cut outs and/or plugs; Top View;
FIG. 2G. Bezel with knockouts, cut outs and/or plugs; Front View; and
FIG. 2H. Bezel with knockouts, cut outs and/or plugs: Side View.

Figures 3, 3A:
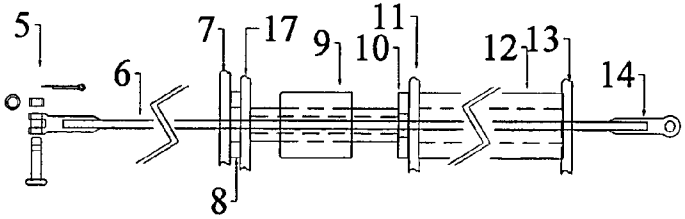
Figure 7:
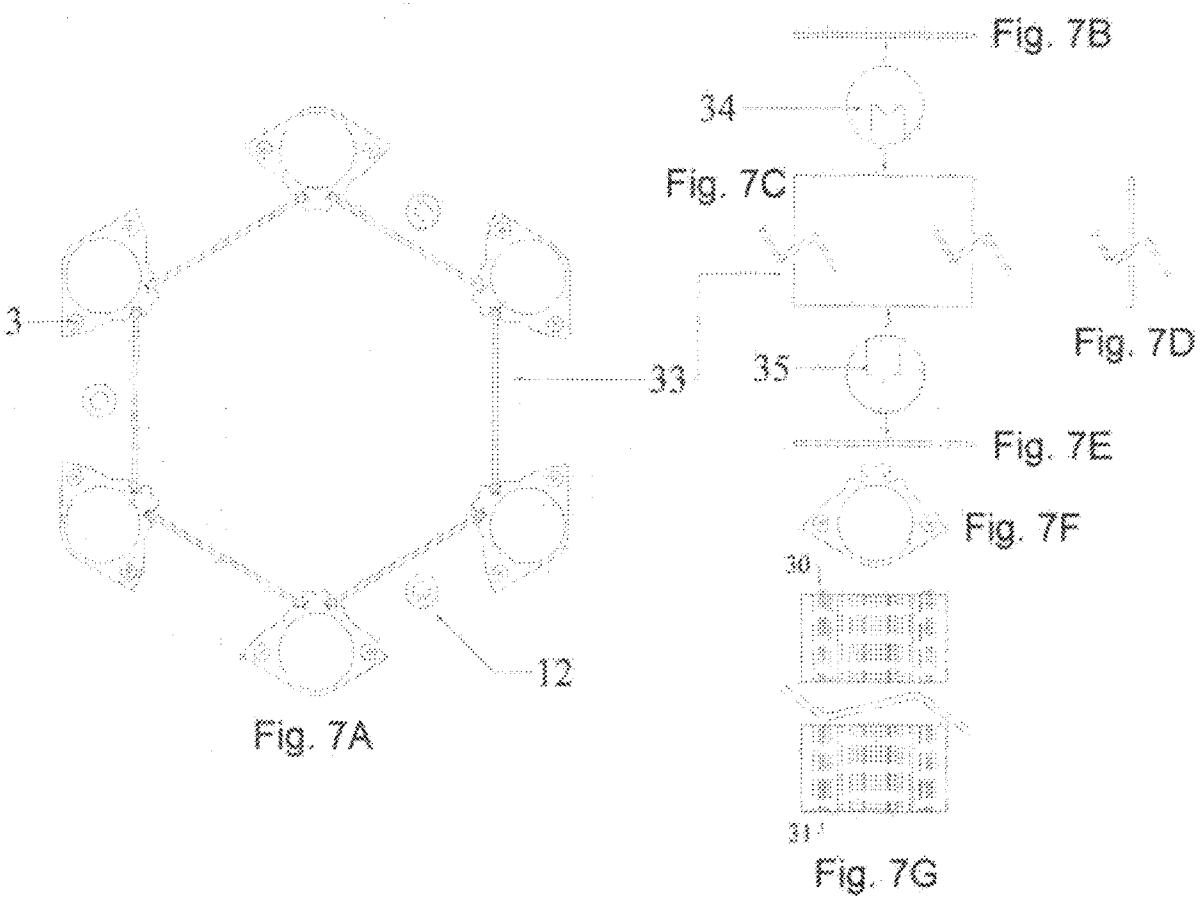
Figure 9:
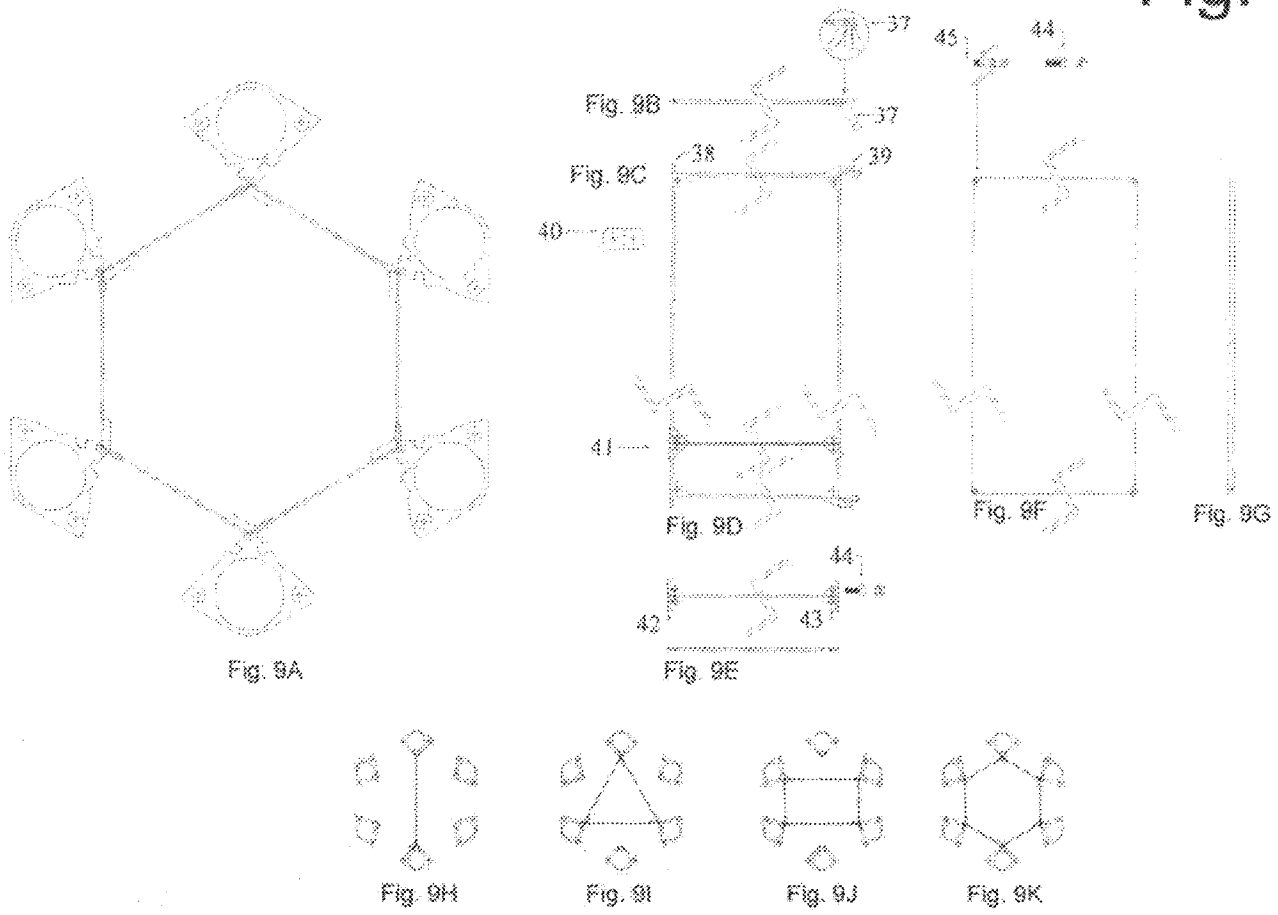
Figure 10:
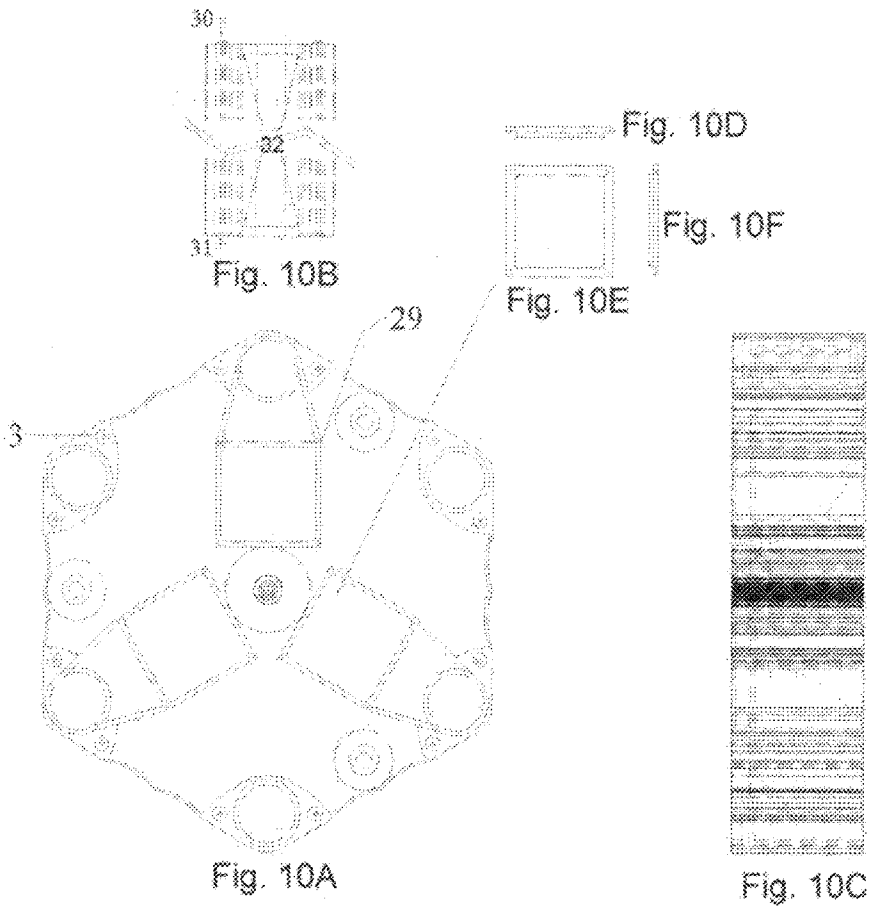
Figure 11:
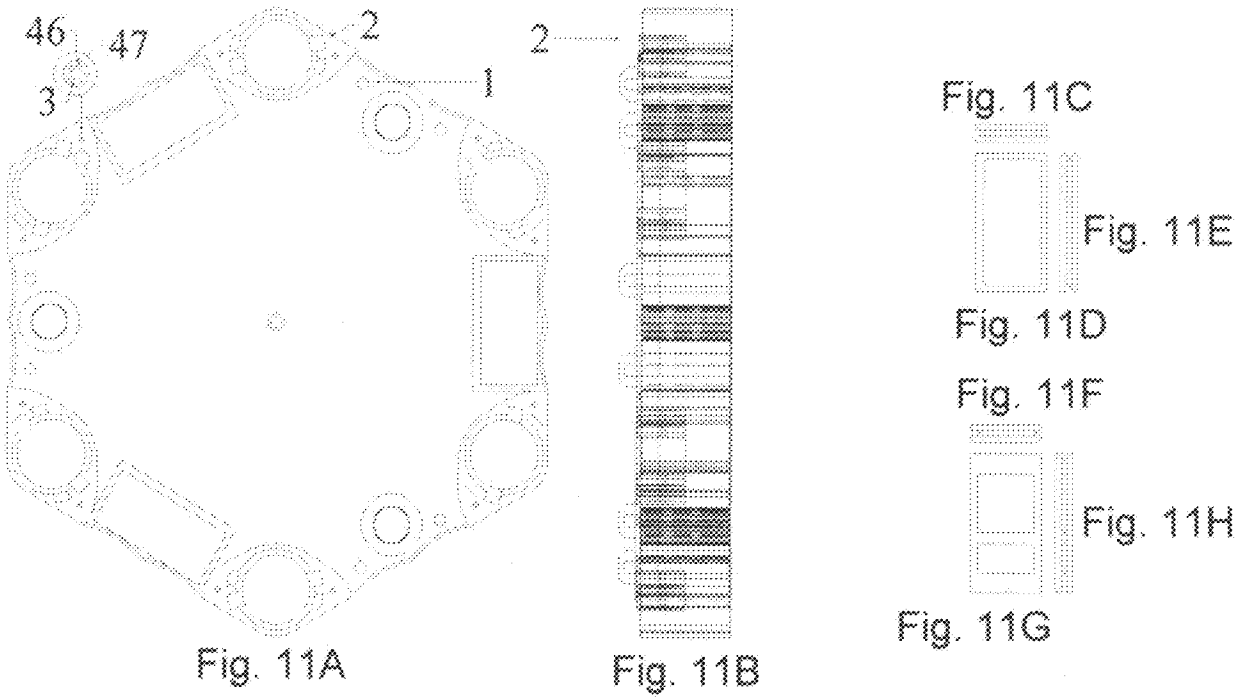
Figure 12:
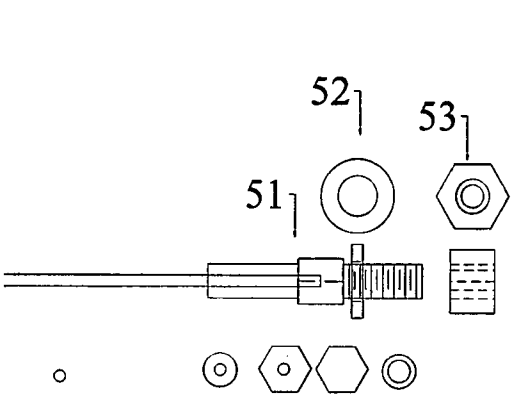
Figure 12:
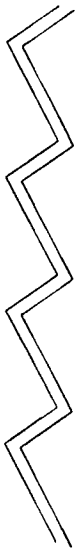
Figure 12A:
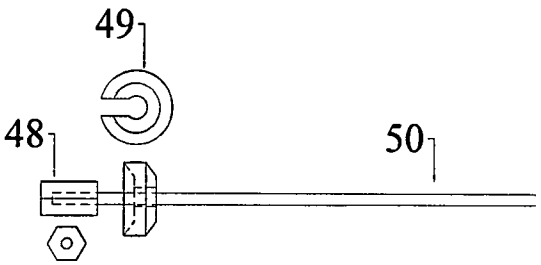
Figure 13:
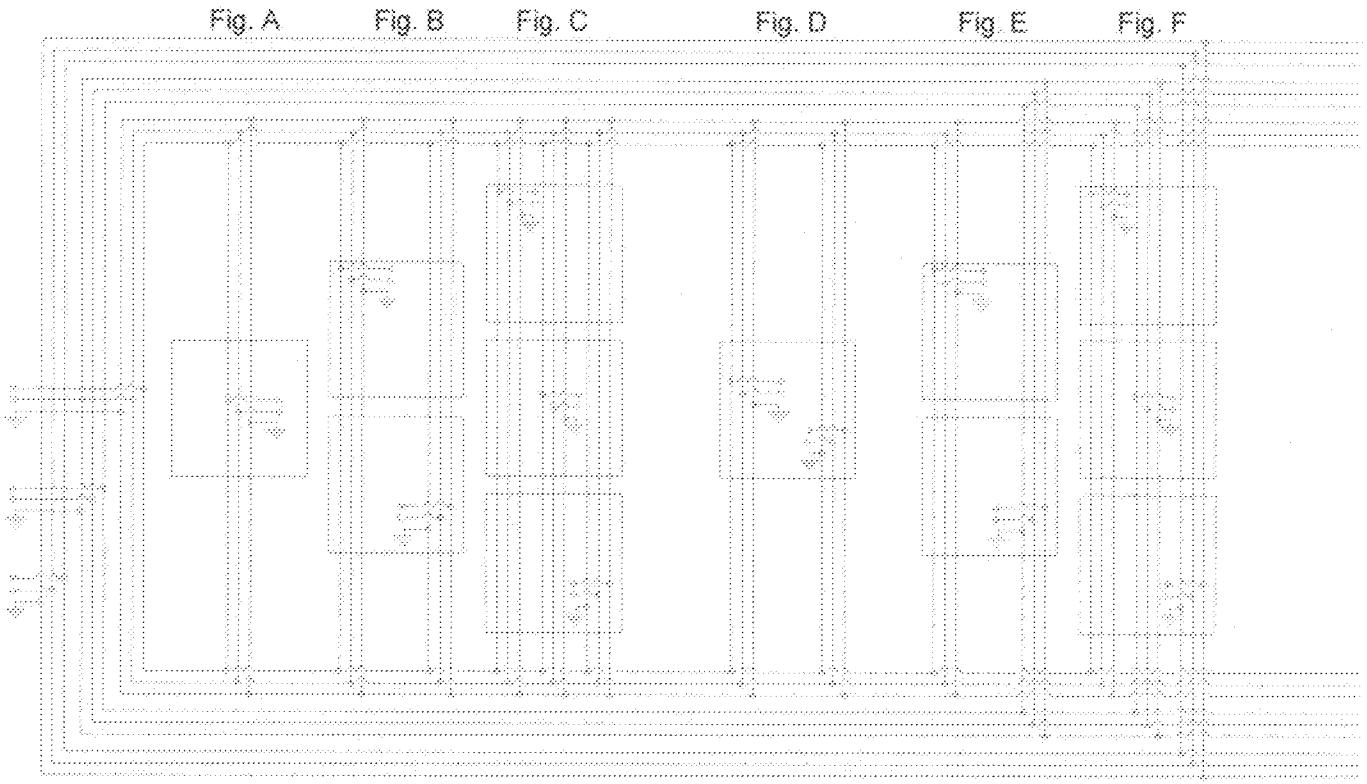

3. Bottom Release Enclosure: Cable gripper™ [or functional equivalent] Assembly
FIG. 3A. Assembly
5. Clevis Pin Assembly or equivalent functioning hardware, example: strap eye end
6. Cable
7. Bottom End Cap Wall
8. Vibration Absorbing Washer, Neoprene or equivalent
17. Actuator Plate Cable gripper™ [or functional equivalent] Guide
9. Cable gripper™ [or functional equivalent]
10. Neoprene or equivalent vibration absorbing washer
11. Bottom Plenum Wall
12. Guide Tube
13. Top Plenum Wall
14. Eye 4. Bottom Release Enclosure: Bottom Cable Gripper Actuator Assembly Actuator Plate
FIG. 4A. Actuator Plate
16. Actuator Plate Cable Gripper™ [or functional equivalent] Landing
17. Actuator Plate Cable Gripper™ [or functional equivalent] Guide FIG. 4B. Bottom Actuator Assembly
18. Actuator Rod
19. Cotter Pin 20. Small Spring Collar
21. Spring
22. Large Spring Collar
23. Actuator Plate
24. Nut
25. Lock Washer
26. Washer
7. Bottom Plenum Wall
27. Actuator Tube
11. Top Plenum-Bottom Wall Handle 5. Bottom Release Enclosure: Coolant Intake Plenum
FIG. 5A. Top View
3. Stanchion Guide Hole;
29. Fan Mount Screw Holes;
FIG. 5B. Plenum Cooling Tube Orifice Interface from Plenum Side
30. Stanchion Tab;
31. Stanchion Seat;
32. Orifice
FIG. 5C. Side View
FIG. 5D. Fan Mount, Side View
FIG. 5E. Fan Mount Top View
FIG. 5F. Fan Mount, Alternate Side View 6. Bottom Release Enclosure: Coolant Intake Plenum with Actuator Plate Installed
FIG. 6A. Top View;
FIG. 6B. Orifice View;
FIG. 6C. Side View;

7. Bottom Release Enclosure: Bezel Stanchion Assembly
FIG. 7A. Stanchion/Tube Bezel Assembly: Top View;
12. Guide Tube: Top View;
33. Bezel;
FIG. 7B. Bezel: Top View;
34. Bezel: Concave Seating Edge;
FIG. 7C. Bezel: Front View, Shown Blank with/with out mounting plate backing and with/without chassis ground pending material selection and purpose;
35. Bezel: Convex Seating Edge;
FIG. 7D. Bezel: Side View;
FIG. 7E. Bezel: Bottom View;
FIG. 7F. Cooling Tube: Top View;
FIG. 7G. Cooling Tube Segment: Side View [less coolant ports]
30. Stanchion Tab;
31. Stanchion Seat;

8. Bottom Release Enclosure: Bezel Assembly With/Without Mounting Plate and Chassis Ground
FIG. 8A. Top View
12. Cable Guide Tube, Top and Side Views
FIG. 8B. Side View
36. Bezel Array
FIG. 8C. Bezel Backing Plate, Front View
45. Standoff
FIG. 8D. Bezel Backing Plate, Side View
FIG. 8E. PC Board, Front View
FIG. 8F. PC Board, Side View
44. Retaining Screw 9. Bottom Release Enclosure: Cage Assembly
FIG. 9A. Six Segment Chassis Assembly: Top View
FIG. 9B. Chassis Cage: Single Side: Top View
37. Inward Travel Limiting Tang [60 degree shown]
FIG. C. Chassis Cage: Single Side: Front View
38. Pivot Pin
39. Pivot Pin Receiver and Washer
40. Band Strap [tabbed/screwed/bolted]
FIG. 9D. Cross Brace: Side View
41. Cross Brace: Side View: Installed
42. Channel
43. Bolt/screw hold-down holes
44. Bolt
FIG. 9E. Cross Brace: Top View
FIG. 9F. PC Board Tray/Mounting or Backing Plate
44. Bolt
45. Standoff/Washer
FIG. 9G. Side View
FIG. 9H. Single Segment Cross Enclosure Chassis Cage
FIG. 9I. Three Segment Triangle Enclosure Chassis Cage
FIG. 9J. Four Segment Rectangle Enclosure Chassis Cage
FIG. 9K. Six Segment Rectangle Enclosure Chassis Cage 10. Bottom Release Enclosure: Exhaust Plenum
FIG. 10A. Top View
3. Stanchion Guide Hole;
29. Fan Mount Screw Holes;
FIG. 10B. Plenum Cooling Tube Orifice Interface from Plenum Side
30. Stanchion Tab;
31. Stanchion Seat;
32. Orifice;
FIG. 10C. Side View: Intake/Exhaust Plenum less Stanchion/Tube
FIG. 10D. Fan Mount, Side View
FIG. 10E. Fan Mount Top View
FIG. 10F. Fan Mount, Alternate Side View 11. Bottom Release Enclosure: Connector Bay Cover End Cap
FIG. 11A. Top View:
1. Stress relief feed through, grommet, hermetic seal, etc. for wire/cable/pipe;
2. Cooling Tube Hose Assembly ¼ Turn Twist Lock or other standard or special order seal pending usage;
46. Conformal Bolt-Head Seat;
47. Recess
3. Stanchion Guide Hole
FIG. 11B. Side View
FIG. 11C. Standard Blank Bezel: Top View;
FIG. 11D. Standard Blank Bezel: Front View
FIG. 11E. Standard Blank Bezel: Side View;
FIG. 11F. Connector Bay Bezels With/With Out Knock Outs/Plugs: Top View;
FIG. 11G. Connector Bay Bezels With/With Out Knock Outs/Plugs: Front View;
FIG. 11H. Connector Bay Bezels With/With Out Knock Outs/Plugs: Side View 12. Bottom Release Enclosure: Stanchion Assembly.
FIG. 12A. Assembly
48. Crimped-On Rod End;
49. "C" Washer Seat;
50. Metal Rod;
51. Crimped-On Threaded Rod End;
52. Washer;
53. Nut;

13. Double Ended Bus Bar Hot Swap Wiring
FIG. 13A. Single Unit, Single Power Source [PS], Single Path
FIG. 13B. Twin Unit, Single PS, Dual Path
FIG. 13C. Triple Unit, Single PS, Triple Path
FIG. 13D. Single Unit, Single PS, Dual Path
FIG. 13E. Twin Unit, Dual PS, Dual Path w/Alternating Bypass FIG. 13F. Triple Unit, Triple PS, Triple Path with Three Way Bypass 14. Bottom Release Enclosure: Collapsible Cooling Tube Assembly Components FIG. 14A. Collapsible Cooling Tube 54. Female ¼ Turn Twist Lock Tubular Collar Seal;
55. Male ¼ Turn Twist Lock Tubular Collar Seal;
56. Threaded Tubular Hose Collar Seal;
57. Spring Loaded Collapsible Hose.

FIG. 14B. Cooling Tube Petcock

FIG. 14C. Cooling Tube Elbow

15. Top Release Enclosure: Full Assembly, Top View;

FIG. 15A. Symmetrical Handle: Top View; Side View: [Sight top top left of sheet];

FIG. 15B. Handle

FIG. 15C. Full Assembly, Side View

16. Top Release Enclosure: Connector Bay Top Cover with Single Fan Center Knockouts and Three-Way Armature Central Actuator Support.

FIG. 16A. Top View;

1. Stress relief feed through, grommet, hermetic seal, etc. for wire/cable/pipe;
2. Cooling Tube Hose Assembly ¼ Turn Twist Lock or other standard or special order seal pending usage.

Figure 17:
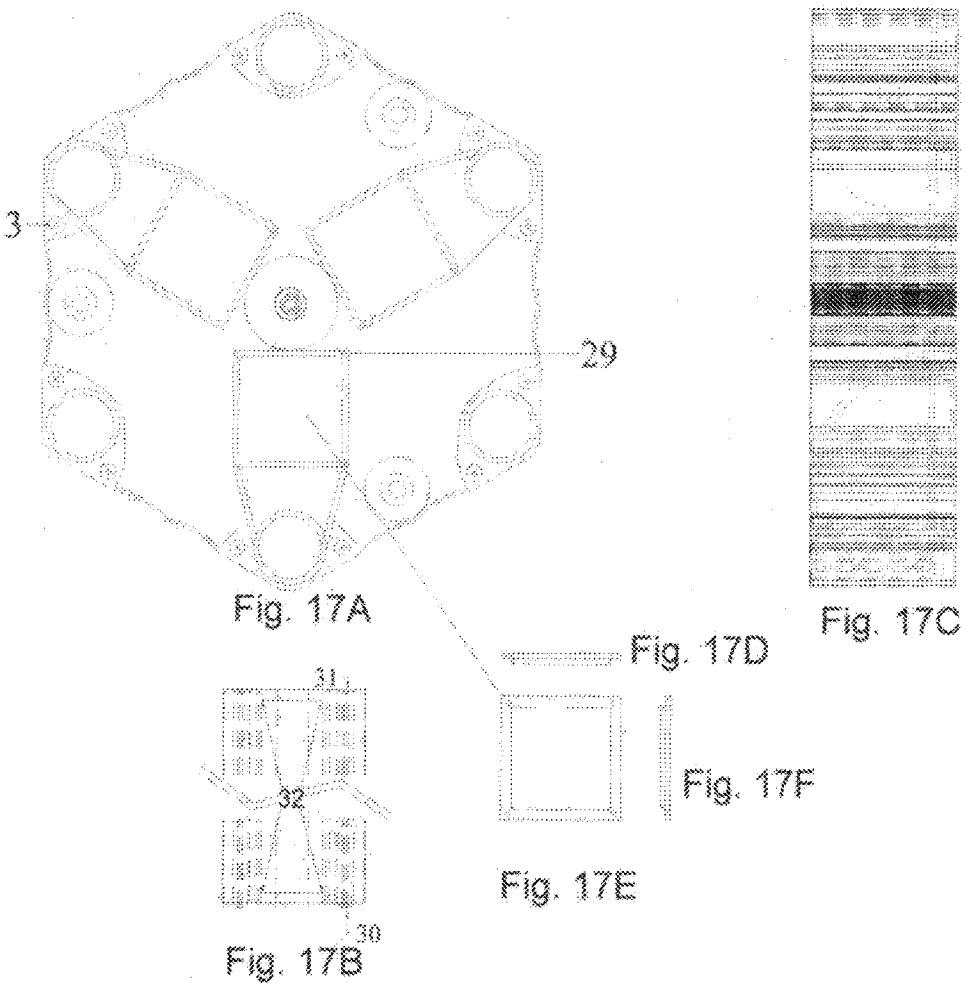

FIG. 16B. Side View;

FIG. 16C. Standard Blank Bezel: Top View;

FIG. 16D. Standard Blank Bezel: Front View;

FIG. 16E. Standard Blank Bezel: Side View;

FIG. 16F. Bezel with knockouts, cut outs and/or plugs; Top View;

FIG. 16G. Bezel with knockouts, cut outs and/or plugs:

FIG. 16H. Front View; Bezel with knockouts, cut outs and/or plugs: Side View;

FIG. 16I. Corner Gusseted Screen Fan Guard With Center Grommet For Single Fan, Side View FIG. 16J. Top and Bottom View FIG. 16K. Screen Fan Guard-Fan-Screen Fan Guard Sandwich 17. Top Release Enclosure: Coolant Intake Plenum FIG. 17A. Top View;

3. Stanchion Guide Hole;
29. Fan Mount Screw Holes;

FIG. 17B. Plenum Cooling Tube Orifice Interface from Plenum Side;

31. Stanchion Landing;
30. Stanchion Tab;
32. Orifice

FIG. 17C. Side View.

FIG. 17D. Fan Mount, Side View

FIG. 17E. Fan Mount Top View

FIG. 17F. Fan Mount, Alternate Side View

18. Top Release Enclosure: Non-Bezeled, Molded Main Cavity

Figure 18:
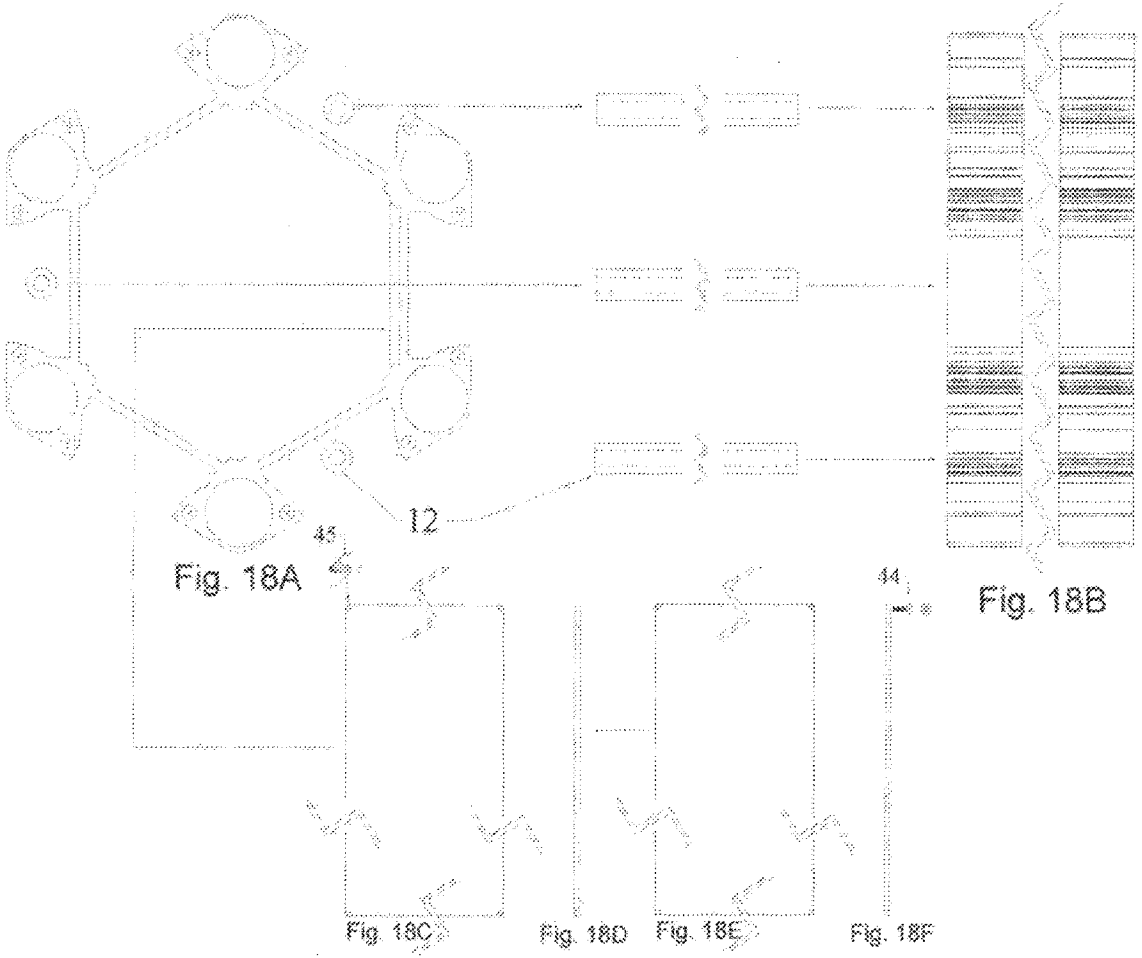

FIG. 18A. Top View;

12. Guide Tube: Top View and Side View;

FIG. 18B. Side View

FIG. 18C. Bezel Backing Plate, Front View

45. Standoff

FIG. 18D. Bezel Backing Plate, Side View

FIG. 18E. PC Board, Front View

FIG. 18F. PC Board, Side View

44. Retaining Screw

19. Top Release Enclosure: Cage Assembly

Figure 19:
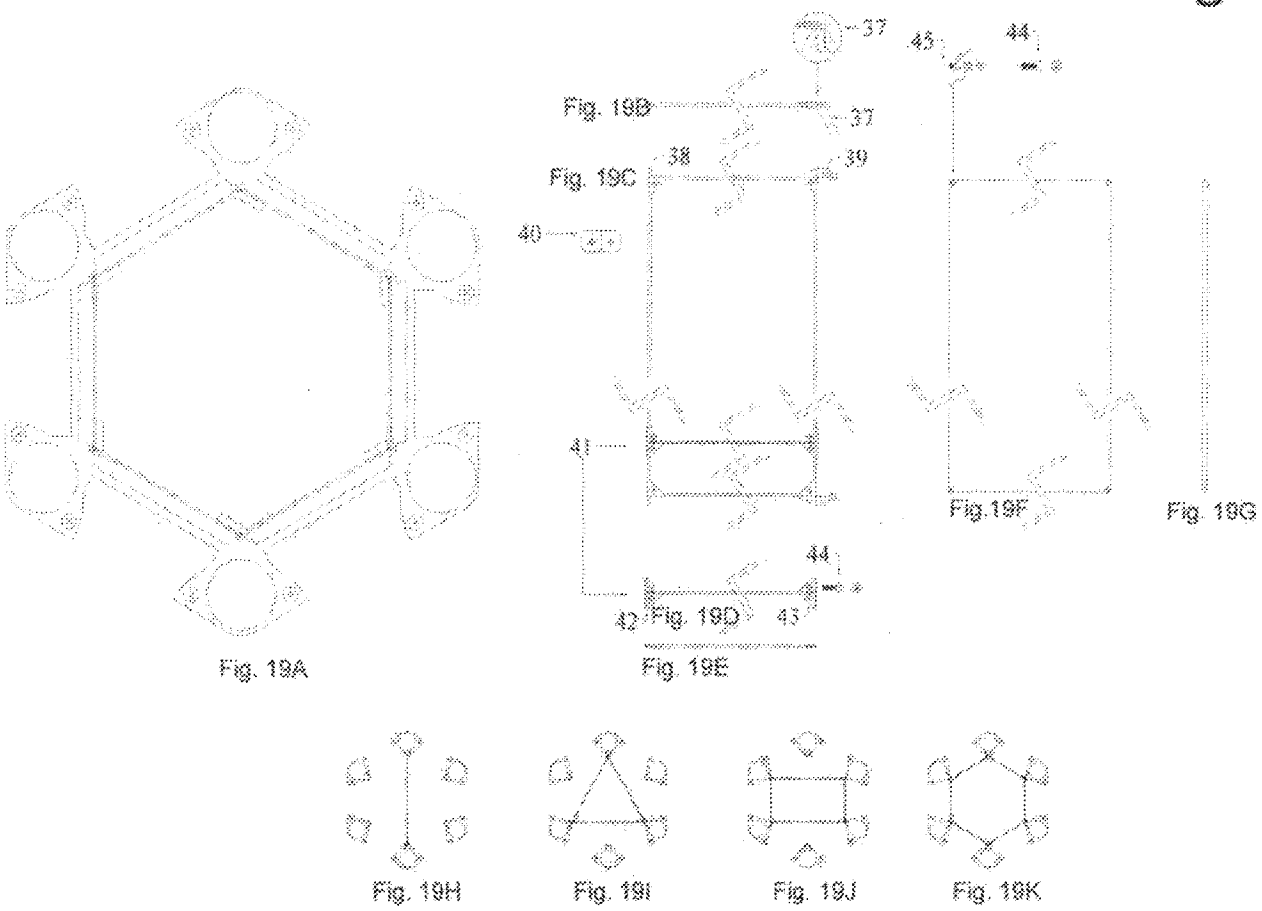

FIG. 19A. Six Segment Chassis Assembly: Top View

FIG. 19B. Chassis Cage: Single Side: Top View

37. Inward Travel Limiting Tang [60 degree shown]

FIG. 19C. Chassis Cage: Single Side: Front View

38. Pivot Pin
39. Pivot Pin Receiver and Washer
40. Band Strap [tabbed/screwed/bolted]

FIG. 19D. Cross Brace: Side View

Figure 20:
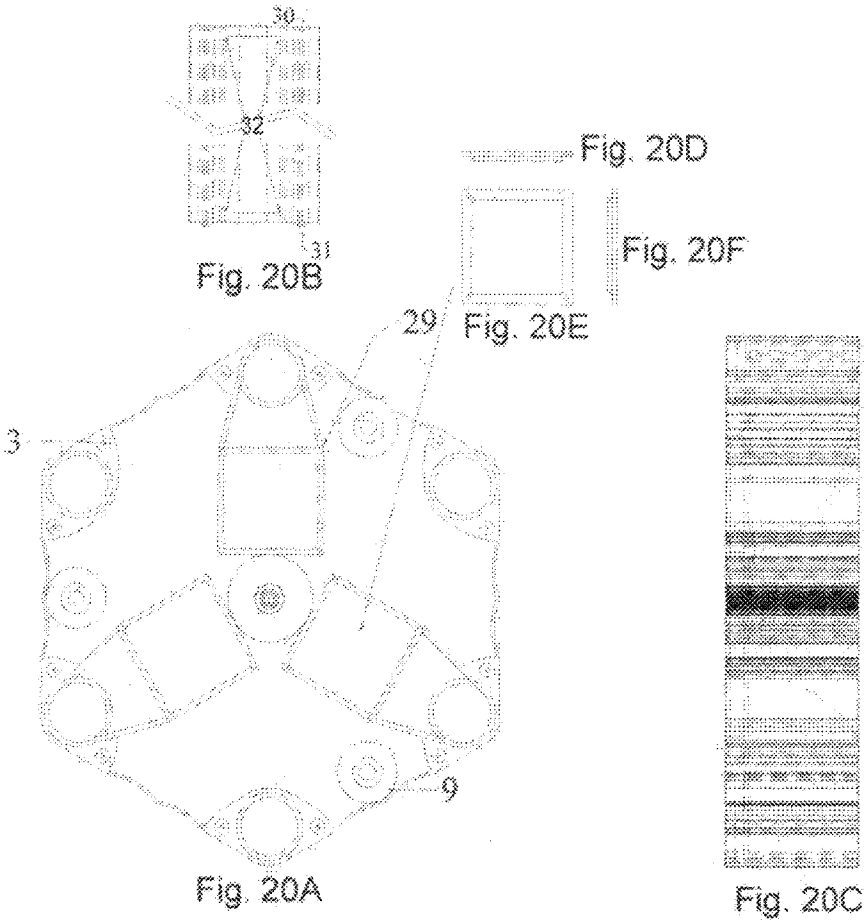
Figures 21, 21A:
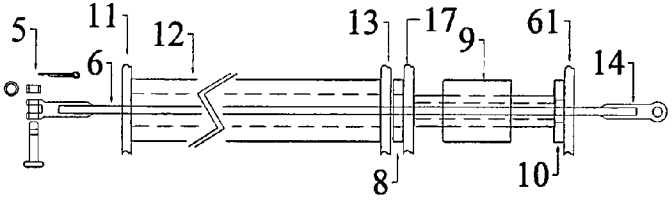

41. Cross Brace: Side View: Installed
42. Channel
43. Bolt/screw hold-down holes
44. Bolt FIG. 19E. Cross Brace: Top View FIG. 19F. PC Board Tray/Mounting or Backing Plate 44. Bolt
45. Standoff/Washer FIG. 19G. Side View FIG. 19H. Single Segment Cross Enclosure Chassis Cage FIG. 19I. Three Segment Triangle Enclosure Chassis Cage FIG. 19J. Four Segment Rectangle Enclosure Chassis Cage FIG. 19K. Six Segment Rectangle Enclosure Chassis Cage 20. Top Release Enclosure: Exhaust Plenum FIG. 20A. Top View 3. Stanchion Guide Hole;
29. Fan Mount Screw Holes;

FIG. 20B. Plenum Cooling Tube Orifice Interface from Plenum Side

31. Stanchion Seat;
32. Orifice;
30. Stanchion Tab;
9. Cable gripper™ [or functional equivalent].

FIG. 20C. Side View:

FIG. 20D. Fan Mount, Side View

FIG. 20E. Fan Mount Top View

FIG. 20F. Fan Mount, Alternate Side View

21. Top Release Enclosure: Cable Assembly

FIG. 21A. Assembly

5. Clevis Pin Assembly or equivalent functioning hardware, example: strap eye end;
6. Cable;
11. Bottom Plenum Wall
12. Guide Tube
13. Top Plenum Wall
8. Neoprene or equivalent vibration absorbing washer
17. Actuator Plate Cable gripper™ [or functional equivalent] Guide
9. Cable gripper™ [or functional equivalent]
10. Neoprene or equivalent vibration absorbing washer
61. Top End Cap Wall
14. Eye 22. Top Release Enclosure: Connector Bay End Cap Single Fan Center Knockouts and Three-Way Armature Central Actuator Support.

FIG. 22A. Top View:

1. Stress relief feed through, grommet, hermetic seal, etc. for wire/cable/pipe;
2. Cooling Tube Hose Assembly ¼ A Turn Twist Lock or other standard or special order seal pending usage;

FIG. 22B. Side View

FIG. 22C. Standard Blank Bezel: Top View;

FIG. 22D. Standard Blank Bezel: Front View

Figures 23, 23A, 23B, 23C:
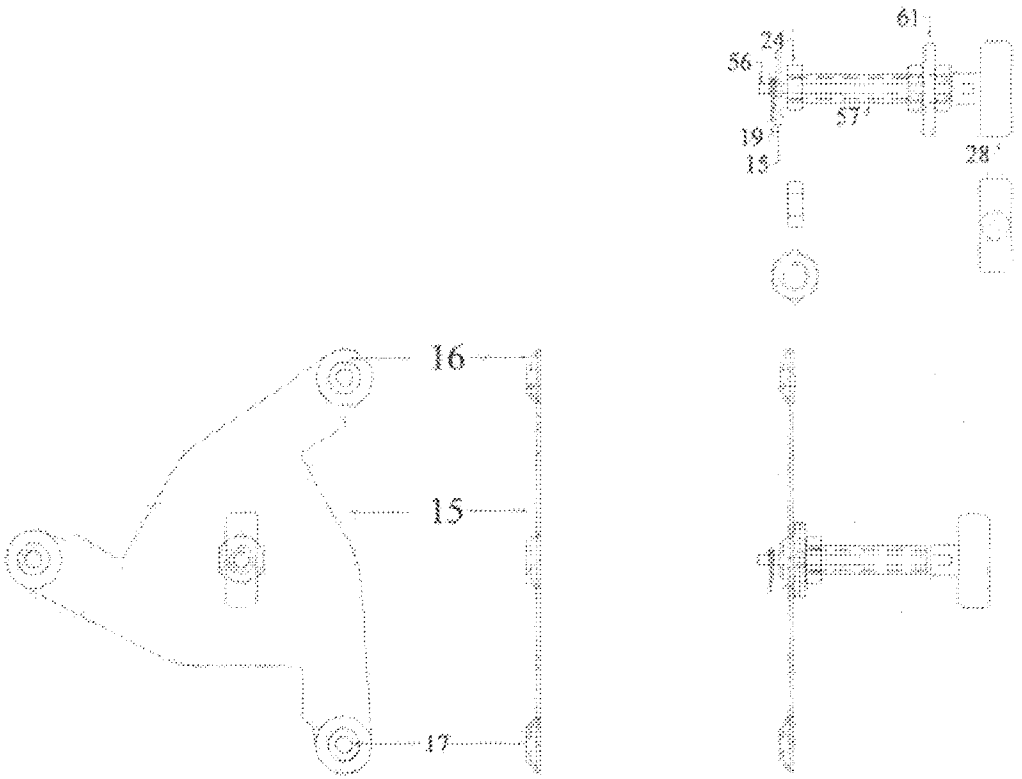
Figure 24:
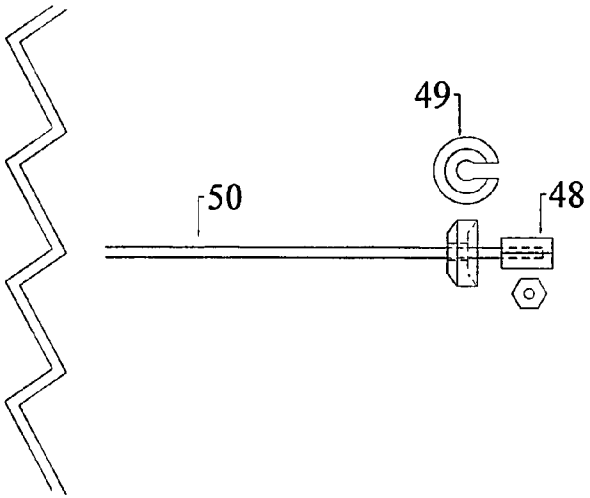
Figure 24A:
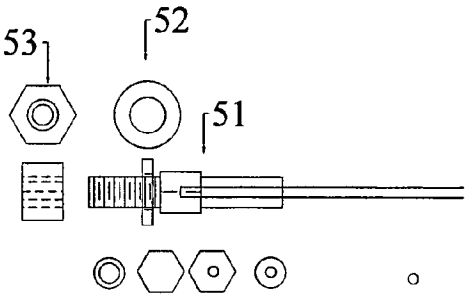
Figure 25:
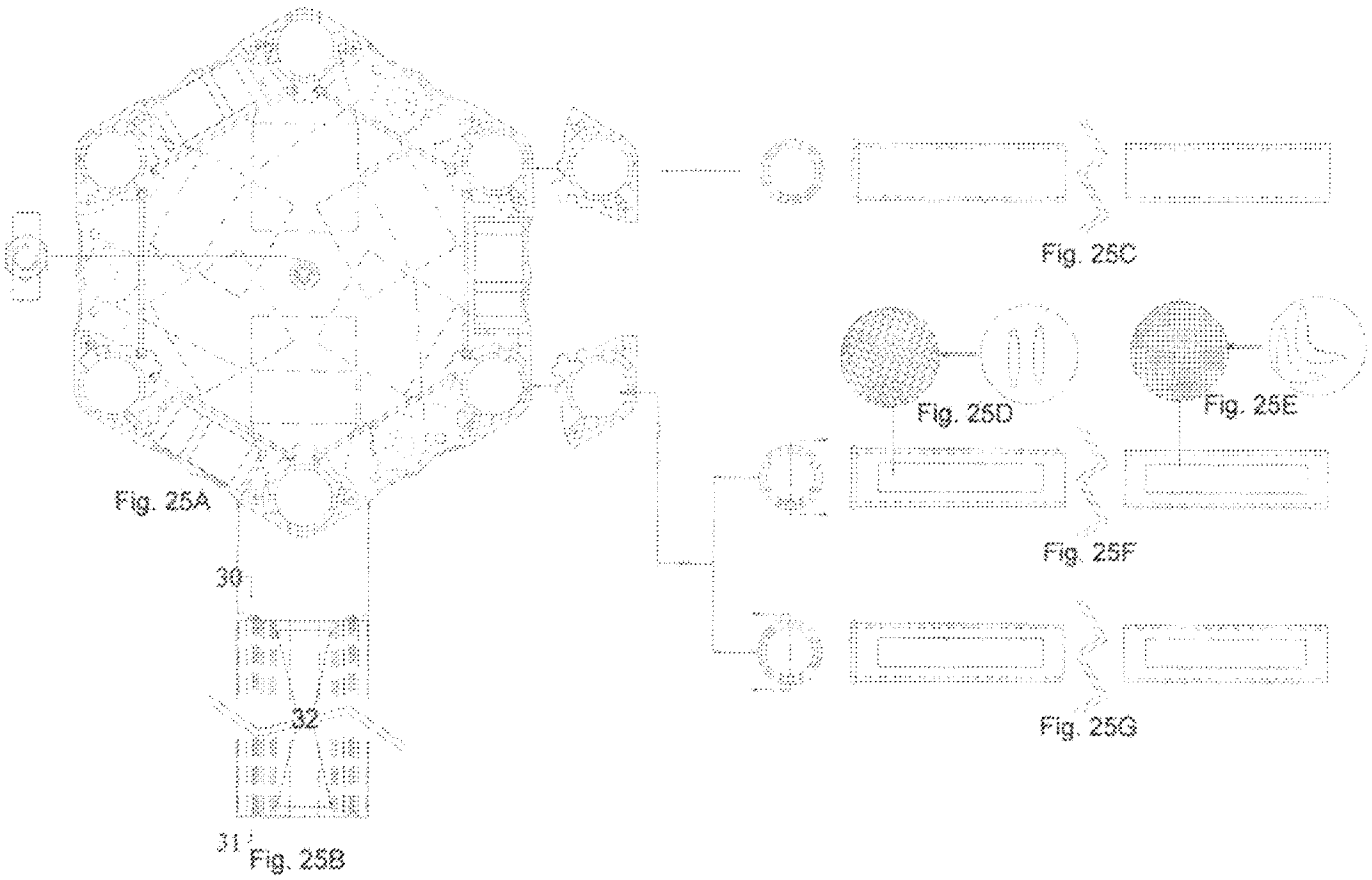
Figures 26, 26A, 26B, 26C:
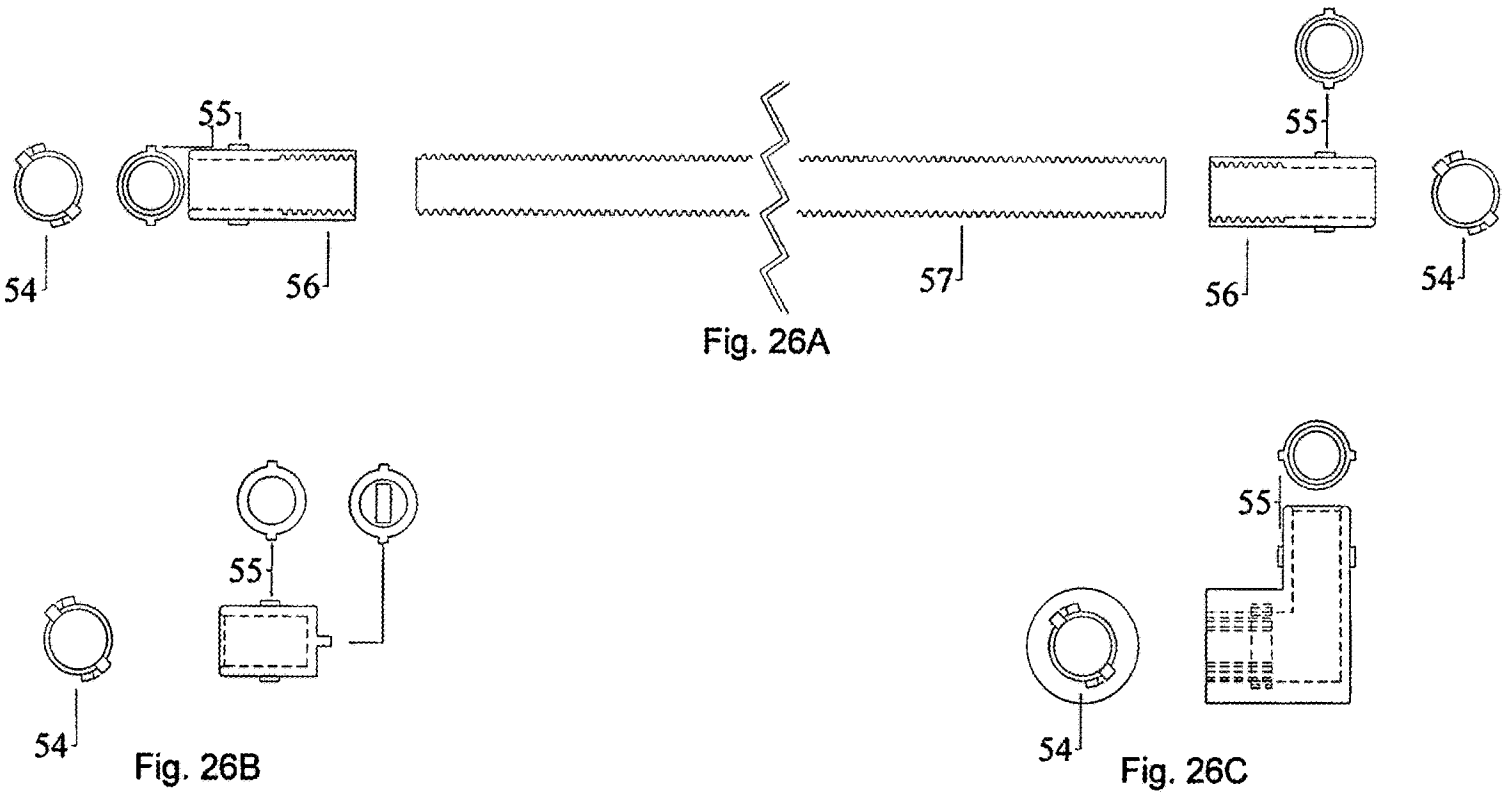
Figures 27, 27A:
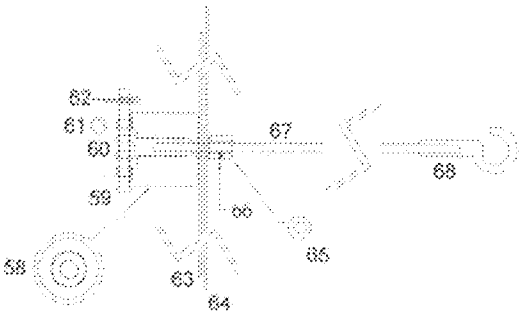
Figure 28:
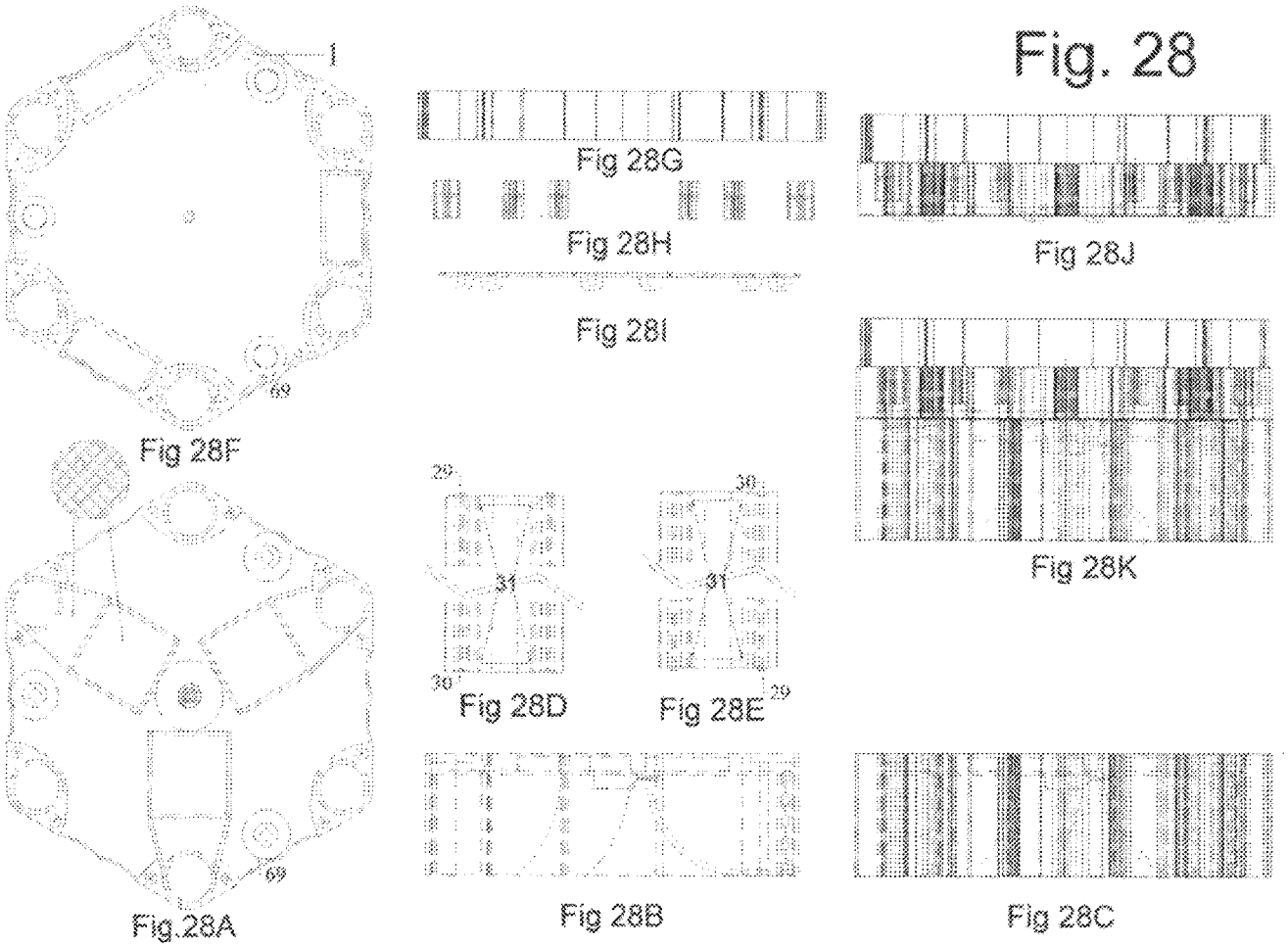
Figures 30, 30A, 30B, 30C, 30D, 30E:
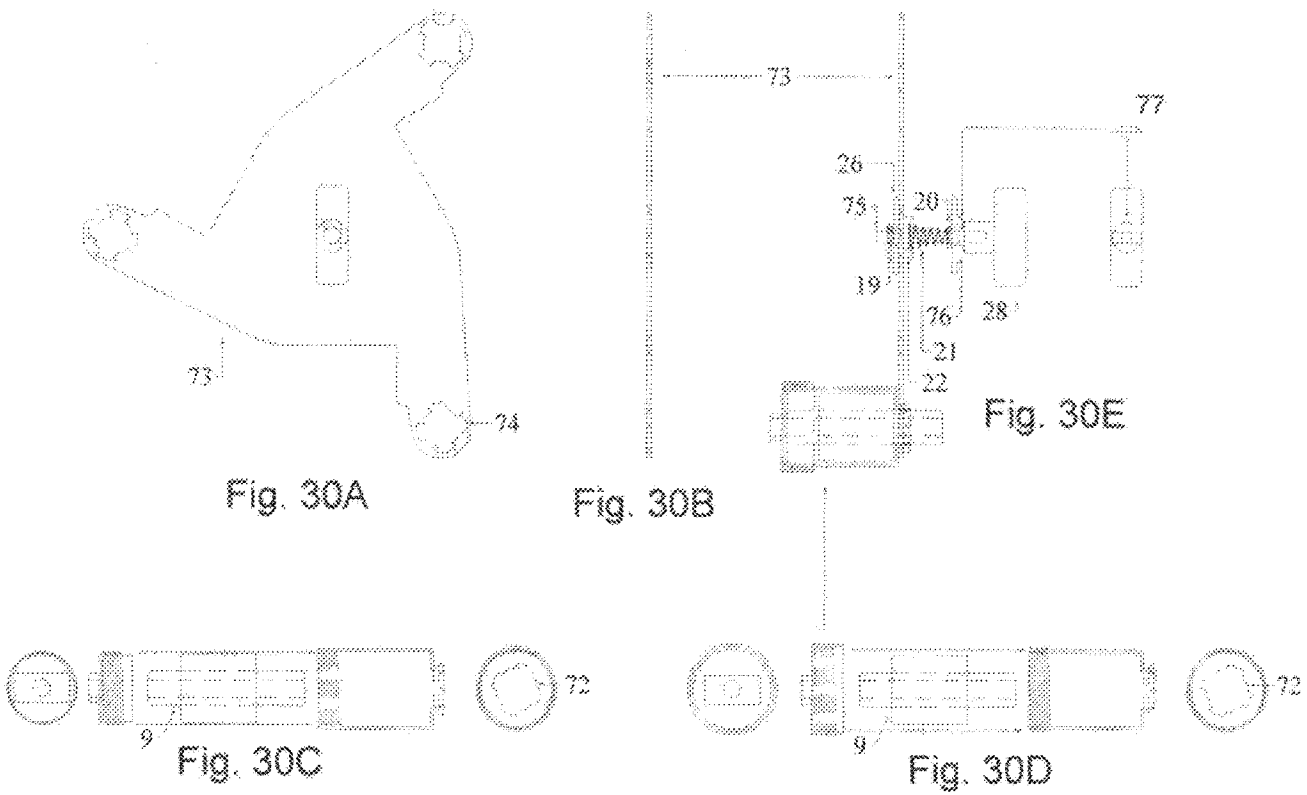
Figure 31:
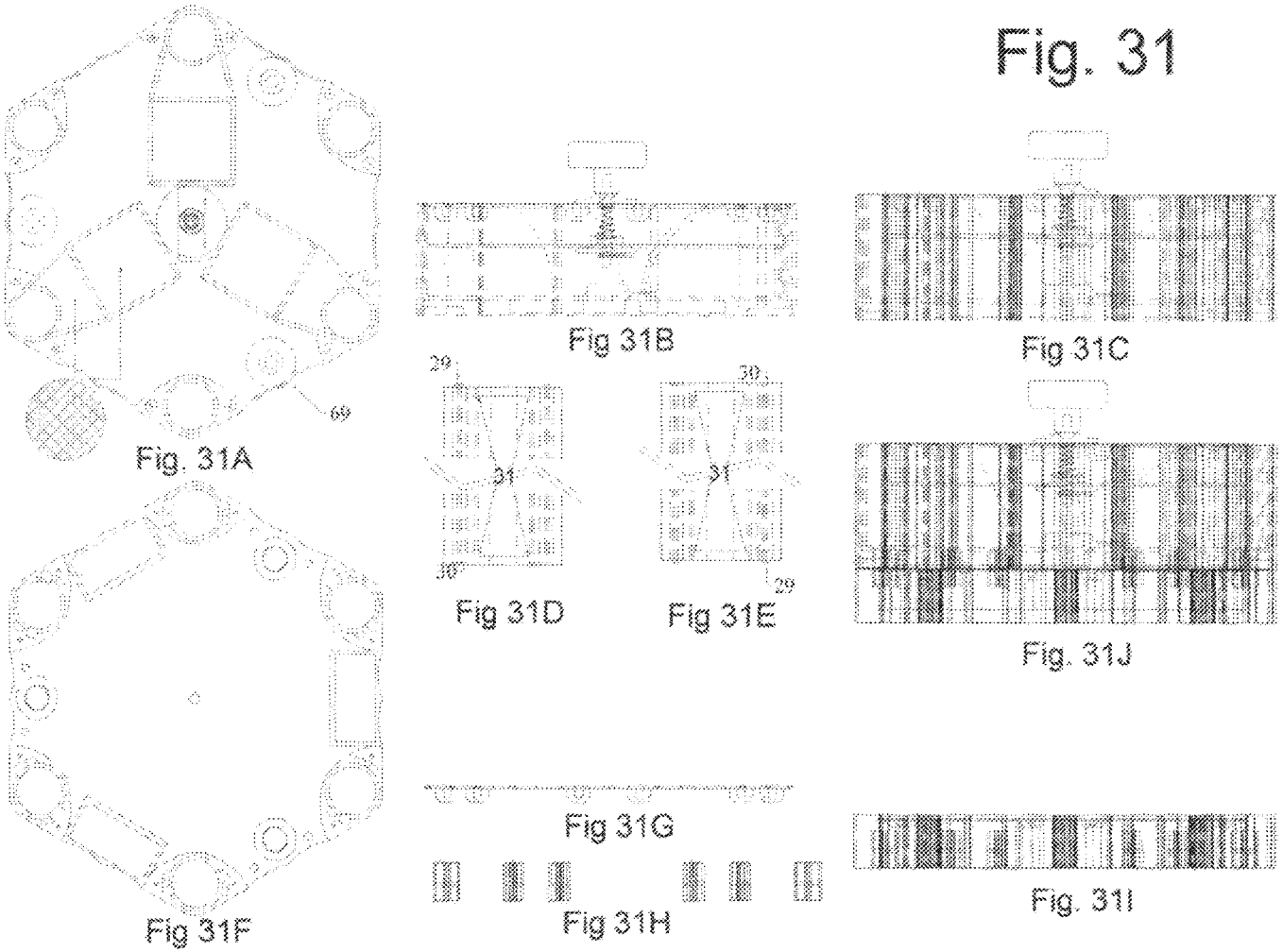
Figures 32, 32A, 32B, 32C:
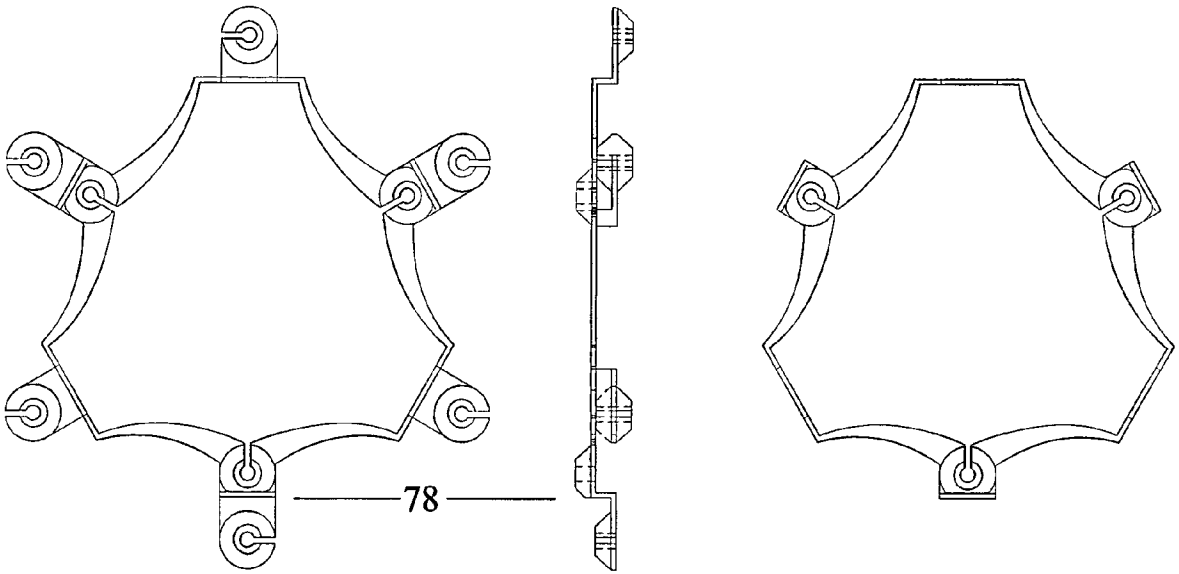
Figure 33:
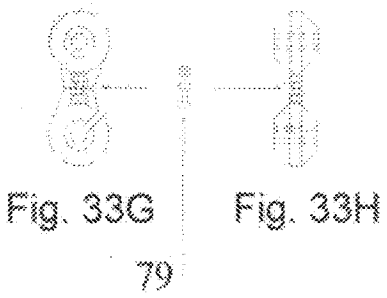
Figure 33:
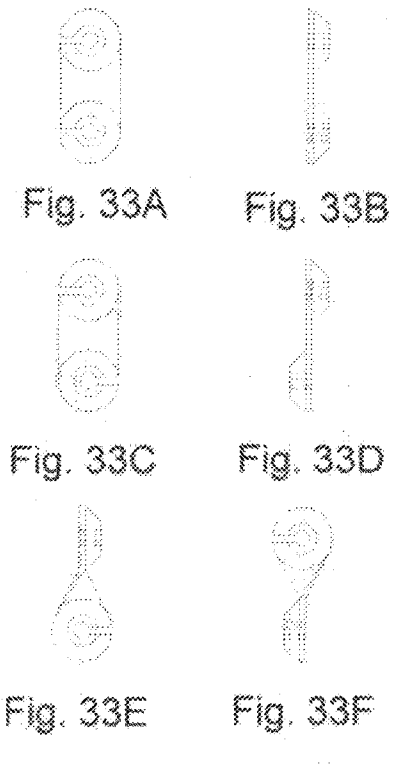
Figures 34, 34A, 34B:
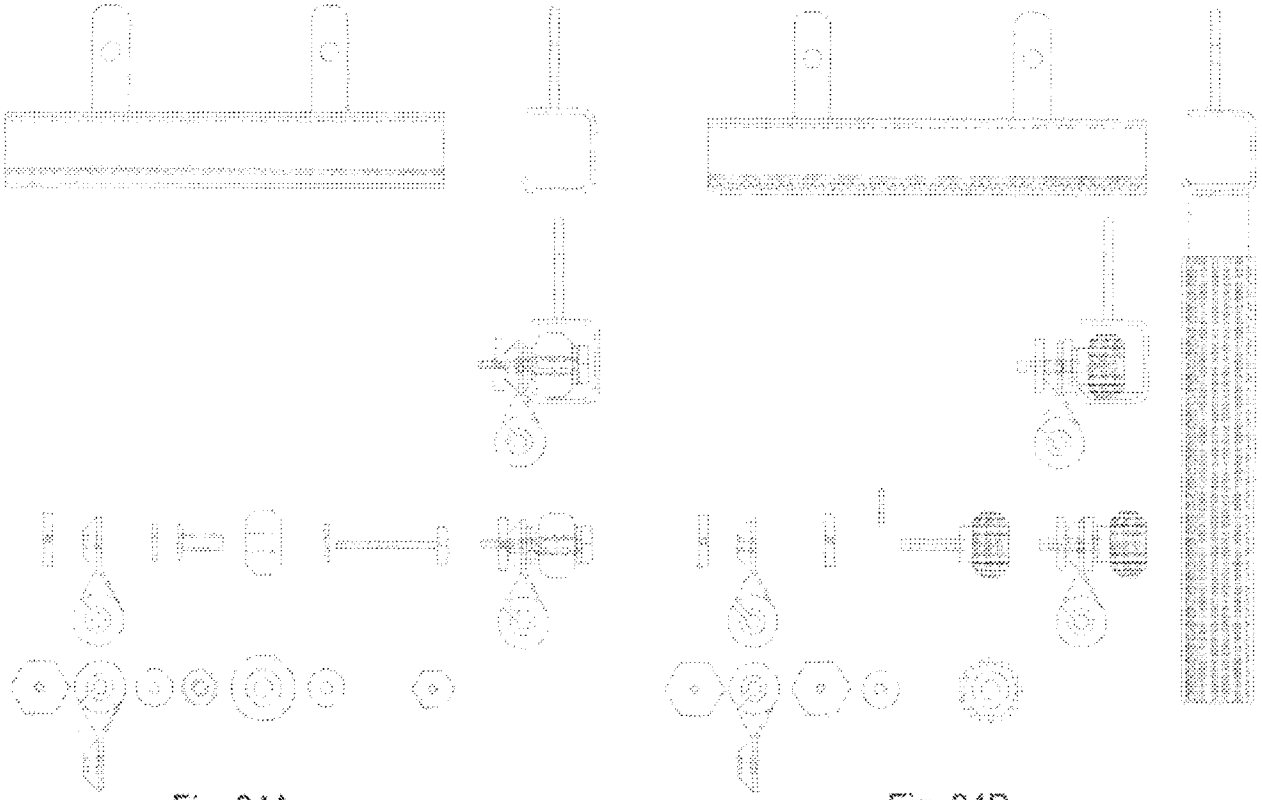
Figure 35:
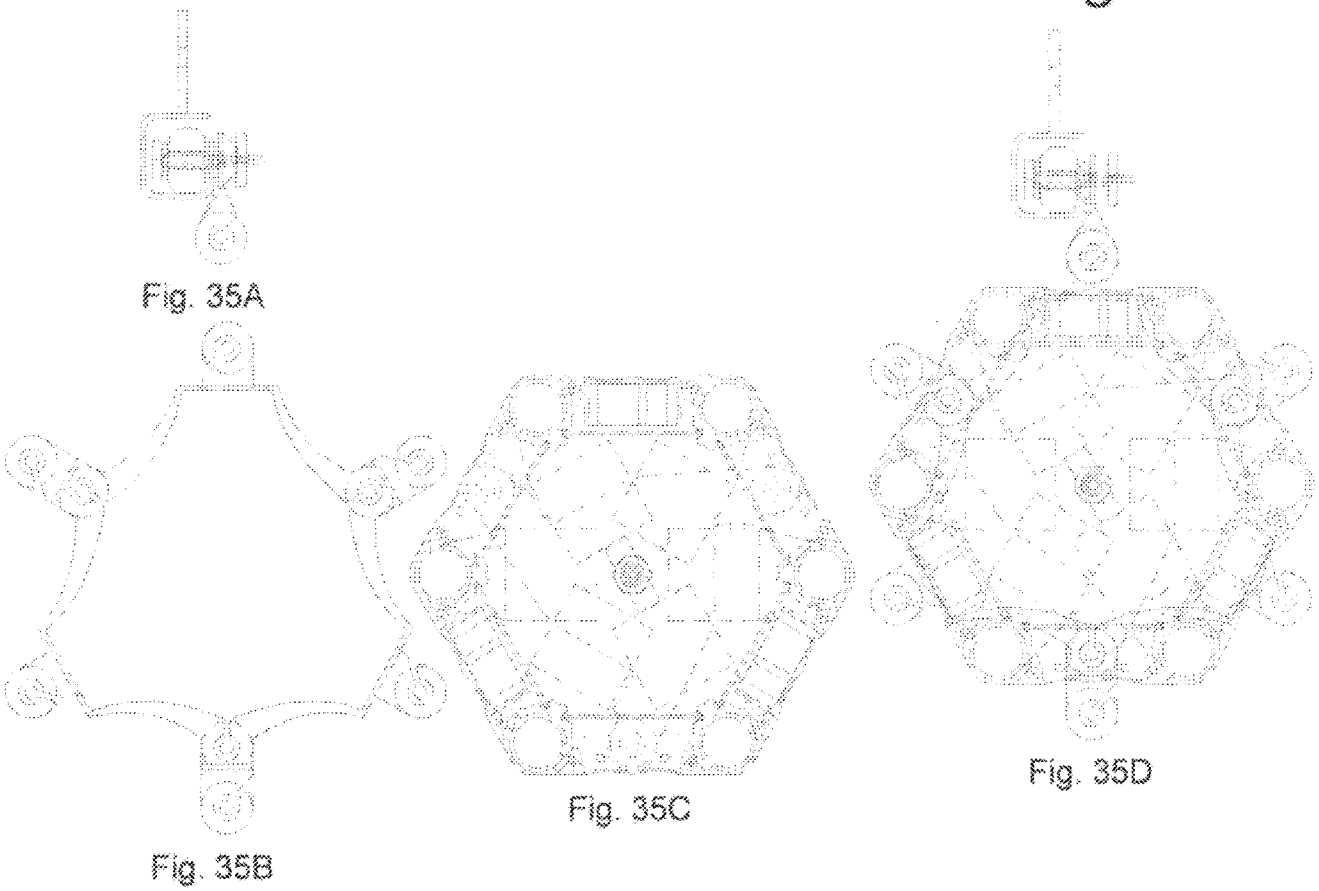
Figures 37, 37A:
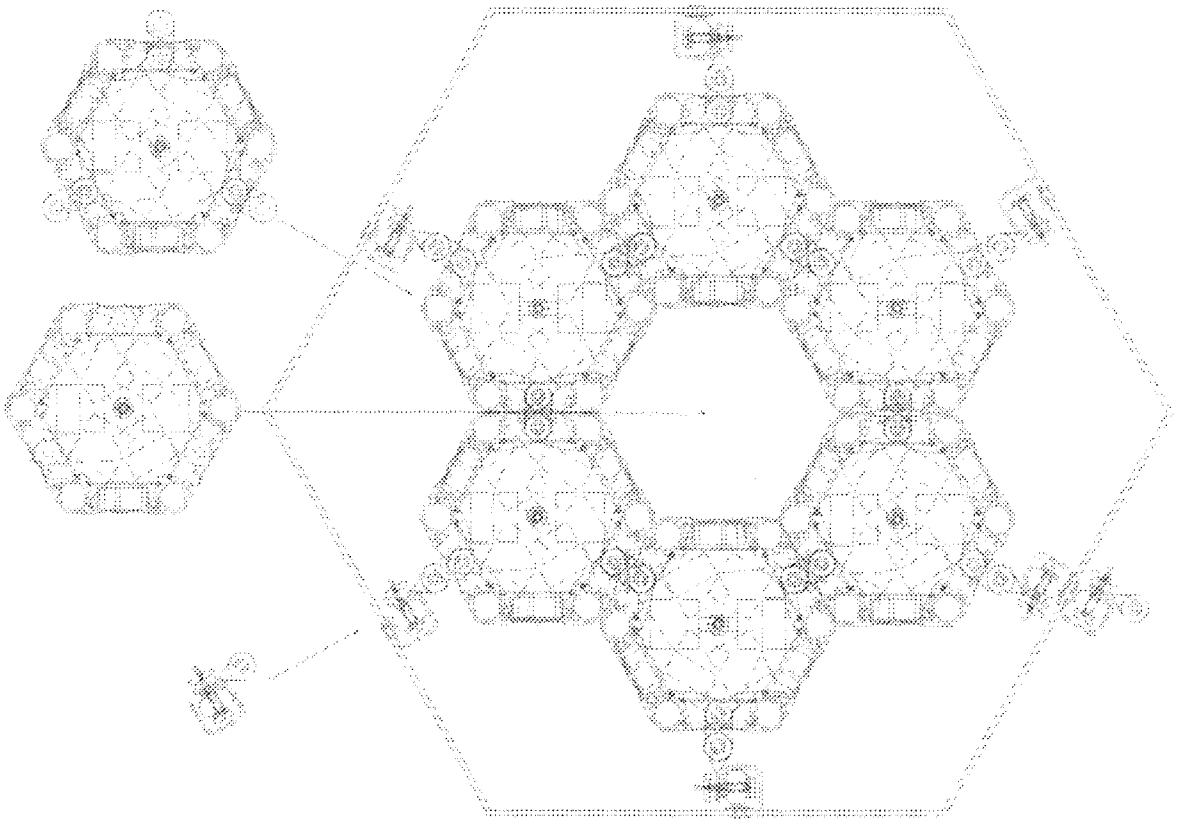
Figure 41:
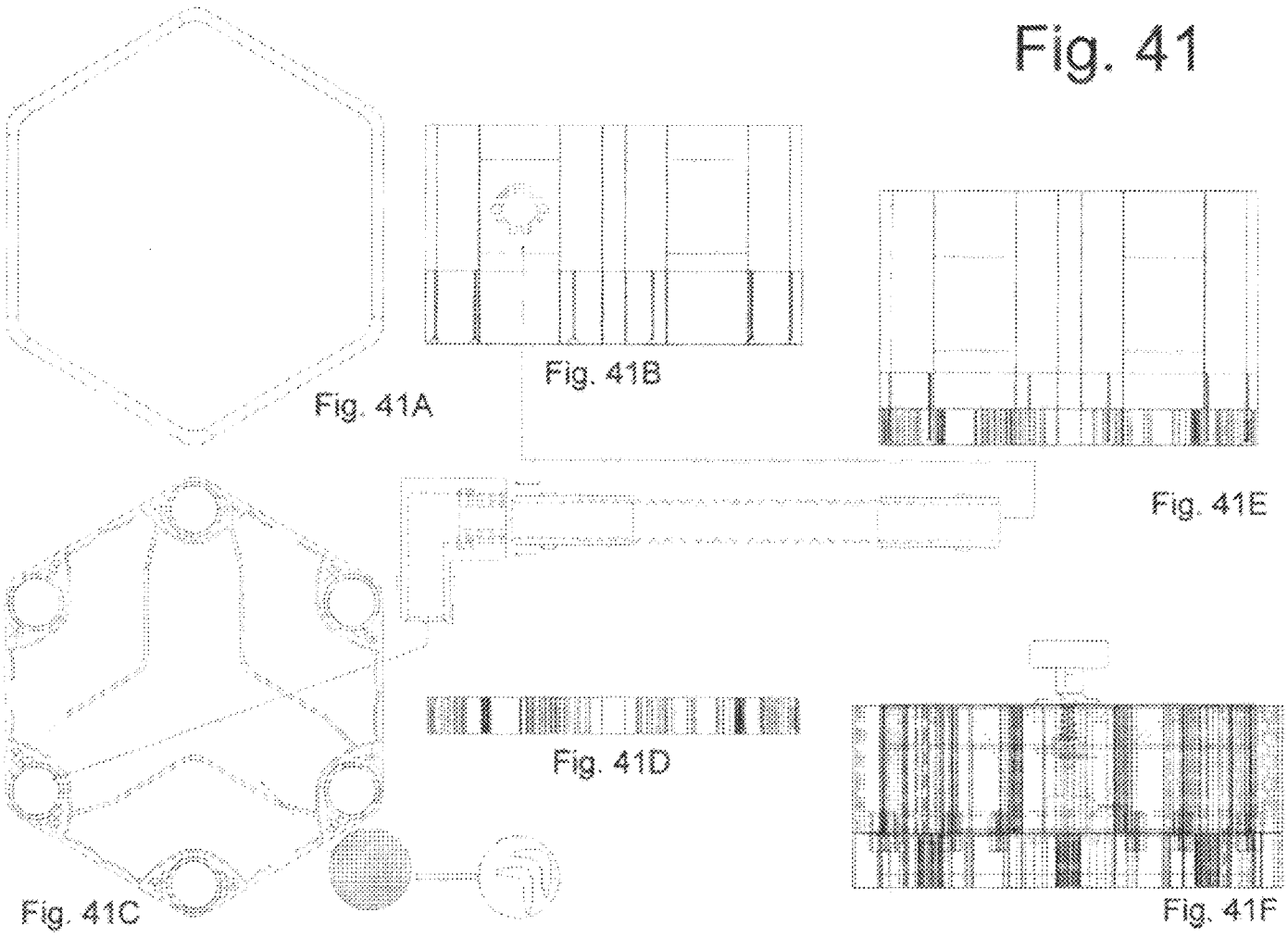
Figures 42, 42A, 42B, 42C, 42D, 42E, 42F:
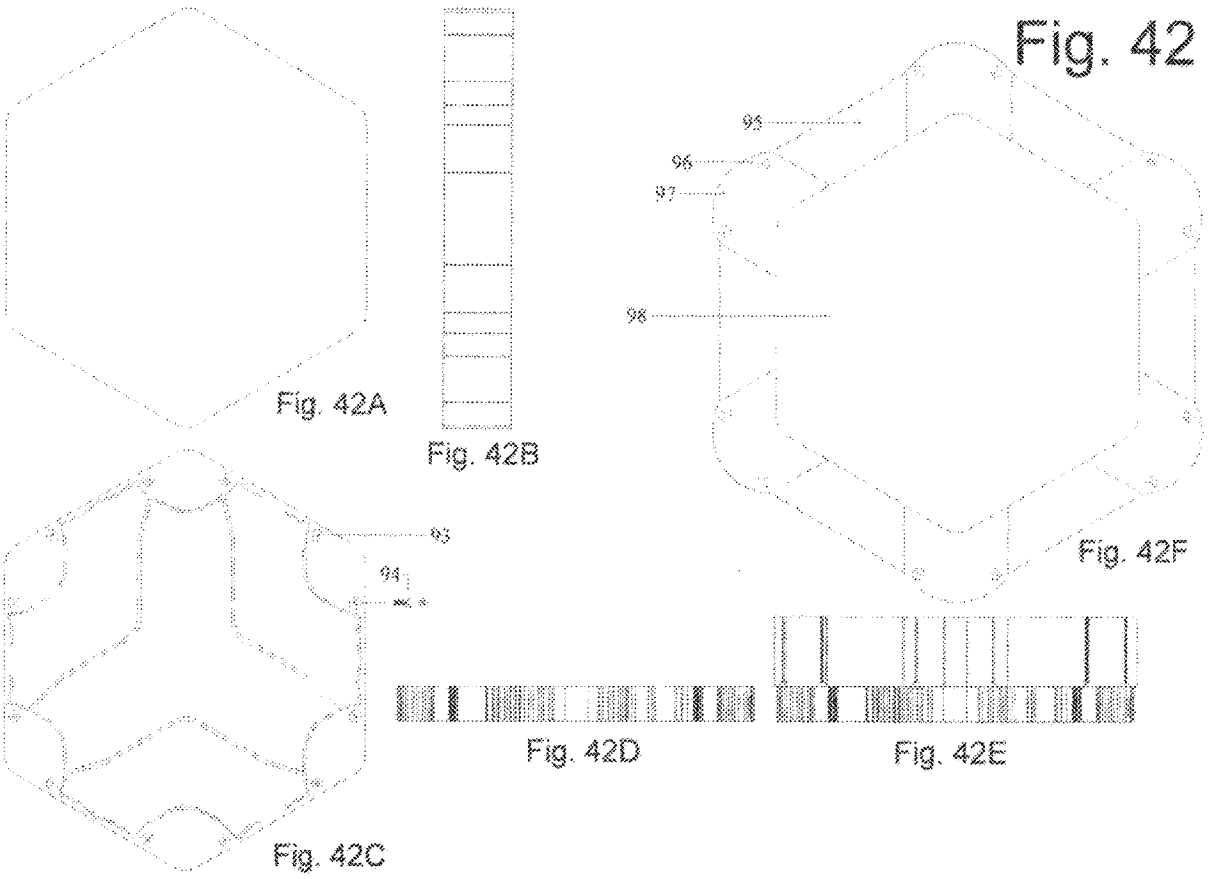
Figure 45:
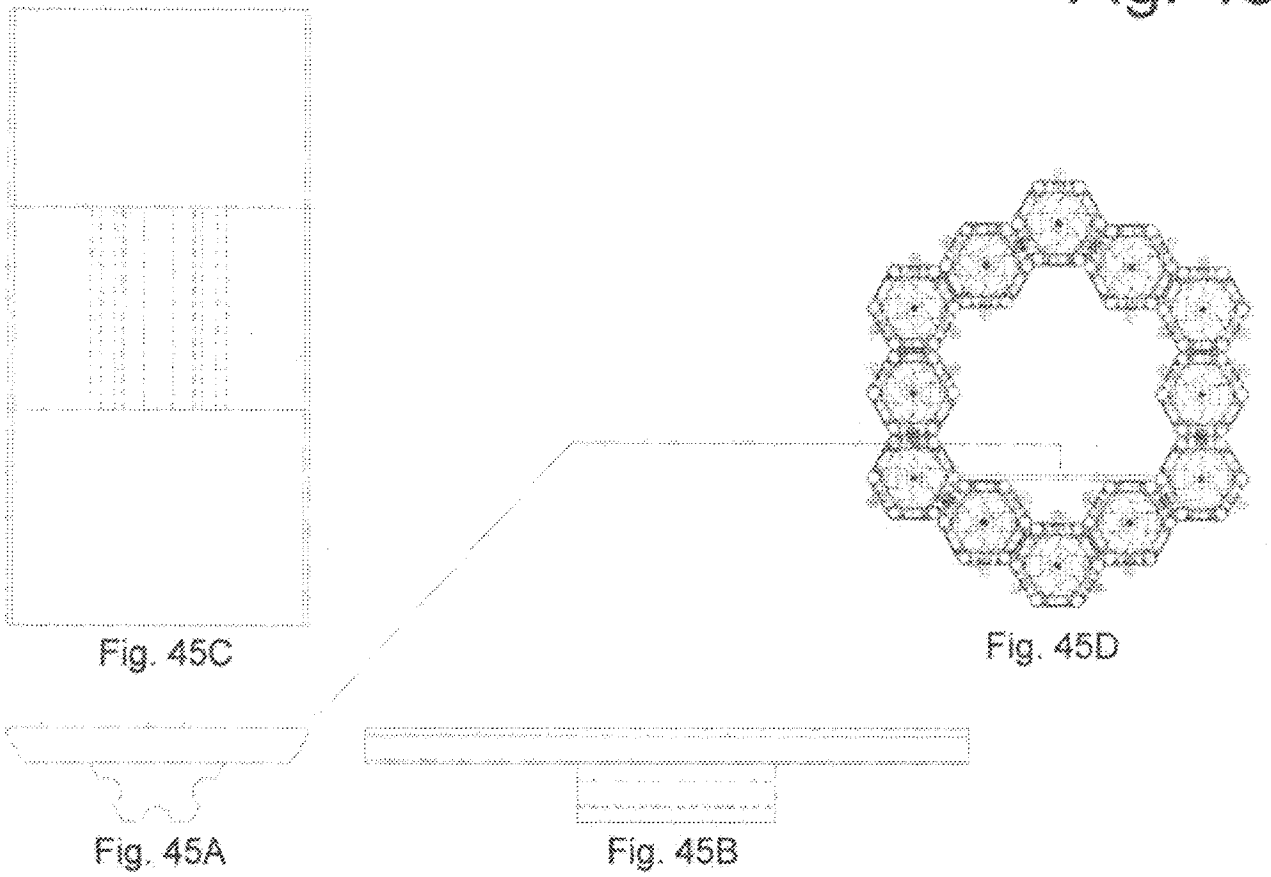
Figure 46:
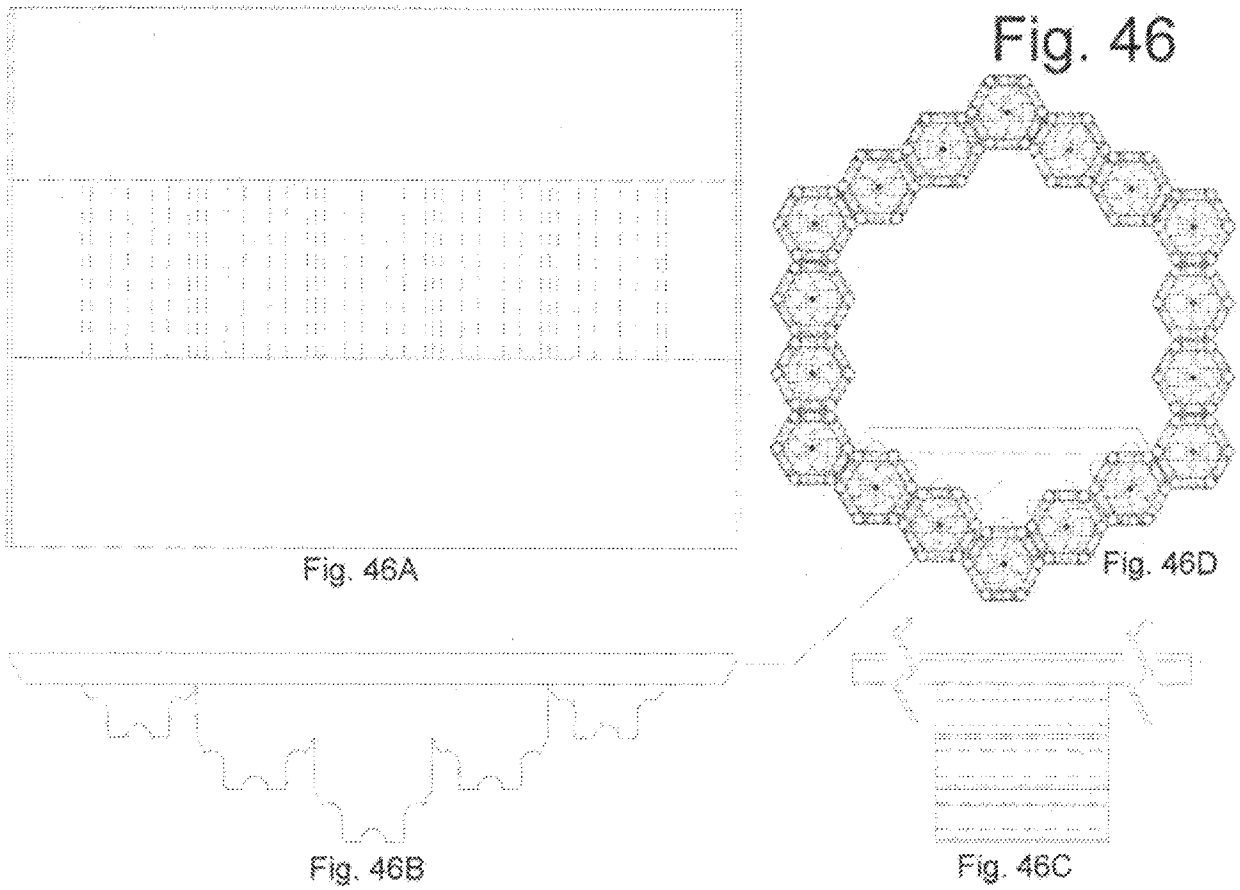
Figures 47, 47A, 47B, 47C, 47D, 47E, 47F, 47G, 47H, 47I, 47J, 47K, 47L:
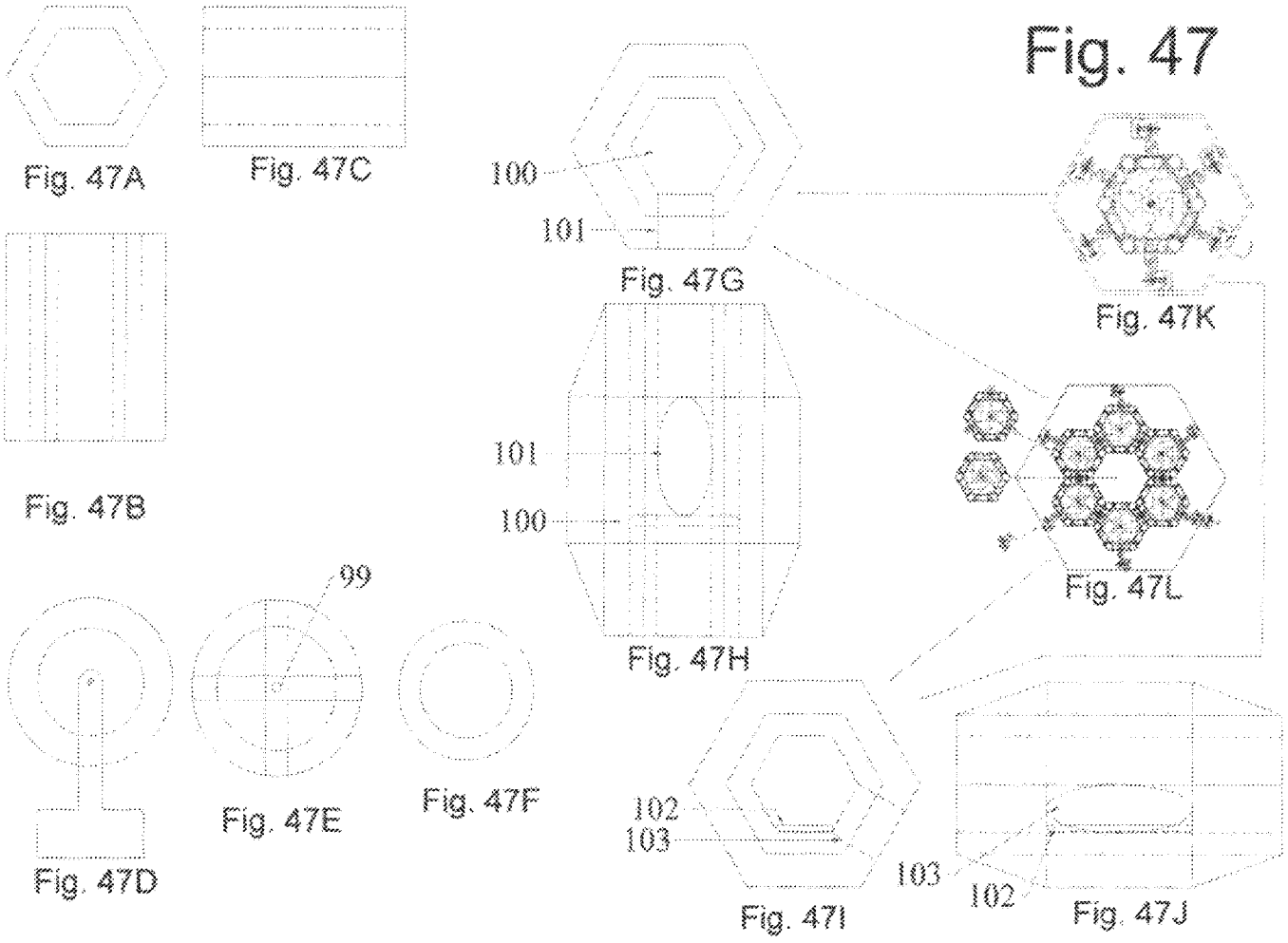

FIG. 22E. Standard Blank Bezel: Side View;

FIG. 22F. Connector Bay Bezels With/With Out Knock Outs/Plugs: Top View;

FIG. 22G. Connector Bay Bezels With/With Out Knock Outs/Plugs: Front View;

FIG. 22H. Connector Bay Bezels With/With Out Knock Outs/Plugs: Side View
FIG. 22I. Corner Gusseted Screen Fan Guard With Center Grommet For Single Fan, Side View
FIG. 22J. Top and Bottom View
FIG. 22K. Screen Fan Guard-Fan-Screen Fan Guard Sandwich Top Release Enclosure:
23. Actuator Assembly
FIG. 23A. Actuator Plate: Top View
FIG. 23B. Actuator Plate: Side View
FIG. 23C. Actuator Assembly: Side View
56. Short Actuator Rod
19. Cotter Pin
23. Actuator Plate
24. Nut
57. Short Actuator Tube
24. Nut
61. Top End Cap Wall
24. Nut
27. Handle
24. Bottom Release Enclosure: Stanchion Assembly.
FIG. 24A. Assembly
48. Crimped-On Rod End;
49. "C" Washer Seat;
50. Metal Rod;
51. Crimped-On Threaded Rod End;
52. Washer;
53. Nut;
25. Top And Bottom Release Enclosure: Cooling Tube Sleeves;
FIG. 25A. Module Top View with Cooling Tube Assembly;
FIG. 25B. Cooling Tube Orifice; Side View;
FIG. 25C. Slit Solid Cooling Tube Sleeve Outlet/Inlet;
FIG. 25D. Optional Cooling Tube Downward Facing Intake Louver Grid;
FIG. 25E. Optional Cooling Tube Upward Facing Exhaust Louver Grid;
FIG. 25F. Louvered Cooling Tube Sleeve Outlet/Inlet;
FIG. 25G. Cooling Tube Sleeve Orifice Interface
26. Top Release Enclosure: Collapsible Cooling Tube and Standoff.
FIG. 26A. Collapsible Cooling Tube
54. Female ¼ Turn Twist Lock Tubular Collar Seal;
55. Male ¼ Turn Twist Lock Tubular Collar Seal;
56. Threaded Tubular Hose Collar Seal;
57. Spring Loaded Collapsible Hose.
FIG. 26B. Cooling Tube Petcock
FIG. 26C. Cooling Tube Elbow
27. Top or Bottom End Cap Cable Hanger Assembly: For Top or Bottom Release Enclosures;
FIG. 27A. Hanger Assembly: Perspective View
58. Outer Collar
59. Pin
60. Clevis
61. Tubular Bearing Surface
62. Cotter Pin
63. Optional Load Bearing Gusset
64. Plenum Intake/Exhaust Hull
65. Inner Collar
66. Hexagon Socket Set Screw With Flat Point
67. Cable
68. Cable Termination Hook
28. Scalable Single Base: For Top or Bottom Release Enclosure
FIG. 28A. Base: Connector Bay and Wiring/Coolant Master Plenum Sub-Assembly:Top View
69. End Cap Cable Hanger Assembly
FIG. 28B. Base: Connector Bay: Side View: Internal Perspective View
FIG. 28C. Base: Connector Bay: Internal Perspective View
FIG. 28D. Base: Wiring/Coolant Master Plenum Feed Through,
29. Tabs Up
31. Orifice
30. Seats Down
FIG. 28E. Base: Wiring/Coolant Master Plenum Feed Through,
30. Tabs Down,
31. Orifice
29. Seats Up
FIG. 28F. Base: Connector Bay and Wiring/Coolant Master Plenum Sub-Assembly: Side View
FIG. 28G. Base: Connector Bay and Wiring/Coolant Master Plenum Sleeve: Side View
FIG. 28H. Base: Connector Bay and Wiring/Coolant Master Plenum Twist-Lock Assembly and Landings: Side View
FIG. 28I. Base: Connector Bay and Wiring/Coolant Master Plenum Bulk Head With Feed Thrus: Side View
FIG. 28J. Base: Connector Bay and Wiring/Coolant Master Plenum Sub-Assembly: Side View
FIG. 28K. Full Assembly: Side View
29. Exhaust Plenum Canisters for Cable gripper™ [or functional equivalent]
FIG. 29A. Threaded Petcock Design.
70. Wrench Sealing Purchase
71. Cable Feed Through;
72. Twist Lock Collar;
FIG. 29B. Internally Threaded Cap Design
70. Wrench Sealing Purchase
71. Cable Feed Through;
72. Twist Lock Collar;
30. Exhaust Plenum Actuator Assembly.
FIG. 30A. Actuator Plate and Handle: Top View
73. Exhaust Plenum Actuator Plate;
74. Cable gripper™ [or functional equivalent] Canister Twist Lock Receiver;
FIG. 30B. Actuator Plate: Side View.
73. Exhaust Plenum Actuator Plate;
FIG. 30C. Exhaust Plenum Cable gripper™ [or functionaL equivalent] Canister with Petcock;
9. Cable gripper™ [or functional equivalent].
72. Twist Lock Collar
FIG. 30D. Exhaust Plenum Cable gripper™ [or functional equivalent]™ Canister with Cap;
9. Cable gripper™ [or functional equivalent]
72. Twist Lock Collar
FIG. 30E. Assembly
75. Actuator Rod.
19. Cotter Pin.
22. Large Spring Collar.
21. Spring.
20. Small Spring Collar.
76. End Cap Wall Handle Lock Seating Divot.
77. Handle Lock Male Divot.
28. Handle.
31. Scalable Single Exhaust Plenum Cap, Wiring/Cable/Plumbing [Coolant, Gravity Feed, pumped, etc.] Connector Bay and Cable Hanger Assembly: For Top or Bottom Release Enclosure
FIG. 31A. Cap: Wiring/Coolant Master Plenum Sub-Assembly: Top View
FIG. 31B. Cap: Wiring/Coolant Master Plenum Bulk Head With Feed Throughs Installed: Internal Perspective Side View FIG. 31C. Cap: Connector Bay with Cable gripper™ [or functional equivalent] and Actuator Installed: Side View
FIG. 31D. Cap: Wiring/Coolant Master Plenum Feed Through, Tabs Up, Seats Down
FIG. 31E. Cap: Wiring/Coolant Master Plenum Feed Through,
29. Tabs Down,
31. Orifice
30. Seats Up
FIG. 31F. Cap: Connector Bay: Top View
FIG. 31G. Cap: Connector Bay Floor Wall With Wiring/Cooling Feed Throughs, Internal Perspective Side View;
FIG. 31H. Cap: Connector Bay and Wiring/Coolant Master Plenum Twist-Lock Assembly and Landings: Internal Perspective Side View
FIG. 31I. Cap: Connector Bay and Wiring/Coolant Master Plenum Twist-Lock Assembly and Landings: Side View Side View
FIG. 31J. Cap: Full Connector Bay and Wiring/Coolant Master Plenum Assembly: Side View
32. Module Hanger.
FIG. 32A. Front View.
78. Tab Break Points.
FIG. 32B. Side View.
FIG. 32C. Front View with All Tabs Broken.
33. Double Ended Hook
FIG. 33A. Single Side Protrusions, Front View.
79. Protrusion.
FIG. 33B. Single Side Protrusions, Side View.
FIG. 33C. Alternating Side Protrusions, Front View.
FIG. 33D. Alternating Side Protrusions, Side View.
FIG. 33E. 90 Degree Twist, Front View.
FIG. 33F. 90 Degree Twist, Side View.
FIG. 33G. Double Hook with Swivel, Front View
FIG. 33H. Double Hook with Swivel, Side View
34. Track Systems
FIG. 34A. Track and Roller
FIG. 34B. Rack and Internally Wound Cog Motor
35. Module with Installed Module Hanger Hanging from Roller On Sliding Track.
FIG. 35A. Sliding Track and Roller
FIG. 35B. Module Hanger
FIG. 35C. Module
FIG. 35D. Assembly
36. Single Module Framed Track Suspension System
FIG. 36A. Track and Roller
80. Fastener Hole(s)
FIG. 36B. Module Suspended in Frame by Hanger and Track and Roller System
81. Single Module Frame
82. Fastener, blind [rivet/bolt etc.]
37. Six (6) Modules Symmetrically Interconnected by Module Hangers Suspended In A Frame By Individual Module Hangers with a Central Module Insert.
FIG. 37A. Assembly
38. Nesting Modules
FIG. 38A. Module with Module Hanger
FIG. 38B. Six Modules Interconnected by Module Hangers
FIG. 38C. Module without Module Hanger
FIG. 38D. Six Modules in A Symmetrical Array Without Hangers
FIG. 38E. 12 Modules in A Symmetrical Array With Hangers
FIG. 38F. 18 Modules in A Symmetrical Array With Hangers
39. Interlocking Sextet Module Arrays
FIG. 39A. Module Hanger with Track and Roller
FIG. 39B. Module
FIG. 39C. Six Modules in A Symmetrical Array With Hangers
FIG. 39D. "Snow Flake" Array with Hangers
40. Single/Multi-Module Horizontal or Vertical Hydraulic Lift System
FIG. 40A. Hydraulic Lift System
83. Guide Rails
84. Floor Mount and Support Collar
85. Hydraulic Lift Cylinder
86. Master Plenum(s) Support Pedestal
87. Plunger
88. Controller
89. Hydraulic Fluid Tank, Pump and Valves
90. Multi-Module Frame
91. Rack with Gear Driven Stepping Motor
92. Fastener
FIG. 40B. Single Module Cog Rail System
FIG. 40C. Multiple Module Cog Rail System
41. Top End Cap Cover
FIG. 41A. Top End Cap Cover, Top View
FIG. 41B. Top End Cap Cover, Side View
FIG. 41C. Top End Cap Cover Sleeve, Bottom View
FIG. 41D. Top End Cap Cover Sleeve, Side View
FIG. 41E. Top End Cap Cover Assembly
FIG. 41F. Top End Cap Which Sleeve Slips Inside
42. Top End Cap Cover Upholstery
FIG. 42A. Top End Cap Cover, Top View
FIG. 42B. Top End Cap Cover, Side View
FIG. 42C. Top End Cap Cover Sleeve, Top View
93. Recessed Upholstery Retaining Screw Hole
94. Screw
FIG. 42D. Top End Cap Cover Sleeve, Side View
FIG. 42E. Top End Cap Cover, Side View
FIG. 42F. Upholstery
95. Elasticized Material
96. Grommet
97. Material Mounting Tab
98. Padding
43. Module Protective Side Cover with Integral Clip
FIG. 43A. Top View
FIG. 43B. End View
FIG. 43C. Side View
44. Module Protective Side Cover with Integral Clip Install Positioning
FIG. 44A. End View
FIG. 44B. Top View
FIG. 44C. Side View
FIG. 44D. Module End View
FIG. 44E. Module Side View
45. Three Module Cat Walk Bridge/Wall
FIG. 45A. End-View
FIG. 45B. Side View
FIG. 45C. Front View
FIG. 45D. Unit Installed in a 12 Module Chamber/Corridor.
46. Five Module Cat Walk Bridge/Wall
FIG. 46A. Top View
FIG. 46B. End View
FIG. 46C. Side View
FIG. 46D. Unit Installed in an 18 Module Chamber/Corridor.
47. General Inter-module Array Geometries Symbolically Represented
FIG. 47A. General Hexagonal Array
FIG. 47B. Vertical Array With/Without Hollow Inner Channel.
FIG. 47C. Horizontal Array With/Without Hollow Inner Channel.
FIG. 47D. Ferris Wheel Carousel Whereby Modules Lie Horizontally.

FIG. 47E. Hanging Vertical Carousel whereby Modules Are Suspended Vertically From Central Support, Top View 99. Central Support FIG. 47F. Torus Array As May Be Used In Space Craft Or Other Facilities.

FIG. 47G. Top View: Vertical Work Area Enclosure

100. Floor

101. Vertical Access Hatch

FIG. 47H. Side View: Vertical Work Area Enclosure

FIG. 47I. Single Module Population Option for F/G and J/K

FIG. 47J. Multi-Module Population Option for F/G and J/K

FIG. 47K. Top View: Horizontal Work Area Enclosure

102. Floor

103. Vertical Access Hatch

FIG. 47L. Side View: Vertical Work Area Enclosure

48. Table of Cooling Options.

FIG. 48A. Air

FIG. 48B. Gas

FIG. 48C. Fluid/Air Heat Xchg.

FIG. 48D. Fluid/Gas Heat Xchg

DESCRIPTION

The patent employs a unique geometry, utilizing four standard configurations

Figure 8:
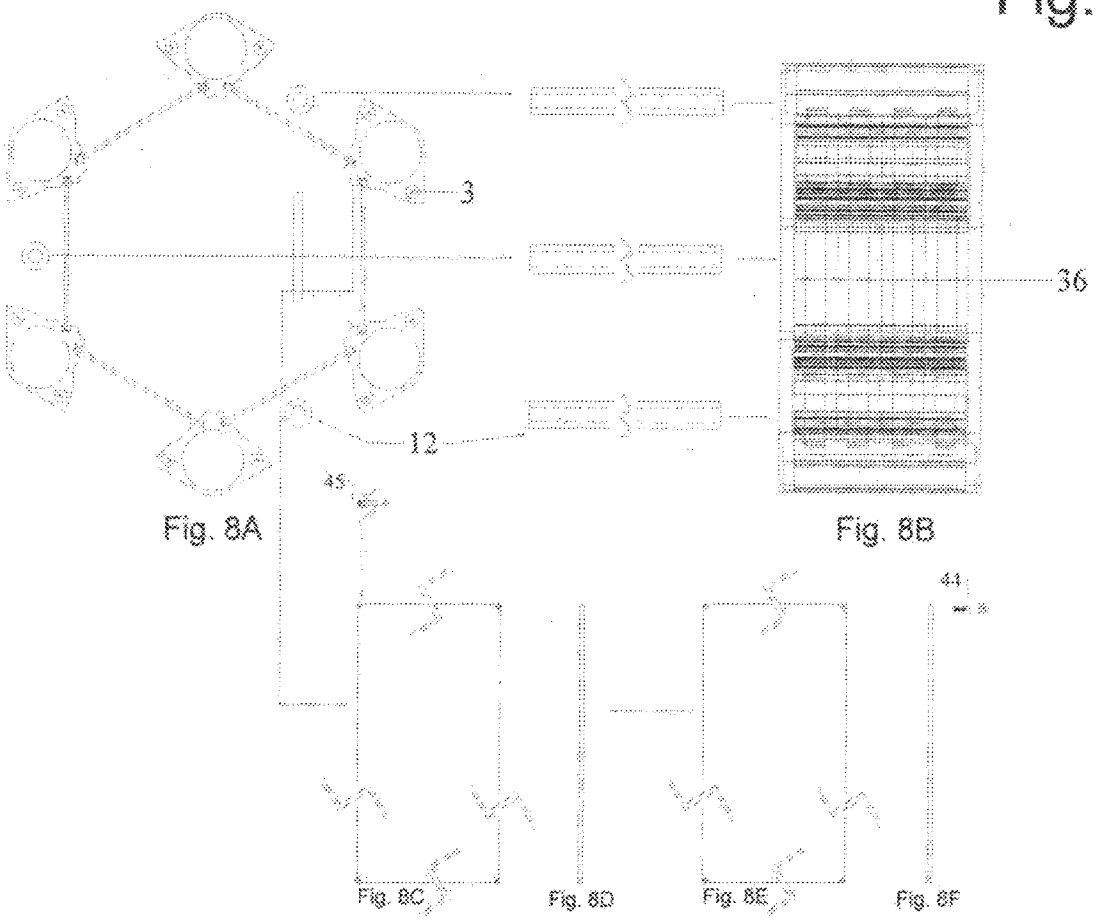
Figure 16:
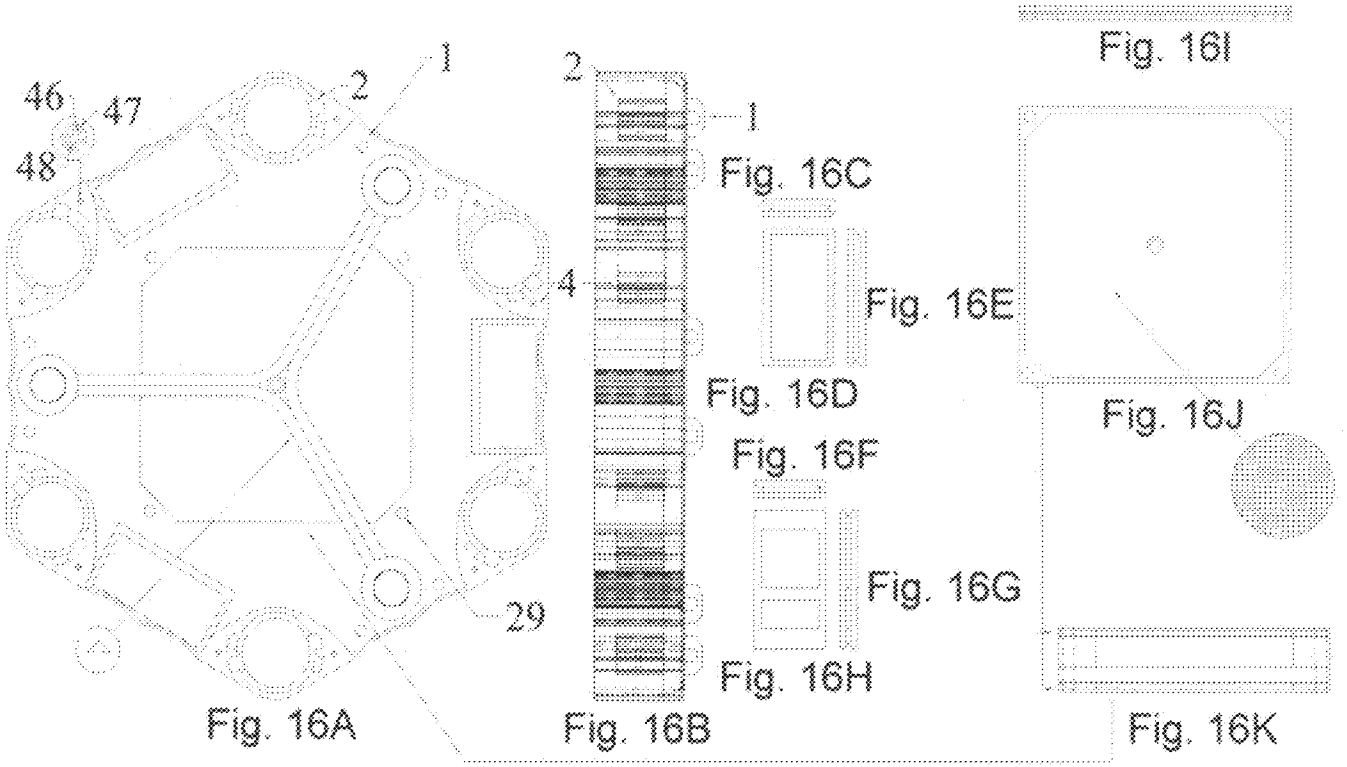

[Type 1: Dwg. 1, Type 2: Dwg. 15 Type 3: Same as Type 2 with actuator from Dwg. 30 as installed in FIG. 31B and will otherwise be considered as minor variant of Type 2 hereinafter] with attendant support accessories. A nominal fourth type supplies variants for each of types 1 through 3 by utilizing a large central orifice, as shown in FIG. 16, in the top and bottom end caps with appropriately sized fan mountings and optional fans for axial cooling, thus obviating the conventional plenums used in the standard type 1 through 3 modules, All enclosure types include provisions for optional cable assemblies and cable gripper™ [or functional equivalent(s)] [Type 1: Dwg. 3, Type 2: Dwg. 21] for vertical/horizontal positioning in their respective multi-module stacks. All types employ a handle connected to a plunger mounted in a plunger guide tube with associated bulkhead mounting hardware [Type 1: Dwg. 4, Type 2: Dwg. 23]. On the business end of the plunger is a cable gripper™ [or functional equivalent] actuator plate with sloped self-centering seats for the cable gripper™ [or functional equivalent] [Type 1: Dwg. 4 FIG. A, Type 2: Dwg. 23 FIG. A]. Return/centering springs for the plunger as necessary and plate retention nuts and/or a cotter pin keep the plate on the plunger. The two configurations are referred to hereinafter as types as follows:

Type 1 [Dwg. 1], Top handle, bottom of enclosure actuated cable gripper™ [or functional equivalent] assembly, with a central actuator rod through the main enclosure assembly and cable gripper™ [or functional equivalent] seated peripherally, centered tangentially between every other astroidal curve in the lower plenum, and threaded with cables terminated at either end with clevises and matching clevis pins or other equivalent catalog quick disconnect hardware [Dwg. 4]. Cable guide tubes [Dwg. 8 part 12] run the length FIG. 8B width of part 36. of the bezeled [Type 1: FIG. 8A part 12] and/or non-bezeled enclosure, FIG. 18B width of part 36, main cavity outer hull [Dwg. 18A part 12] nesting between the normally bottom intake plenum [Dwg. 5] and normally top exhaust plenum [Type 1: Dwg. 10]. The guide tubes accommodate the width of this quick disconnect hardware their full length, without snagging. Cable gripper™ [or functional equivalent] in this type are placed in the bottom plenum. The Type 1 design is for PC boards and other assemblies smaller than the ATX form factor, although scaling is possible.

Type 2 [Dwg. 15], Top handle, top of enclosure actuated [FIG. 15C] cable gripper™ [or functional equivalent] assembly [Dwg. 21] with central actuator assembly [Dwg. 23 FIG. C] seated in the top end cap, extending into the main chamber where the plunger actuator plate resides. Material choices include reinforced wire, fiberglass, carbon composite, etc. for strength and wide screen mesh as necessary for airflow. The cable gripper™ [or functional equivalent] are seated peripherally, in the exhaust plenum to the right of each duct at 120 degrees [example of hexagonal, one configuration] one to the other, centered almost tangentially to the nearest outer wall between the cooling tube housings seated behind each chamfered astroidal apex of the outer hull in the upper plenum [Dwg. 20] and threaded with cables terminated at either end with clevises and matching clevis pins or equivalent quick disconnect hardware [Dwg. 21]. Three cable guide tubes [Dwg. 25] [hexagonal example] run the length of the non-bezeled enclosure central cavity [FIG. 18A part 12 for the width of FIG. 18B] between the bottom intake plenum [Dwg.17] and top exhaust plenum [Dwg. 20] up to the actuator plate on the bottom side and down to the top cable gripper™ [or functional equivalent] seats. These tubes accommodate the width of this quick disconnect hardware for their full length without snagging. This design is for ATX PC boards or larger assemblies, requiring a larger open cavity, however, again the design is scalable. All types, top, bottom and main cavity cable gripper assemblies include an actuator plate, plunger, and handle assembly with optional twist handle lock and release, tensioning springs, cable guide tubes.

Each type includes the following key features as follows:

1. A dumb bell shape described by standard Cartesian coordinates presented in a singular plane [Type 1: Dwg.1, Type 2: Dwg. 15].

2. In standard operating mode, the dumb-bell is stood on end. This is done as the unit is based on heat flow and heat rises, however the unit may be inverted or laid on its side for good reason, pending operational environment or customer request. Examples include a torpedo or a missile.

3. The top of the unit is identified by a handle, centered and recessed into the top end cap [Type 1 enclosure: FIGS. 1A & B, Type 2 enclosure: FIGS. 15A & B], allowing easy determination of the top of the unit.

4. A Z-axis cross-sectional plane intersecting the dumb-bell's x-y plane at 90 degrees scribes a six-sided asteroid with rounded convex apices. Alternative embodiments for triangles squares and octagons are possible [Dwgs. 1D, 1F, 1G and 11]. Alternate symbolic geometric configurations are possible [Dwgs. 1E and 1I].

5. Twin equal length and radius external concave scallops, frame the top and bottom of the bezeled and/or non-bezeled main cavity's external faces, beginning at the abutting main cavity/plenum(s) interface(s) and extending the full height of the external faces off the wider dumbbell protrusions at both ends of the module [Type 1: Bottom Dwgs. 2, 5; Top Dwgs. 10, 11; Type 2: Bottom Dwgs. 16, 17; Top Dwgs. 20, 22].

6. The outer six chamfered apices of the dumbbell are referred to as uprights. There is one upright for each apice of a geometrical figure. These uprights are conformal to the coolant tube hose housings, which make up the outer hull vertical faces in sequentially stacked fashion with appropriate mechanical or chemical seals. Coolant hose tube housings run the full length of the assembly, comprised sequentially, of those components which make out the outer hull vertical faces, in stacked fashion as apparent in all hull segments contributing to the making up of the fore-mentioned housings and the attendant conjoined module outer hull walls as shown in [Type 1: Dwgs. 1,3,5,6,7, 8, 9,10 and 11, Type 2: Dwgs. 15, 16, 17, 18, 19, 20, and 22]. As illustrated, these outer hulls, show the relative recesses, of those sidewall hull segments which may or may not be bezeled and/or otherwise recessed to form the smooth transitions to the dual inter-external corner scallops, mentioned above, which make up the external inter-module wiring guides in relation to the dumbbell ends.

7. In the preferred embodiment, six (6) such cooling tube assemblies per module are possible whereby three cooling tubes are utilized for cooling media input and three for exhaust respectively. If the number of apices should be odd, the center cavity may be used for coolant input or exhaust while peripheral cooling tubes are engaged to balance coolant flow is required [Dwg. 25] or standard cooling tube hose arrangement. In an alternate preferred embodiment, within each module, cooling tube housing plenum interface orifices attach to bottom intake plenums and top exhaust plenums every 60 degrees alternately. [Type 1: Bottom FIG. 5B part 32, Top FIG. 10B part 32]; Type 2: Bottom FIG. 17B part 32, FIG. 20B part 32].

8. For smaller and/or larger installations, glue, chemical coatings and/or mechanical fasteners, o-rings, seals, banding and/or tape, extending fully around segmented model subassemblies to perfect the necessary seals, as stampings, weldings and/or castings, in combined and/or further divided subassemblies. Any other standard mechanical means or combination thereof as used in industry to perfect a seal pending the permanency required for cooling tube assemblies on modules on the periphery of an array are within the scope and spirit of alternate embodiments envisioned here. [Type 1 enclosure: Dwg. 1 Type 2 enclosure: FIG. 15]9. Built in to the bottom and top connector bay cover end cap coolant hose tube housings are mating quarter turn twist lock quick disconnect seals or similar functioning hardware [Type 1: Bottom Dwg. 2A part 2, Top Dwg. 11 part 2; Type 2: Bottom Dwg. 16 part 2, Top Dwg. 22 part 2]. An obvious variant would be to place said twist lock seal adjacent to the respective plenum orifices pending economic order quantity and resultant preferred molding segmentation. The preferred embodiment, places the twist lock seats in the respective intake or exhaust plenums above and below the inter-plenum/cooling tube housing assembly port. Therefore it is assumed that pursuant to Dwgs. 1 and 15 all possible segmentation molding combinations are inherent in the design as preferred embodiments.

10. The collapsible hose employs an internal automatic retracting spring to assist maintaining retracted and expanded overall hose length, as well as actual internal and external working dimensions, and hence hose to tube housing sidewall clearance. The spring in the hose is shown in the drawings as the collapsible hose line edge. The retracting coolant hose is terminated at both ends by a tapered collar with quarter turn twist lock matched to the seal seats of the coolant hose tube housing. The tapered collars are internally threaded to match the coolant hose, with room for sealant. [Ref. Type 1: Dwg. 14A and Type 2: Dwg. 26A]. Petcocks [Type 1: FIG. 14B, Type 2: 26B] and elbows [Type 1: FIG. 14C, Type 2: 26C] are used in conjunction with the hoses as described to place and direct coolant as required.

11. The cooling tube's hose collars. [Type I: Dwg. 14 part 54 and Type 2: Dwg. 26 part 54] fit within the cooling tube housing subassemblies side-walls seating in matching female seats [Type I: Bottom Dwg. 2 part 2, Top Dwg. 11 part 2; Type 2: Bottom Dwg. 16 part 2, Top Dwg. 22 part 2].

12. All components comprising the vertical uprights are expected to interface vertically with the cooling tube segments and must be able to properly mate to these male and female surfaces respectively. Accordingly tabs and seats appear as features 30 and 31 on either side of the cooling tube housings, in side views for plenum orifices, and in top views for other components. [Type I Dwgs. Top View: 1, 2, 5, 6, 7, 8 9, 10, 11 and Side View Dwgs. 5B, 6B; Type 2 Dwgs. Top View: 15, 16, 17, 18,19, 20, 22 and Side View Dwgs. 17B, 20B] This is universal to both Type 1 and Type 2 enclosure module segments On either side of the cooling tube housings.

13. Per Dwg. 25, optionally, cooling tube assemblies may be sleeved with a rotating tubes with intake orifices on one side and cut louvers on the other for use with cooling chimneys and air sources as seen in Dwg. 39, where the missing modules in the arrays are the sources or chimneys for intake and/or exhaust as required with changeable airflow and angle.

14. Centered on the forementioned tabs and seats labeled 30 and 31 above, integral to the uprights, are holes, hereinafter stanchion guides, which are found in vertical alignment through every vertical component making up the uprights of the enclosure bulkhead. Through these we place stiff rods hereinafter called stanchions [Type 1 Dwg. 12; Type 2, Dwg. 24] threaded on one end with a matching bolt and a crimp on hex-head on the opposite end. These stanchions hold the uprights and hence the enclosure bulkheads together as opposed to glue or when full disassembly as required.

15. The heart of the system is the central cavity, defined by outlying uprights with external symmetrical grooves, which in pairs form keyways to vertically frame and hence laterally position abutting bezels and pc board(s) or other backing [Type 1: Dwgs 7 and 8] or connection points for molded surfaces [Type 2: Dwg. 18]. Type 2 is affixed to the back of the bulkhead walls between the uprights. [Type 1: FIG. 8C and D and pc bd. to [Type 1: FIGS. 8E-F.; Type: 2 FIGS. 18E-F] Uprights are used in pairs as frames for bezels as a preferred embodiment of the enclosure main cavity bulkhead for the internal hexagonal wire ground chassis referenced below as a standard mounting platform for interconnecting devices of similar or dissimilar nature [Type 1 enclosure, 7A-E, 8A-B and 9A-G]. However non-standard mounting may always be used. For this reason, the sidewalls of the main cavity may be molded as a singular piece with no bezels [Type 2 enclosure, FIG. 18] as a second preferred embodiment. Obviously, bezel vs. non-bezel configurations are not mutually exclusive and combinations thereof are normal practice.

16. Bezels are used to mount interfaces for many types of device including process control, instrumentation, routing and computing. Technologies include but are not limited to manufacturing techniques, such as: analog (examples include hydraulic, pneumatic and relay systems), digital (examples include CMOS, TTL, ECL, GAs and fiber optic), quantum and or any other technologies either known, contemplated, to be contemplated or to be developed in the future. This is possible, as manufacturers have to use hardware template mounting patterns including screws, bolts or other hardware, chemicals, glues, sealants or magnetics to accomplish mounting. Therefore by employing bezels, the device to be mounted is independent of the structure contemplated here, of course with the exception of the bezel itself and any associated mounting plates. Further, bezels may be standardized by size, types of connection, purpose, load, etc. thus making this design universal by virtue of technology independence. Multiple styles of interconnect may be employed in a single bezel. This may include cut outs, recesses, retractors or cavities for built in cable, wire, pneumatic, fluid, cooling or other interconnect devices, etc. [Type 1 Dwg. 7] with or without matching keys and keyways.

17. Each radially disposed upright has an inward facing symmetrical depression facing the geometric center of the inner cavity tangential to the external facing coolant hose tube housings, which acts as the carrier for a triangular, rectangular or hexagonal card cage chassis. [Type 1: Dwg. 8; Type 2: Dwg. 18]. Stampings may be used as necessary for consolidated standardized cage forms.

18. In its simplest embodiment the card cage is made up of a number of independent wire rectangles, six is shown in the example here [Type 1 enclosure: FIG. 9A-G and K, Type 2 enclosure: FIG. 19A-G and K]. Other embodiments use the independent wire rectangle segments connected so as to form oblong triangular prismatic frames [Type 1: FIG. 9I, Type 2: FIG. 19I], oblong box shapes, [Type 1: FIG. 9J, Type 2: FIG. 19J], a single plane across the maximum box cavity width from carrier recess to carrier recess [Type 1: FIG. 9H, Type 2: FIG. 19H] or multiple frames may be utilized as two separate frames with or without chassis to create a V shape between corresponding hexagonal apices of the card carrier.

19. Each rectangle has a triangular gusset in each corner. Each gusset has a mounting hole for pc boards, stand offs, rails, straps [Type 1 enclosure: FIG. 9C, Type 2 enclosure: FIG. 19C] or other pre-existent mounting hardware. At the ends of one long side of each rectangle are circular pins [Type 1 enclosure: FIG. 9C part 38, Type 2 enclosure: FIG. 19C part 38]. As shown, these pins are sufficient length to provide a non-interference fit for the type 2 actuator plate. On the ends of the opposite long side of each rectangle are the receiving mating surfaces for said pins [Type 1 enclosure: FIG. 9C part 39, Type 2 enclosure: FIG. 19C part 39] and a tab limiting the inward travel of the hinge to 45°, 60°, 90°, 120° and other angles as required. [Type 1 enclosure: FIG. 9B part 37, Type 2 enclosure: FIG. 19B part 37]. Rectangular segments conjoined by said hinge form the requisite shapes when properly assembled.

20. When withdrawn from the main cavity and one apex has it's hinge disconnected, provided no hardware has been mounted across multiple rectangular segments—the cage may be opened up flat for work.

21. Further a slider bracket [Type 1 enclosure: FIG. 9E, Type 2 enclosure: FIG. 19E] is displayed for mounting odd length devices, rails or pc boards with twin channels [Type 1 enclosure: FIG. 9D part 41, Type 2 enclosure: 19D part 41] and setscrews [Type 1 enclosure: FIG. 9E part 42, Type 2 enclosure: FIG. 19E part 42] for mounting more rectangles simultaneously. Triangular gussets are used in the corners to support the channels with mounting holes. A chassis backing plate/tray/pc board [Type 1 enclosure: FIG. 9F-G, Type 2 enclosure: FIG. 19F-G] is used to upgrade support and otherwise strengthen chassis pc board and other component mounting systems. [Type 1 enclosure: FIG. 9H, Type 2 enclosure: FIG. 22H]. Catalog standard catalog hardware standoffs including pineapple, bayonet style or other standoffs are used to level the fastening surface alignment of pc boards or other devices, which need to be mounted across multiple non-planar card cage/chassis mounting surfaces [Type 1: FIG. 9F-G part 45, Type 2 enclosure: FIG. 19F-G part 45] to [Type 1: FIGS. 9C-E, Type 2: FIGS. 19C-E].

22. The overall broader width end cross-sections correspond to the dumb-bell ends. Dumb-bell ends are, proceeding outwardly from the main chamber both up and down, comprised in order, plenums with their associated ducts [Type 1: Bottom Dwg. 5, Top Dwg. 10; Type 2: Bottom Dwg. 17, Top Dwg. 20] and end caps [Type 1: Bottom Dwg. 2, Top Dwg. 11; Type 2: Bottom Dwg. 16, Top Dwg. 22]. They connect to uprights and their associated cooling tube segments. As indicated earlier, as heat rises, ordered dumb-bell components below the main cavity are normally for coolant intake and those above, are for coolant exhaust.

23. Each plenum has three conduits/ducts, hereinafter ducts, radially disposed horizontally at 120 degrees. [Type 1 enclosure: FIGS. 5A and 11A, Type 2 enclosure: FIGS. 18A and 24A]. If sleeved these correspond to external intake and exhaust stacks. [Dwg. 25, 39].

24. From a top view, intake and exhaust plenums and their associated duct sets are offset, one to the other, at 60 degrees, making alternate cooling tubes, intake and exhaust respectively. [Type 1 enclosure: FIG. 1A, Type 2 enclosure: FIG. 16A]

25. Each plenum duct translates minimally 90 degrees from the main enclosure chamber axis to the uprights and cooling tubes [Type 1 enclosure: FIGS. 5B and 11B, Type 2 enclosure: FIGS. 18B and 24B], top and bottom, each, respectively.

26. Said plenum ducts, although normally uniform to each other may vary in height and width, due to space requirements vs. area heat loads and boundary-layer laminar surface flow resistance. The former is handled by raising thermal transfer effectiveness by increasing heat transfer surface area, cooling media conductivity and hence capacity (heat pipes, Peltier devices, etc.) and flow as necessary. Reducing sharp duct angles (above 90 degrees) and otherwise smoothing the duct surface handle the later. Both are subject to the obvious tailoring of flow patterns (baffles, louvers, etc.) and may require more space, which translates into increased height or width of the duct-work and the corresponding enclosure dimensions. All of which are considered obvious alternatives.

27. Each plenum opens axially to the main enclosure internal cavity through the fan mounts and exhaust is connected to the cooling tube housings through their respective plenum duct orifice interfaces. [Type 1: Bottom FIG. 5B part 32, Top FIG. 10B part 32]; Type 2: Bottom FIG. 17B part 32, FIG. 20B part 32].

28. Fans are screwed in place on main cavity plenum duct interface orifices using feature 29 as illustrated, four per orifice as follows: [Type 1: Bottom Dwg. 5, part 29, Top Dwg. 10, part 29; Type 2: Bottom Dwg. 17, part 29, Top Dwg. 20, part 29]. Each plenum may accommodate up to three fans, pending redundancy and vibration requirements, as such various capacity fans/pumps are interchangeable and individual ducts may obviously be sealed. The embodiments of the drawings, as presented are symbolic of the greater diversity of fans and mounting systems, which may be employed, and thus covered by this document. Fan vibration is limited by utilizing fan mounts, comprising neoprene pads, coating(s) or other vibration reducing material(s), brackets or proprietary technologies as necessary. Fan duct seals may be further perfected utilizing post and cotter pin arrangements, clips, spacers, other hardware and chemicals including adhesives. These are obvious alternative embodiments within the scope of this document.

29. When a cooling tube housing plenum duct is not utilized, blank plugs may be placed in a fan seat to block the inter-plenum orifice and thus perfect the cooling tube assembly seal [Type 1: Dwgs 5 and 10 Figs. D-F; Type 2: Dwgs 17 and 20 Figs. D-F].

30. Alternate embodiments involve modification or removal of plenums or removal of either the top or bottom plenums.

31. Full plenum removal utilizes the main chamber as both intake and/exhaust ports and may or may not be used in combination with the peripheral cooling tube assemblies. In this instance the end cap bezel mounts in the interior horizontal floor in standard position, of the Connector Bay End Cap and Connector Bay Top Cover End Cap, whose bulkhead adjoining the main cavity is shown optionally for this purpose as including a fan grill of reinforced structural wide mesh screen to allow airflow and rigidity of the assembly and fan mounting holes [FIGS. 16 and 22 part 29 each] for a single through cavity fan [FIG. 16]. This variant may be used on both top [FIG. 16I-J] and bottom end caps [FIG. 20 I-J] optionally whereby fans are mounted within the main cavity with adequate allowance made for standing off the card cage. A second fan grille as described in one or both of FIGS. 16I-K and 22I-K may be employed to protect debris from falling into the fan from the card cage of the main cavity and the end cap basket and basket cover, thus sandwiching the singular fans and thus is a obvious alternate embodiment.

32. In instances where cooling is provided by combinations of gases and fluid or just fluids, plenums and/or just end caps respectively may be retained, whereby screws, clips, spacers or other hardware are used with straps, heat shrink tubing, cable ties, feed-throughs, grommets, strain reliefs and other hardware to positively locate tubing, piping and/or hose within the enclosure.

1. If convection is a viable cooling alternative, then a higher slope ducted plenum with no fans is the preferred embodiment.
2. Other alternative cooling solutions are found in FIG. 48A-D, Table 1.
3. When dealing with multiple modules, all modules placed in vertical alignment, with interconnecting cooling tube assemblies and their associated cooling tubes are referred to as a stack. In the preferred embodiment, all cooling tube housings on a particular cooling tube stack apex are exclusively either intake or exhaust. Accordingly, opposing dumb bell ends' apices form exclusively either entry and exit orifices [Type 1: Dwg. 5 part 32, Dwg. 10, part 32; Type 2: Dwg. 17 part 32, Dwg. 20, part 32] to the plenum for same air/gas/fluid duct/conduit, referred to hereinafter as a duct.

Figure 22:
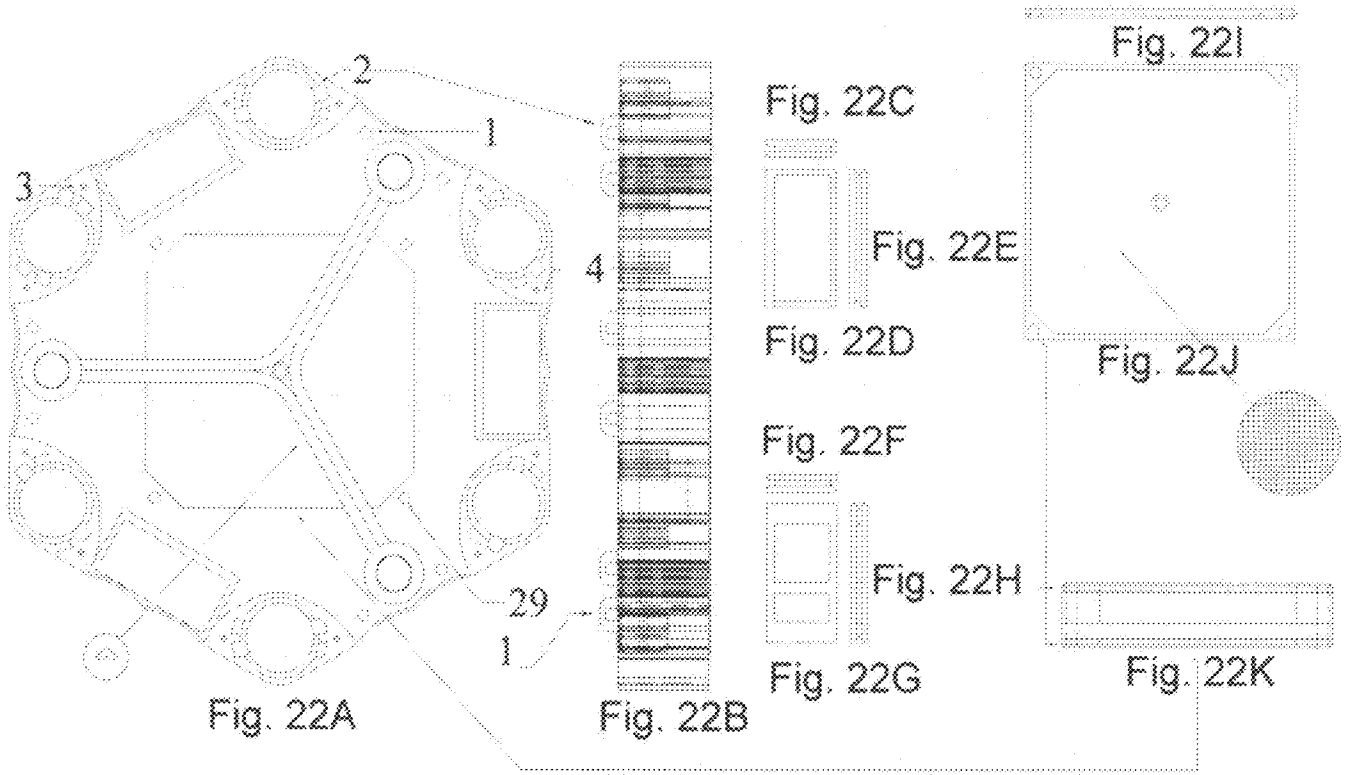

33. The plenums' outer horizontal faces are covered with end caps. The end caps have side walls creating an enclosed space sufficient to allow for retractors, coiling and routing of wires, cables, power cables, fluid, gas and air hoses, etc. The top end cap [Type 1 enclosure: FIG. 11, Type 2 enclosure: FIG. 22] thus acts as a basket to this purpose. The end caps are not quite equal in size, allowing a bottom end cap [Type 1 enclosure: FIG. 2, Type 2 enclosure: FIG. 16] to be slid over a top end cap or base. Accordingly, the base of the top end cap jogs in slightly, and then maintains the same internal and external side dimensions as that of the mating surface, toleranced to allow a positive slip fit of the bottom dumb-bell end cap over the top dumb-bell end cap for stacking and placement on the respective mounting with the following exception. There should be slight matching taper angle between these components pending manufacturing material and technique, specifically for positive sealing and seating, which is part of the preferred embodiment. In any case actual external physical dimensions are maintained up to the topmost basket.

34. Knock outs, cut outs, blank and/or special-purpose bezels [Type 1 enclosure: FIG. 2A-H and FIG. 11A-H, Type 2 enclosure: FIGS. 16A-H AND 22A-H] and/or feed through holes with or without plugs are placed in the blank dumb bell end caps, when viewed from above, between bezels, bulkheads and ducts in the recesses on the topside of the blank dumb bell ends. This allows routing power, communication, control and administrative interface connections in standard and non-standard ways. Plugs are used to seal these holes if they are no longer needed [Type 1: Dwg. 2 part 1: Type 2 Dwg. 16, part 1].

35. Power is daisy chained from module to module and may be supplied by either end or both ends as shown in FIG. 13A-F, from the same power supply with a daisy chained double ended feed bus bar. Each rectangle as show represents a load and/or load and power supply with one or more main feeds. Power to stacked modules is rotated between separate feeds to extend stacking at lower power supply wattages than would be otherwise possible [FIGS. 13B-F. This is why all end caps have multiple quick disconnect power supply flats. This allows adjacent modules vertically, horizontally or obliquely above, below or to the sides to be on separate power supplies, with pass thru again aiding in battle hardening. As indicated elsewhere the double ended supply to a module allows for moving over wiring using disconnects by powering up a new replacement module while maintaining power to the old module coming off line.

36. Blank bezels are used with or without knockouts or inserts to cover unused area. [Type 1 enclosure: FIG. 2C-E and FIG. 11 C-E, Type 2 enclosure: FIGS. 16C-E AND 22C-E]

37. A pictorial example is given in the attendant patent drawings showing the top [Type 1 enclosure: FIG. 11F-H and Type 2 enclosure: FIG. 22F-H] and bottom [Type 1 enclosure: FIG. 2F-H, Type 2 enclosure: FIG. 16F-H] base end cap surfaces of the dumb-bell to include three (3) bezels designed with mounting surfaces for three (3), one each, American style power plugs, and two (2) twin channel RJ-45 Ethernet sockets each of which may be customized to include power, communication, control or administrative interfaces.

38. The general geometry is scalable and the relative width of the dumb bell ends to the narrower center section may be varied, while maintaining the general dumb bell aspect, thus allowing more or less surface area for bezels in and on the dumb bell end caps or narrower center section sidewalls connecting the two broader dumbbell end caps. The simple example of this would be to vary the length of the stanchions, stanchion guides and cooling tube housing uprights. In similar related fashion the plenums and/or end caps lengths may also be varied.

39. Seals may be upgraded to be hermetic, degassed and/or explosion-proof pending usage.

39. The explosion-proof option is partially realized by employing o-gaskets in the inner corner base mating surface of the outer hull and the outer mating surface of the inner hull with optional grooves around the outer literal end or peripherally between the top and bottom tapered slip fit double walls, thus allowing for above atmospheric pressurization of machinery in the enclosure.

40. Standard pressure sensors, shutdown switches for over atmospheric pressure are employed per client needs.

41. If required, potting material such as silicon or other material, impregnated as necessary, for proper thermal, EMF, pressurizing for explosion proofing or other characteristics are employed across one or more bezel, ducts, duct orifices, dumb bells and/or their ends, plenums, end caps, or other full or subassemblies.

42. In the preferred embodiment, stacked modules' top/exhaust and bottom/intake pipes connect to the master exhaust plenums utilizing the same tube assemblies as used between modules.

43. Industry standard shop vacuum or other standard tube, hose, pipe and/or connectors are used between master/intake plenums and master exhaust plenums in their connections to the cooling media sourcing and recycling. Further, this example is replicated throughout the whole cooling media system with or without cooling media recycling, intake and exhaust master plenums or any other plenum, sump, condenser or some other form of HVAC, pending cooling medium external to the stacks themselves, that is not including the modules themselves. Reference FIG. 48A-D, Table 1 for further cooling options.

44. In the preferred embodiment, the master intake [Dwg. 28] and exhaust [Dwg. 31] plenums both employ three (3) individual wide mesh duct legs with screened or unscreened top exhaust and bottom intake ducts in their respective sub-assemblies. In the standard vertical configuration bulkhead feed-throughs, etc. are deployed in areas between these duct legs. The area between the ducts allows for pass through wiring, cabling, plumbing, and other non-gaseous connections, etc. with the standard basket/cover, retractors, bezels, etc. as shown for end caps and as otherwise necessary [Reference FIG. 48A-D, Table 1] in identical fashion as plenums and end caps. This configuration allows axial airflow without individual module top and/or bottom plenums as separate from the master plenums.

45. In the preferred embodiment, bottom intake [Dwg. 28] and top exhaust [Dwg. 31] master plenums utilize three (3) cable hanger assemblies [Dwg. 27] for inter-module top and bottom location by mating cable gripper™ [or functional equivalent] assemblies [Type 1: Dwg. 3; Type 2 Dwg. 21] vertical hanging.

46. The single base module [Dwg. 28] does not have a handle, which is required on the Single Exhaust Plenum Cap [Dwg. 31] which uses exhaust plenum cable gripper™ [or functional equivalent] gondola/canisters [Dwg. 29] in conjunct with a cable gripper™ [or functional equivalent] actuator [Dwg. 30] to allow motion along the cables' axis. This cable actuator allows the handle to be twisted to release the cable gripper™ [or functional equivalent] until the handle is twisted back into it's unlocked position [parts 76-77]. This is incorporated by reference into the other modules as an option.

47. The outside enclosure hull allows for an inter-module sliding fit tolerance on the astroidal apexes and sides with or without pc board or other backing with sufficient allowance for external inter-module wiring, ducting and/or plumbing and the attendant internal retractors, again with a sliding fit.

48. Horizontal hanging is accomplished by utilizing a module hanger [Dwg. 32] which seats into the end caps [Type 1: Bottom Dwg. 2, Top Dwg. 11; Type 2: Bottom Dwg. 16, Top Dwg. 22]. Unneeded tabs may be broken off at shear points resulting in the unit as shown in FIG. 32C 49. Modules may be hung using module hangers in conjunct with double ended hooks [Dwg. 33].

50. Modules are suspended utilizing track systems such as the track and roller [Dwg. 34A] or rack with internally wound cog motor [Dwg. 34B].

51. Module vertical hanging may be accomplished using module hanger and a track and roller or rack and internally wound cog motor [Drawing 35].

52. Single modules may be suspended in a frame by hanger and track and roller system [Dwg. 36].

53. Multiple modules may be suspended in a frame by hanger and track and roller system [Dwg. 37].

54. Modules are interlocked with hangers and geometrically nested, 1, 6, 12, 18 with or without module hangers vertically or horizontally or some angle in between, pending the length of the run [Dwg. 38].

55. Interlocking sextet module arrays may be utilized to form larger arrays with shared conjoining modules [Dwg. 39].

56. Horizontal or vertical hydraulic lift systems may be utilized for single and multiple module motion [Dwg. 40].

57. Top end cap covers may be utilized to hide exposed wiring, handles and plenum exhausts, giving a more finished look for a non-suspended stack [Dwg. 41].

58. Top end cap covers may be optionally upholstered [Dwg. 42].

59. Modules may enjoy protective side covers [Dwg. 43]. Such side covers are positioned and retained utilizing a clip attaching to the module cable guides [Dwg. 44]. Such side covers may also be used as cat walks.

60. Catwalks may employ a bridge like structure across multiple modules, to spread bearing loads [Dwg. 45]. Unit is shown in a 12 module chamber/corridor.

61. Catwalks may employ a bridge like structure across five or more modules to create a wall, and/or to spread bearing loads [Dwg. 46]. Unit is shown in a 18 module chamber/corridor.

62. General inter-module arrays may be deployed in horizontal or vertical arrays with or without a hollow inner channel/corridor [FIGS. 47A-C]. Ferris wheel carousels whereby modules are held horizontally between end wheels or suspended vertically from central support are embodied herein [FIGS. 47D-E]. Torus arrays as may be used in spacecraft and other facilities are also included herein [Dwg. 47F].

63. All functional mobile array forms may be populated by module arrays of any planar single or multi-module thickness [examples: FIGS. 47K-L] either hanging from a singular support structure or totally framed either by a casement or a space frame represented symbolically as shown.

64. Suspension systems include singular or multiple module arrays so arranged in stacks or planes as populated in examples 47K-L to track in such a way as to create an horizontal [FIGS. 47I-J] or vertical [FIGS. 47K-L] interstitial cavity as a work space with an access hatch [parts 103 and 101 respectively] and floor [parts 102 and 100 respectively] between the modules. Modules and/or module arrays flow apart as they approach the work area and are stopped for work access and then flow back together as they exit the work space area. In this way a loop is created, module or array end to module or array end as shown symbolically in FIG. 47F. FIG. 47F also symbolically represents stacks placed horizontally in a carousel.

65. The inner and/or outer surface is painted, impregnated or otherwise formed of FCC Class B or other RF retardant paint as required.

66. Similar material is used for potting as necessary.

67. Inner and outer surfaces are painted with thermally insulative and/or reflective paint as necessary to further channel heat through the primary heat removal system as necessary to avoid inter-module heat buildup between stacks and/or arrays.

The invention claimed is:

[1. A modular enclosure system based on the approximated tessellation(s)/tiling(s) of standard shapes including the triangle, square, hexagon, octagon and dodecagon, for routing and re-routing of data, fail over, feedback, command and control of computers, bus based systems, networks, machinery and machine farms, process control with or without feedback and signaling/signal conditioning to include with appropriate hardware and software comprising:

nesting enclosure(s) with inter-module side wall bulkhead to sidewall bulkhead and end cap basket to end cap cover sliding fit, optional integrated manual module positioning cable gripper actuator assembly, master cooling/wiring plenum stack support system for deploying enclosures, hot swap based wiring system, external inter-module signal/signal conditioning/interconnect system card cage, integrated thermal management system, structural integrity/assembly system, explosion proofing system, structural building system, upholstery system, automated/manual enclosure/module stack and array physical support, deployment, mobilization and work room generation system, hydraulic positioning system.]

[2. The enclosure system as claimed in claim 1, wherein the preferred embodiments of the enclosure enjoy mathematically provable optimization of planar space by empirical geometric construction and hence by extension and extrusion, inter-planar Minkowski space X, Y, Z, t, less that allowance for inter-module heat transfer via channels/ducting/chimneys, wire and/or wave guides and inter-module sidewall bulkhead to sidewall bulkhead and end cap sliding fit contact with non-exclusively truncated and/or rounded apices for extensible up/down nesting and/or scaling, and stacking of modules from stacks forming 2D and 3D arrays so tiled; this allows maximum return on investment, ROI, for a space so tiled for incremental modular computing or process control for any given internal design properly sized/optimized for a particular technology or technologies; non-standard shapes may also be used for nesting purposes, most notably, as is the case of components and other irregular shapes to be nested.]

[3. The enclosure system as claimed in claim 1, wherein the preferred embodiment of the enclosure comprises: a top (handle end) male vertical interconnect enclosure basket end cap, with mating bottom female cover end cap, housing technology dependent matching quick disconnects an/or as required wiring, with interconnect specific removable and fixed bezels, with or without backing plates, knockouts and feed through connections optionally re-enforced with grommets, stress-reliefs, etc.; technologies non-exclusively included, both now and in the future are all standard catalog or special cabling, fiber or other optics, pneumatics, power, process, wiring, etc.]

[4. The enclosure system as claimed in claim 1, wherein the preferred embodiments comprise nonexclusively a dumbbell shape placing the main center cavity between two fans or sets of fans and/or two end cap bulkheads with or without fan plenums pending configuration; the main cavity side walls utilize any combination of either solid and/or replaceable reinforced technology specific bezels with standoffs, cutouts, knockouts, feed thru(s) and disconnects or transducers with optional backing plate backing comprising patch panels or other interconnect arrangements on each vertical dumbbell recess face.]

[5. The enclosure system as claimed in claim 1, wherein the enclosure integrated manual module positioning cable gripper actuator assembly preferred embodiments comprise:

a set of three quick-disconnect cables with associated matching cable guide tubes, matching cable grippers, actuator assembly consisting of a handle with optional position locking, a plunger rod which connects to the handle, an optional guide tube, spring, and cable gripper gondolas pending configuration, a self-centering triangular actuator plate, and an actuator plate retention cotter pin;

The assembly is used non-exclusively to manually position and lock and release enclosures for movement in 3D space along daisy chained cables of modules and associated assemblies including hangers for movement from horizontal to vertical in single and multiple stacks and arrays.]

[6. The enclosure system as claimed in claim 1, wherein in a preferred embodiment the master cooling/wiring plenum stack support system for deploying enclosures employs the plenums as intakes and exhausts for use for stacks, 2D and 3D stack arrays; master cooling/wiring plenums are placed on the floor and suspended for stabilizing, cooling, power and other wiring and interconnection terminations of individual column/stacks.]

[7. The enclosure system as claimed in claim 1, wherein the preferred embodiment of the enclosure includes a hot swap based wiring system for the power supply of stacks, 2D and 3D arrays whereby each of every two, three or more contiguous abutting modules are not on the same power source; the system is comprised of multiple powers sources connected to individually matched double ended daisy chained bus bars with two separate feeds from the power source, which for the number of such feeds, power is drawn for a particular module in rotation as a function of stack depth.]

[8. The enclosure system as claimed in claim 1, wherein the preferred embodiment includes an external inter-module signal/signal conditioning/interconnect system for external inter-module coplanar and inter-planar or diagonal up or down interconnect for horizontally and vertically diagonal abutting modules; this is accomplished through vertically running races on the abutting/external end cap side wall surfaces for interconnects both hardwired quick disconnect preferred or by allowing direct line of site for transducer and pickup for optical radiation infrared to include direct thermal barrier management and/or optical lensing of heat by coatings, ELF, EM,RF, optical including laser and radiation shielding for microwave, gamma ray, x-ray, neutron, high voltage, and charged particle, etc. with attenuating enclosure impregnations/coatings; they are readily apparent on the top view of the end caps side walls.]

[9. The enclosure system as claimed in claim 1, wherein the preferred embodiment card cage seats in the main cavity in any stable configuration and is comprised of: a set of main cavity length, less a fit tolerance, vertical edge-hinged mated rectangles allowing main cavity extraction and opening one side of the card cage at its periphery in order that it may be laid flat for work, if interconnects between the sides are properly handled, with limiting breakable tabs for 45, 60, 90 and 120 degrees or tangs limiting travel to prevent inward folding or collapse, horizontal and vertical adjustment bars with clamp style ends, double-sided grommet backed straps, stand-offs and backing plates.]

[10. The enclosure system as claimed in claim 1, wherein the preferred embodiment of the enclosure provides for a thermal management system comprising: plenums, both top and bottom set behind end cap bulkheads which transition coolant flow to and from the main chamber through the plenum fans, through the orifices to and from the cooling tubes assemblies.]

[11. The enclosure system as claimed in claim 1, wherein the thermal management system's alternate preferred embodiment employs chimneys which are formed by arrays with open array positions where coolant is introduced and heat is exhausted using the chimneys by function either exclusively, alternately or in some combination.]

[12. The thermal management system as claimed in claim 10, wherein the preferred embodiment of the enclosure comprises:

cooling tubes placed vertically in the enclosure corners and optionally ducted and louvered, optionally utilize retractable vacuum cleaner style hose, twist-lock quick disconnects and o-rings or others sealants, petcocks and angled tube and/or pipe bends; these devices are employed as necessary to provide or block intake or exhaust coolant inter-module ducting; when cooling tubes are ducted and louvered they may be optionally used peripherally or with chimneys, defined as missing 3D horizontal or vertical array positions, in an array or stack with plenum orifice to main chamber interface.]

[13. The enclosure system as claimed in claim 1, wherein in an alternate preferred embodiment, the enclosure integrated manual module positioning cable gripper actuator assembly and thermal management systems are modified as follows:

end cap variant with a large multi-axis cross-brace with a center-hole washer landing with knockouts, framed by a re-enforced large fan mounting plate, EM gasket and fastened screen mesh EM shield/safety screen, cable grippers, cable gripper gondolas, actuator assembly, and ventilated cable gripper actuator assembly plate;

this allows modules axial coolant flow with or without cooling tubes in any combination of intake, exhaust or not.]

[14. The enclosure system as claimed in claim 1, wherein in the preferred embodiment the structural integrity and assembly system is comprised of: optional stanchions with bolt head end-threaded rods connected by wires or rods, stanchion tube guides normally protect stanchions exposed outside the main enclosure body are to protect interconnects that they might come in contact with glue, etc. which penetrate vertically through re-enforced keyed landings with washers built into or seated on or in the segments, making up the enclosure on either side of the enclosure cooling tubes; these methods hold the unit together pending the economics and manner of fabrication or as required.]

[15. The enclosure system as claimed in claim 1, wherein in an alternate embodiment carbon and bronze or similar functioning materials are used as anti-sparking materials for cabling and actuator assemblies in conjunct with silicon and potting materials and raised above atmospheric pressure with or without nitrogen to make enclosures "explosion proof".]

[16. The enclosure system as claimed in claim 1, wherein in the preferred embodiment the enclosure non-exclusively supports industrial standards which include boards, motherboards, WXT, AT, Baby-At, ATX, BTX, LPX, NanoETX-express, mobillTX, PCI, cards, card extenders, Infiniband etc., associated interconnect and support devices including cabling, sound, KVM, switches, floppies, hard drives, CD-Rom, DVD players and variants, USB, Firewire, Ethernet, ICs, LSI, circuitry of every description, etc.]

[17. The enclosure system as claimed in claim 1, wherein in the preferred embodiment modules are used as architectural structural units including internal and external frames with protective panels on sides, end caps and master manifolds and to bridge multiple units as seats, walls, floors, ceilings, catwalks.]

[18. The structural enclosure system as claimed under claim 17, wherein in the preferred embodiment an upholstery system is claimed none-exclusively for covering surfaces.]

[19. The enclosure system as claimed in claim 1, wherein in the preferred embodiment an automated and/or manual enclosure/module stack and array physical support, deployment, mobilization and work room generation system utilizes structural frames for single and multiple point suspension by hangers and hooks for single and/or multiple enclosures in single and multiple arrays with motive force with open or closed frames driven manually, with stepping motors or regular motors for truck/rail, roller/wheel, track or rack and gear systems; these preferred embodiments are used to create automated and/or manual overhead, horizontal, vertical or combinational carousels, stacks and arrays of same for creating track or cog rail way systems whereby the arrays of modules are made to open up around a platform by track, cog rail way or hydraulically to create a room affording access to individual models for work, repair or replacement.]

[20. The enclosure system as claimed in claim 1, wherein in the preferred embodiment hydraulics are used to raise and lower consoles, columns and seating out of floors, walls, ceilings etc.]

*21. A modular enclosure system for a computer network, the system comprising a plurality of networked computer modules;*

*wherein the modules have a geometric shape selected from the group consisting of triangles, squares, hexagons, octagons, and dodecagons;*

*wherein the modules are arranged into a plurality of approximately tessellated planar arrays;*

*wherein the planar arrays are arranged into one or more multiplanar arrays, and the modules within a multiplanar array are aligned and interconnected;*

*wherein the modules, planar arrays, or multiplanar arrays are slidably mounted and configured for individual removal from the system in three dimensions using rollers, wheels, track, or a cog railway system.*

*22. The modular enclosure system of claim 21, wherein the geometric shapes of the modules within a multiplanar array are aligned.*

*23. The modular enclosure system of claim 21, wherein the modules, planar arrays, or multiplanar arrays are manually removable.*

*24. The modular enclosure system of claim 21, wherein the system further comprises an automated mechanism for removal of modules, planar arrays, or multiplanar arrays, the automated mechanism comprising motors, hydraulics, track, or a cog rail system.*

*25. The modular enclosure system of claim 21, wherein the modules or planar arrays are removable from a multiplanar array with retention of power and data communication with other modules to allow hot swap of modules.*

*26. The modular enclosure system of claim 21, wherein the modules are connected without edge or end mount connectors.*

*27. The modular enclosure system of claim 21, wherein the modules are connected to one another using retractors, flexible cable, or quick-disconnect connections.*

*28. The modular enclosure system of claim 21, wherein the modules or planar arrays are mounted using frames, hangers, hooks, cables, or another form of suspension.*

*29. The modular enclosure system of claim 21, wherein the modules comprise circuit boards disposed within a central plenum, the plenum providing cooling air circulation that is continuous through stacks of modules.*

*30. The modular enclosure system of claim 21, wherein the modules comprise louvers and cooling chimneys.*

*31. The modular enclosure system of claim 21, wherein the modules in a planar array are mounted in a rotating carousel.*

*32. The modular enclosure system of claim 21, wherein the modules comprise a wiring end cap with integral plenum.*

*33. The modular enclosure system of claim 21, wherein the modules comprise an extractable card cage chassis disposed in a central plenum.*

*34. The modular enclosure system of claim 21, wherein the modules comprise a top interconnect catch basket and a bottom self-centering tapered slip-fit cover.*

*35. The modular enclosure system of claim 21, wherein the modules comprise one or more double ended bus bars at a top side and a bottom side, allowing for hot swap of modules.*

*36. The modular enclosure system of claim 21, wherein one or more of the modules comprises one or more recessed side wall patch panels.*

*37. The modular enclosure system of claim 21, wherein the approximate tessellation of the modules in a planar array comprises spaces between outside vertical walls of the modules of the planar array, the spaces comprising interconnects, wiring, cables, or tubing, and wherein the modules comprise inter-module surface tolerances with tapered ends for parallel sliding fit along a stack axis.*

*38. The modular enclosure system of claim 21, wherein individual ones of the modules or planar arrays are removable from a multiplanar array without removing abutting modules or planar arrays.*

*39. The modular enclosure system of claim 21, wherein one or more of the modules serve as a structural element selected from the group consisting of furnishings, floors, ceilings, walls, and catwalks.*

* * * * *